United States Patent
Oh et al.

(10) Patent No.: US 9,640,577 B2
(45) Date of Patent: May 2, 2017

(54) IMAGE SENSOR

(71) Applicants: Min-seok Oh, Osan-si (KR);
Young-chan Kim, Seongnam-si (KR);
Moo-sup Lim, Yongin-si (KR)

(72) Inventors: Min-seok Oh, Osan-si (KR);
Young-chan Kim, Seongnam-si (KR);
Moo-sup Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/990,112

(22) Filed: Jan. 7, 2016

(65) Prior Publication Data
US 2016/0204150 A1    Jul. 14, 2016

(30) Foreign Application Priority Data
Jan. 8, 2015    (KR) ......................... 10-2015-0002855

(51) Int. Cl.
*H01L 27/146* (2006.01)

(52) U.S. Cl.
CPC .... *H01L 27/14623* (2013.01); *H01L 27/1463* (2013.01); *H01L 27/1464* (2013.01); *H01L 27/14609* (2013.01); *H01L 27/14638* (2013.01); *H01L 27/14645* (2013.01)

(58) Field of Classification Search
CPC ........... H01L 27/1464; H01L 27/14623; H01L 27/14627; H01L 27/1463; H01L 27/14612; H01L 27/14643; H01L 27/1461

USPC .... 257/292, 291, 290, 435, 444; 438/70, 72, 438/196, 48; 348/294, 308
See application file for complete search history.

(56) References Cited

U.S. PATENT DOCUMENTS

| | | |
|---|---|---|
| 7,095,440 B2 | 8/2006 | Fossum |
| 7,714,403 B2 | 5/2010 | Lee et al. |
| 8,030,608 B2 | 10/2011 | Uya et al. |
| 8,395,194 B2 | 3/2013 | Yokoyama et al. |
| 8,471,316 B2 | 6/2013 | Tai et al. |
| 8,575,531 B2 | 11/2013 | Hynecek et al. |
| 8,723,284 B1 | 5/2014 | Hynecek |
| 8,730,362 B2 | 5/2014 | McCarten et al. |
| 8,796,057 B2 | 8/2014 | Anderson et al. |

(Continued)

*Primary Examiner* — David Vu
*Assistant Examiner* — Jonathan Han
(74) *Attorney, Agent, or Firm* — Harness, Dickey & Pierce, P.L.C.

(57) ABSTRACT

Example embodiments relate to an image sensor supporting a global shutter for minimizing image distortion. An example image sensor includes a semiconductor layer having a first surface and a second surface that are opposite to each other; a photosensitive device, which is formed in the semiconductor layer near the first surface and accumulates charges based on light incident via the second surface; a charge storage device, which is formed in the semiconductor layer near the first surface and temporarily stores charges accumulated by the photosensitive device; a first transmission transistor, which transmits charges accumulated by the photosensitive device to the charge storage device and includes a first gate formed on the first surface of the semiconductor layer; and a leakage photogenerated charge drain region, which is formed in the semiconductor layer near the second surface, is apart from the charge storage device, and is arranged above the charge storage device.

20 Claims, 40 Drawing Sheets

(56) References Cited

U.S. PATENT DOCUMENTS

| | | |
|---|---|---|
| 2010/0327390 A1 | 12/2010 | McCarten et al. |
| 2012/0025059 A1* | 2/2012 | Kawashima ...... H01L 27/14623 |
| | | 250/208.1 |
| 2012/0085888 A1 | 4/2012 | Endo et al. |
| 2012/0273854 A1 | 11/2012 | Velichko et al. |
| 2013/0334577 A1 | 12/2013 | Ahn |
| 2014/0085517 A1 | 3/2014 | Lenchenkov et al. |
| 2014/0110809 A1* | 4/2014 | Kitamura .......... H01L 27/14623 |
| | | 257/435 |
| 2014/0213011 A1 | 7/2014 | Lee |
| 2015/0228693 A1* | 8/2015 | Toda ................. H01L 27/14612 |
| | | 257/40 |

* cited by examiner ated with each other.
IMAGE SENSOR

CROSS-REFERENCE TO RELATED APPLICATION

This application claims the benefit of priority from Korean Patent Application No. 10-2015-0002855, filed on Jan. 8, 2015, in the Korean Intellectual Property Office, the disclosure of which is incorporated herein in its entirety by reference.

BACKGROUND

The inventive concepts relate to an image sensor, and more particularly, to an image sensor supporting a global shutter.

An image sensor, which picks up an image and transforms the image into electric signals, is typically used not only in general consumer electronics, such as digital cameras, mobile phone cameras, and portable camcorders, but also used in automobiles, security devices, and cameras installed on robots.

Generally, an image sensor may be manufactured via a semiconductor manufacturing process. An image sensor may include not only a photosensitive device, but also a transistor for controlling the photosensitive device, and circuits for driving a pixel array. A backside illuminated image sensor, in which a transistor and a wiring layer are formed on a surface of a semiconductor layer having formed thereon a photosensitive device and light is incident to the other surface of the semiconductor layer, is known in the art.

SUMMARY

The inventive concepts provide an image sensor supporting a global shutter for minimizing image distortion.

According to an example of the inventive concepts, an image sensor includes a semiconductor layer having a first surface and a second surface that are opposite to each other; a photosensitive device, which is formed in the semiconductor layer in the vicinity of the first surface and accumulates charges based on light incident via the second surface; a charge storage device, which is formed in the semiconductor layer in the vicinity of the first surface and temporarily stores charges accumulated by the photosensitive device; a first transmission transistor, which transmits charges accumulated by the photosensitive device to the charge storage device and includes a first gate formed on the first surface of the semiconductor layer; and a leakage photogenerated charge drain region, which is formed in the semiconductor layer in the vicinity of the second surface, is apart from the charge storage device, and is arranged above the charge storage device.

The image sensor further includes a blocking layer, which is formed on the second surface of the semiconductor layer and blocks light traveling toward the charge storage device.

The image sensor further includes a drain contact plug, which electrically connects the blocking layer to the leakage photogenerated charge drain region.

The blocking layer and the drain contact plug are integrated with each other.

The blocking layer and the drain contact plug include metals.

A positive bias is connected to the blocking layer.

The image sensor further includes a floating diffusion region, to which charges stored in the charge storage device are transmitted; and a second transmission transistor, which transmits charges stored in the charge storage device to the floating diffusion region and includes a second gate, wherein the leakage photogenerated charge drain region is arranged across the charge storage device and the floating diffusion region.

The charge storage device and the leakage photogenerated charge drain region have a first conduction type, and the image sensor further includes a well region, which has a second conduction type that is different from the first conduction type and that is arranged between the charge storage device and the leakage photogenerated charge drain region.

The image sensor further includes a first isolation layer, which is buried in a first isolation trench formed in the semiconductor layer between the first surface and the second surface to surround a unit pixel consisting of the photosensitive device and the charge storage device; and a second isolation layer, which is arranged between the photosensitive device and the charge storage device and is buried in a second isolation trench formed in the semiconductor layer between the first surface and the second surface.

The well region surrounds the second isolation layer in the semiconductor layer.

The leakage photogenerated charge drain region is apart from the second isolation layer by interposing a portion of the well region therebetween.

The leakage photogenerated charge drain region contacts the second isolation layer.

The image sensor further includes an interface covering region, which covers a surface of the second isolation layer in the semiconductor layer.

The well region is formed in a portion of the semiconductor layer between the first isolation layer and the second isolation layer and arranged on the charge storage device.

According to another example of the inventive concepts, an image sensor includes a semiconductor layer having a first surface and a second surface that are opposite to each other; and a plurality of unit pixels, wherein each of the plurality of unit pixels includes a photosensitive device, which is formed in the semiconductor layer in the vicinity of the first surface and accumulates charges based on light incident via the second surface; a charge storage device, which is formed in the semiconductor layer in the vicinity of the first surface and temporarily stores charges accumulated by the photosensitive device; a first transmission transistor, which transmits charges accumulated by the photosensitive device to the charge storage device and includes a first gate formed on the first surface of the semiconductor layer; a leakage photogenerated charge drain region, which is formed in the semiconductor layer near the second surface, is apart from the charge storage device, and is arranged above the charge storage device; and a blocking layer, which is formed on the second surface of the semiconductor layer, blocks light travelling to the charge storage device, and is electrically applied to the leakage photogenerated charge drain region.

The blocking layers of the plurality of unit pixels are connected to a positive bias in common.

The charge storage device overlaps substantially the entire blocking layer in a direction substantially perpendicular to the second surface of the semiconductor layer.

The image sensor of claim further includes an interlayer insulation layer, which is formed between the second surface of the semiconductor layer and the blocking layer; and a drain contact plug, which penetrates through the interlayer insulation layer and electrically connects the blocking layer to the leakage photogenerated charge drain region.

The photosensitive device, the charge storage device, and the leakage photogenerated charge drain region may have a first conduction type, and the image sensor further includes a well region, which may have a second conduction type different from the first conduction type and is arranged between the charge storage device and the leakage photogenerated charge drain region.

The image sensor further includes a first isolation layer, which is arranged between the plurality of unit pixels and is buried in a first isolation trench formed in the semiconductor layer between the first surface and the second surface; and a second isolation layer, which is arranged between the photosensitive device and the charge storage device and is buried in a second isolation layer formed in the semiconductor layer to extend from the second surface toward the first surface.

The second isolation trench may be formed in the semiconductor layer to extend from the second surface toward the first surface.

The first isolation trench may be formed in the semiconductor layer to extend from the second surface toward the first surface.

The image sensor may further include an interface covering region, which is formed in the semiconductor layer to surround the first isolation layer and has the second conduction type.

The photosensitive device may be separated from the first isolation layer and the second isolation layer.

The blocking layer may overlap a portion of the first isolation layer in a direction substantially perpendicular to the second surface of the semiconductor layer.

The blocking layer may overlap a portion of the second isolation layer in a direction substantially perpendicular to the second surface of the semiconductor layer Each of the plurality of unit pixels may further include a floating diffusion region, to which charges stored in the charge storage device are transmitted; and a second transmission transistor, which transmits charges stored in the charge storage device to the floating diffusion region and includes a second gate formed on the first surface of the semiconductor layer.

The leakage photogenerated charge drain region of each of the plurality of unit pixels may be arranged on the charge storage device and the floating diffusion region of each of the plurality of unit pixels.

The second isolation layer may be arranged across the charge storage device and the floating diffusion region.

The second isolation layer may be arranged across the photosensitive device and the floating diffusion region.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
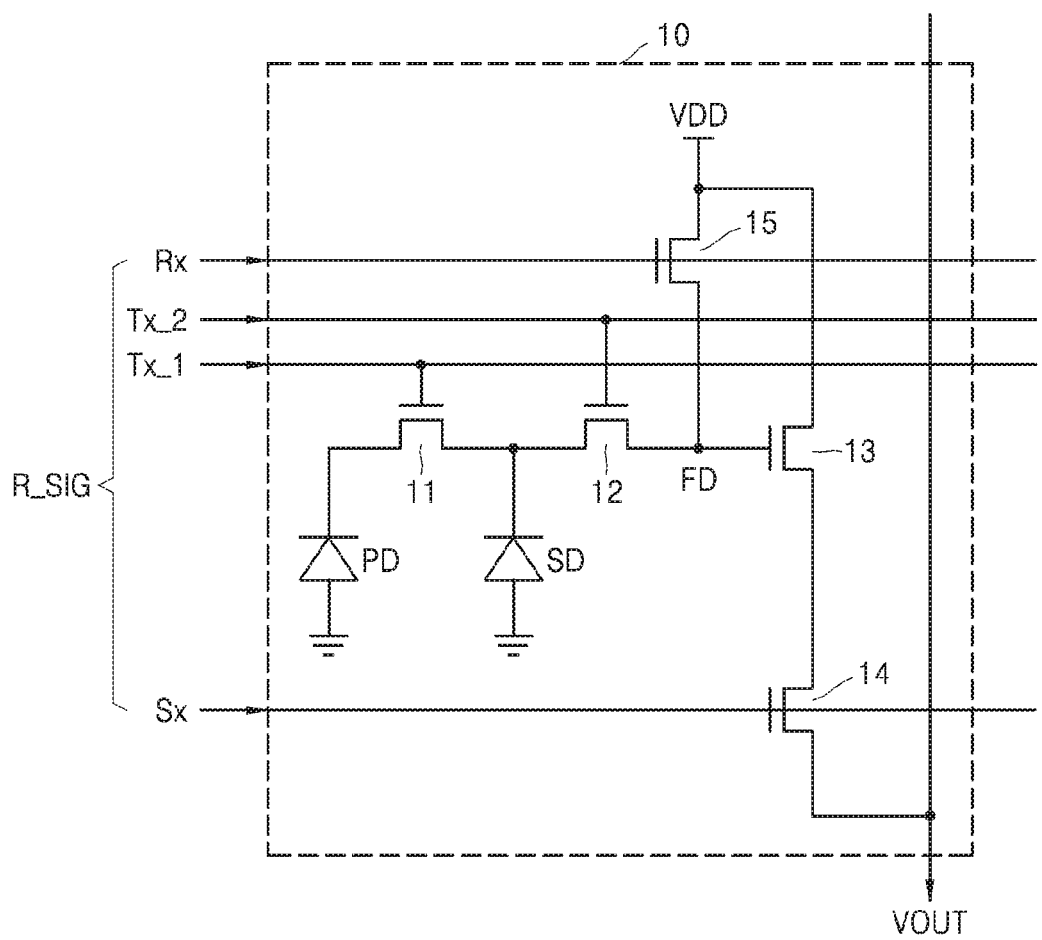
FIG. 1 is a circuit diagram showing a unit pixel 10 included in an image sensor according to an example embodiment.

Hereinafter, the inventive concepts will be described more fully with reference to the accompanying drawings, in which example embodiments of the inventive concepts are shown. This inventive concepts may, however, be embodied in many different forms and should not be construed as limited to the example embodiments set forth herein. Rather, these example embodiments are provided so that this disclosure will be thorough and complete, and will fully convey the scope of the inventive concepts to one of ordinary skill in the art. In the drawings, lengths and sizes of layers and regions may be exaggerated for clarity. Expressions such as "at least one of," when preceding a list of elements, modify the entire list of elements and do not modify the individual elements of the list.

It will be understood that when an element or layer is referred to as being "on," "connected" or "coupled" to another element or layer, the element or layer can be directly on, directly connected to or directly coupled to another element or layer or intervening elements or layers. In contrast, when an element is referred to as being "directly on," "directly connected" to or "directly coupled" to another element or layer, there are no intervening elements or layers present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, an d/or groups thereof.

Unless otherwise defined, all terms (including technical and scientific terms) used herein have the same meaning as commonly understood by one of ordinary skill in the art to which this inventive concepts belongs.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the example embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In the drawing figures, the dimensions of layers and regions may be exaggerated for clarity of illustration. Like reference numerals refer to like elements throughout. The same reference numbers indicate the same components throughout the specification.

FIG. 1 is a circuit diagram showing a unit pixel 10 included in an image sensor according to an example embodiment.

Referring to FIG. 1, the unit pixel 10 may receive a row signal R_SIG from outside and output an output voltage VOUT to the outside. The row signal R_SIG may be applied to gates of transistors to control a plurality of transistors included in the unit pixel 10 and may include a reset signal Rx, first and second transmission signals Tx_1 and Tx_2, and a selecting signal Sx. The output voltage VOUT may be determined based on intensity of light detected by the unit pixel 10.

The unit pixel 10 may include a photosensitive device PD, a charge storage device SD, a first transmission transistor 11, a second transmission transistor 12, a source-follower transistor 13, a selection transistor 14, and a reset transistor 15. Furthermore, the unit pixel 10 may further include a floating diffusion region FD, which is a node at which the second transmission transistor 12, the source-follower transistor 13, and the reset transistor 15 are electrically connected to one another.

The photosensitive device PD absorbs light and transforms the light into electric signals and may be, for example, a photodiode, a photo gate, or a photo transistor. The charge storage device SD may temporarily store charges accumulated by the photosensitive device PD and may be a capacitor or a diode, for example. Although FIG. 1 shows that the photosensitive device PD is a photodiode and the charge storage device SD is a diode, the inventive concepts are not limited thereto.

The first transmission transistor 11 may be configured to transmit or block charges accumulated by the photosensitive device PD to the charge storage device SD. For example, while the photosensitive device PD is absorbing lights and accumulating charges, a first transmission signal Tx_1 with a voltage capable of turning the first transmission transistor 11 off may be applied to a gate of the first transmission transistor 11. The second transmission transistor 12 may be configured to send or block charges stored in the charge storage device SD to the floating diffusion region FD based on a second transmission signal Tx_2. For example, to output charges stored in the charge storage device SD to the outside of the unit pixel 10 via the floating diffusion region FD, a second transmission signal Tx_2 with a voltage capable of turning the second transmission transistor 12 on may be applied to a gate of the second transmission transistor 12.

The source-follower transistor 13 may be configured to amplify a voltage of the floating diffusion region FD, and the selection transistor 14 may be configured to selectively output an amplified voltage according to a selecting signal Sx. The reset transistor 15 may be configured to convert a voltage of the floating diffusion region FD to a reset voltage that is similar to or the same as a power supply voltage VDD by connecting the floating diffusion region FD and a power supply voltage VDD to each other or blocking the floating diffusion region FD and the power supply voltage VDD from each other according to a reset signal Rx. As described above, the unit pixel 10 including components for amplifying electric signals obtained from light absorbed by the photosensitive device PD is referred to as an active pixel sensor (APS). It is obvious that the example embodiment described above may not only be applied to the unit pixel 10 shown in FIG. 1, but also to another APS including the photosensitive device PD and the charge storage device SD.

Figure 2:
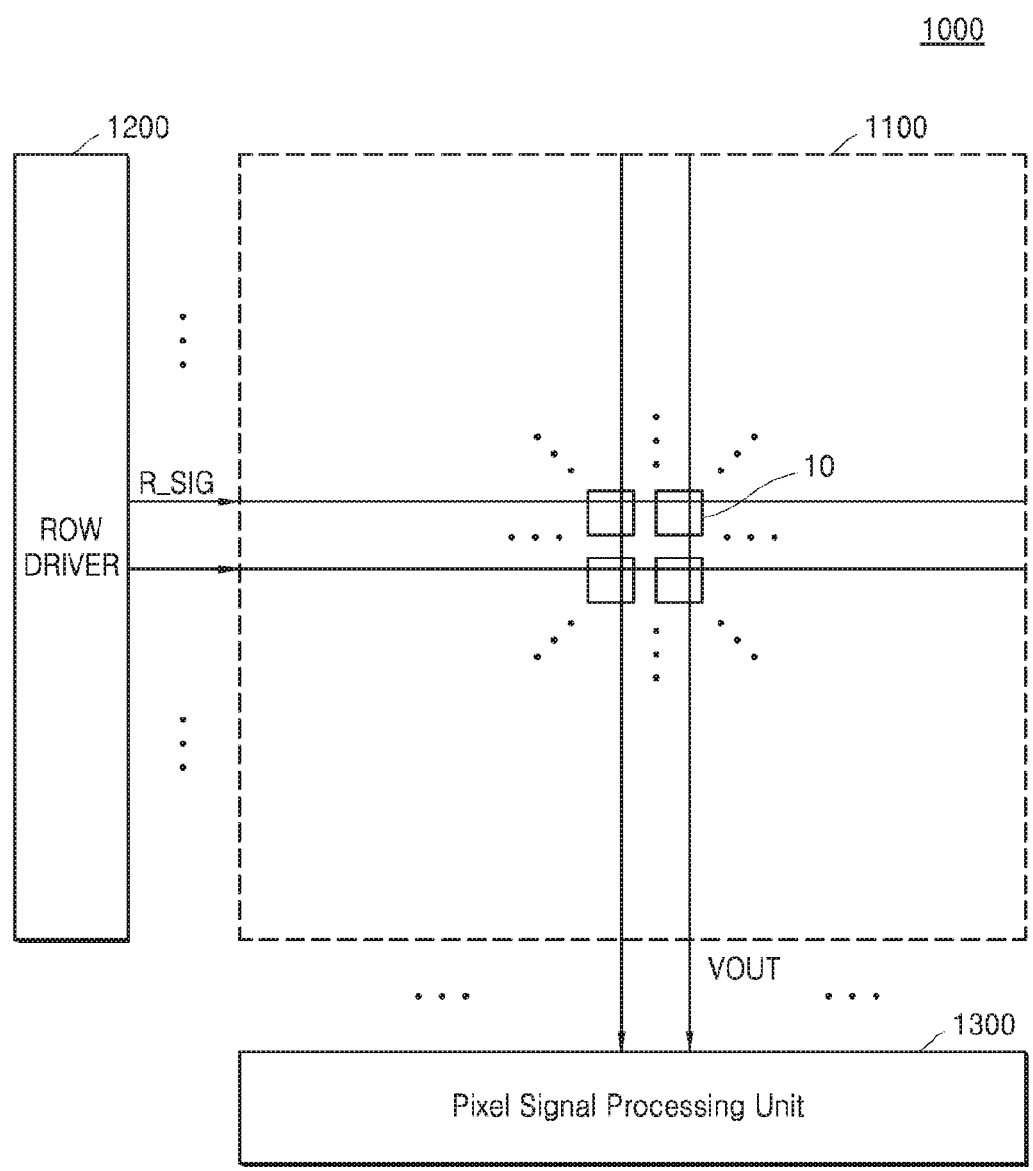
FIG. 2 is a schematic diagram showing an image sensor including a unit pixel as shown in FIG. 1, according to an example embodiment.

FIG. 2 is a schematic diagram showing an image sensor including a unit pixel as shown in FIG. 1, according to an example embodiment.

Referring to FIG. 2, an image sensor 1000 may include a pixel array 1100, a row driver 1200, and a pixel signal processing unit 1300. The pixel array 1100 may include a plurality of unit pixels 10 uniformly arranged in horizontal directions. The row driver 1200 may output a row signal R_SIG, and the row signal R_SIG may be input to the pixel array 1100. As described above with reference to FIG. 1, the row signal R_SIG may include a plurality of signals, and the plurality of signals may control each of the unit pixels 10 included in the pixel array 1100.

The pixel signal processing unit 1300 may receive an output voltage VOUT output by the at least one unit pixel 10 included in the pixel array 1100 and may be configured to measure magnitude of the output voltage VOUT. The plurality of unit pixels 10 constituting a row may share a same row signal R_SIG, whereas the plurality of unit pixels 10 constituting a column may share a signal line via which output voltages VOUT of the respective unit pixels 10 are output. Since the pixel array 1100 includes dozens of thousands of the unit pixels 10, the pixel signal processing unit 1300 may not measure output voltages VOUT output by all of the unit pixels 10 included in the pixel array 1100 at the same time. Therefore, the pixel signal processing unit 1300 may be configured to measure output voltages VOUT output by a group of the unit pixels 10 included in the pixel array 1100, and then the pixel signal processing unit 1300 may be configured to measure output voltages VOUT output by another group of the unit pixels 10 included in the pixel array 1100. For example, the pixel signal processing unit 1300x may be configured to measure output voltages VOUT output by the unit pixels 10 constituting a single row included in the pixel array 1100 at the same time.

By taking into account the characteristic of the pixel signal processing unit 1300, a rolling shutter mechanism that may be embodied by controlling the row driver 1200 is a mechanism for starting and ending time periods for exposing the unit pixels 10 constituting different rows at different time points, respectively. In other words, because it may be necessary to expose the unit pixels 10 included in the pixel array 1100 for a same length of time and time periods for exposing the unit pixels 10 constituting different rows end at different time points, output voltages VOUT output by the unit pixels 10 constituting each row are measured as a time period for exposing the corresponding unit pixels 10 ends, according to the rolling shutter mechanism. However, according to the example rolling shutter mechanism, since the plurality of unit pixels 10 included in the pixel array 1100 are exposed at different time points, the rolling shutter may cause image distortion when detecting moving images.

Meanwhile, a global shutter mechanism that may be embodied by controlling the row driver 1200 is a mechanism for starting and ending time periods for exposing the unit pixels 10 included in the pixel array 1100 at same time points and measuring output voltages VOUT output by the respective unit pixels 10 at different time points via the pixel signal processing unit 1300. According to the global shutter mechanism, since all of the unit pixels 10 included in the pixel array 1100 are exposed during a same time period, image distortions may be removed even with respect to moving images, unlike in the rolling shutter mechanism. Therefore, after the time period of exposing the unit pixels 10 ends, each of the unit pixels 10 may store charges accumulated by a photosensitive device included in the corresponding unit pixel 10 until an output voltage VOUT output by the corresponding unit pixel 10 is measured. According to an example embodiment shown in FIG. 1, the charge storage device SD may be configured to temporarily store charges accumulated by the photosensitive device PD until an output voltage VOUT based on the charges accumulated by the photosensitive device PD is measured by the pixel signal processing unit 1300.

Figure 3:
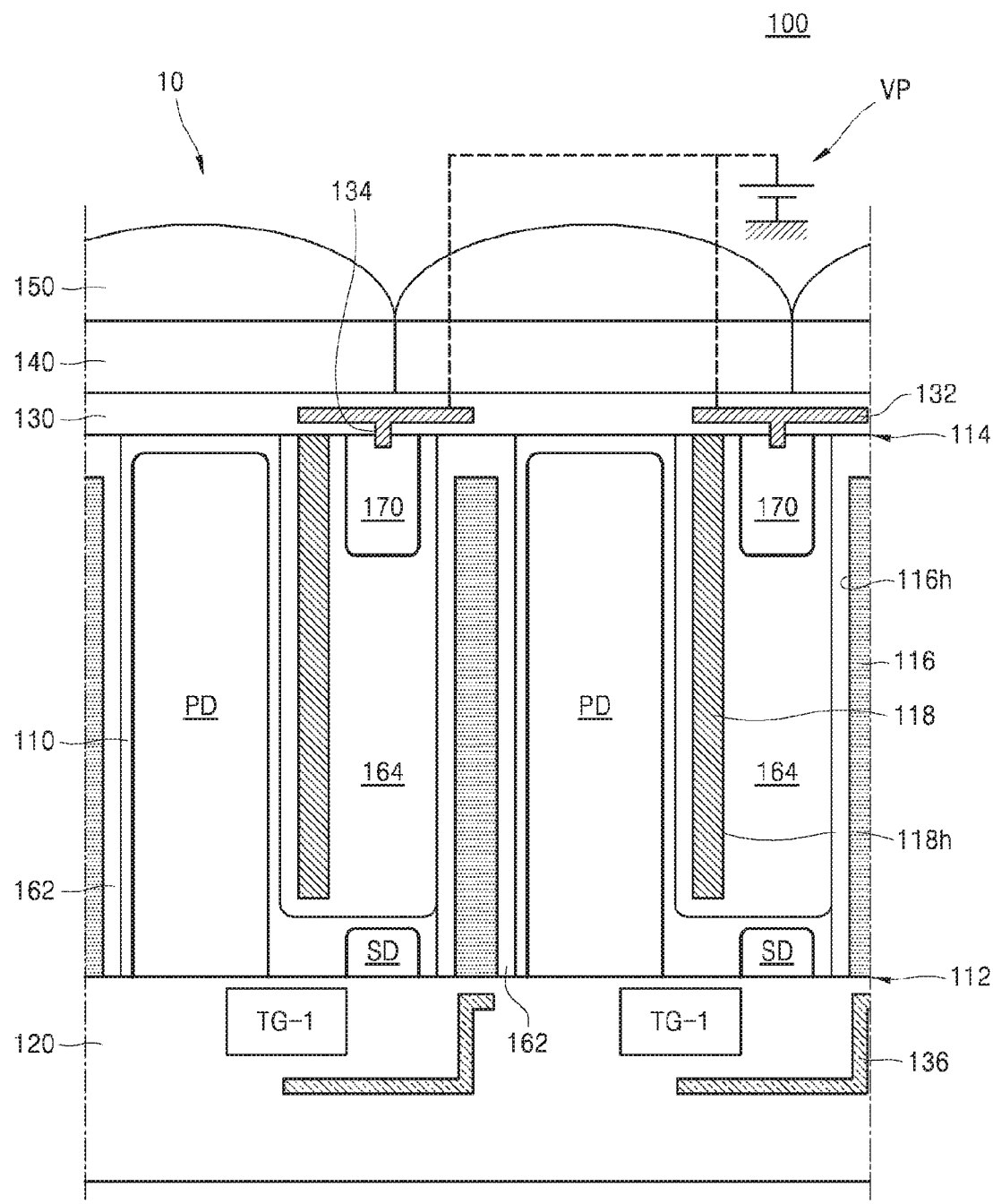
FIG. 3 is a sectional view diagram showing main elements of an image sensor according to an example embodiment.

FIG. 3 is a sectional view diagram showing main elements of an image sensor according to an example embodiment. FIG. 3 is a diagram showing sections of two unit pixels which were taken along a line I-I' shown in FIG. 27.

Referring to FIG. 3, an image sensor 100 may include a semiconductor layer 110, a transistor layer 120, a color filter layer 140, and a lens layer 150. The semiconductor layer 110 may include a first surface 112 and a second surface 114 that are opposite to each other, and the transistor layer 120 may be formed on the first surface 112 of the semiconductor layer 110. The semiconductor layer 110 may be one of a bulk substrate, an epitaxial substrate, and a silicon-on-insulator (SOI) substrate, for example. The semiconductor layer 110 may contain silicon (Si), for example. Alternatively, the semiconductor layer 110 may contain a semiconductor atom, such as germanium (Ge), or a compound semiconductor, such as silicon carbide (SiC), gallium arsenide (GaAs), indium arsenide (InAs), and indium phosphide (InP). The semiconductor layer 110 may be formed based on a semiconductor substrate having a first conduction type. For example, the semiconductor layer 110 may be or include a p-type semiconductor substrate.

The color filter layer 140 and the lens layer 150 may be stacked, for example sequentially stacked, on the second surface 114 of the semiconductor layer 110. The lens layer 150 may focus an incident light onto the photosensitive device PD. The color filter layer 140 may transmit light incident via the lens layer 150 therethrough and provide only lights of necessary wavelengths to the photosensitive device PD through the second surface 114. The image sensor 100 may include an insulation layer 130 interposed between the semiconductor layer 110 and the color filter layer 140.

The image sensor 100 may include a pixel array including the plurality of unit pixels 10. Each of the unit pixels 10 included in the image sensor 100 may include the photosensitive device PD and the charge storage device SD formed on the semiconductor layer 110. The photosensitive device PD and the charge storage device SD may be formed in the semiconductor layer 110 near the first surface 112. The photosensitive device PD may be a photodiode. The photosensitive device PD may be configured to absorb light incident to the semiconductor layer 110 via the lens layer 150, the color filter layer 140, and the insulation layer 130 and generate a current. If a charge travelling path between the photosensitive device PD to the outside is blocked while the photosensitive device PD is absorbing light, charges from a current generated by the photosensitive device PD may be accumulated in the photosensitive device PD. Since the amount of charges accumulated by the photosensitive device PD typically increases as intensity of light absorbed by the photosensitive device PD, intensity of absorbed light may be detected based on the amount of charges accumulated by the photosensitive device PD. The photosensitive device PD may be a second conduction type impurity region. For example, the photosensitive device PD may be an n-type impurity region.

The charge storage device SD may be configured to temporarily store charges generated by the photosensitive device PD by absorbing light. The image sensor 100 may control a pixel array via the global shutter mechanism. To support the global shutter mechanism, the unit pixel 10 may include the charge storage device SD for temporarily storing charges accumulated by the photosensitive device PD. The charge storage device SD may be or include a second conduction type impurity region. The charge storage device SD may be an n-type impurity region.

The image sensor 100 may include isolation trenches 116*h* and 118*h* formed in the semiconductor layer 110 and isolation layers 116 and 118 buried in the isolation trenches 116*h* and 118*h*, respectively. The isolation layers 116 and 118 buried in the isolation trenches 116*h* and 118*h* may be formed via, for example, a trench device isolation method. A trench device isolation method may be categorized as a shallow trench isolation (STI) and a deep trench isolation (DTI) according to depths of trenches. SDI and DTI isolation layers are not subject to a bird's beak effect where a growing layer bends due to stresses caused by oxide growth during local oxidation of silicon (LOCOS), and thus an active region of a substrate may be maintained without being eroded. The isolation layers 116 and 118 buried in the isolation trenches 116*h* and 118*h* may be DTIs formed to extend from the first surface 112 or the second surface 114 of the semiconductor layer 110 into the semiconductor layer 110.

If the semiconductor layer 110 is formed of or include Si, the isolation layers 116 and 118 may contain therein materials with refractive indexes smaller than the refractive indexes of Si, e.g., oxides, nitrides, oxynitrides, or the air. Each of the isolation layers 116 and 118 may be formed as a single layer including a single type of layer, a double layer including two types of layers, or a multi layer including a combination of at least three types of layers. For example, each of the isolation layers 116 and 118 may consist of or include two different types of insulation layers. For example, each of the isolation layers 116 and 118 may consist of or include a silicon oxide layer and a silicon nitride layer. For example, each of the isolation layers 116 and 118 may be or include a triple layer consisting of a silicon oxide layer, a silicon nitride layer, and a silicon oxide layer. For example, each of the isolation layers 116 and 118 may have a structure in which the air is interposed between at least two types of insulation layers.

The first isolation trench 116h and the first isolation layer 116 buried in the first isolation trench 116h may be formed between the plurality of unit pixels 10. The first isolation trench 116h and the first isolation layer 116 may extend from the first surface 112 of the semiconductor layer 110 toward the second surface 114 of the semiconductor layer 110.

The second isolation trench 118h and the second isolation layer 118 buried in the second isolation trench 118h may be formed between components constituting each of the unit pixel 10. For example, the second isolation trench 118h and the second isolation layer 118 may be arranged between the photosensitive device PD and the charge storage device SD inside the unit pixel 10. For another example, the second isolation trench 118h and the second isolation layer 118 may be arranged between the charge storage device SD and a floating diffusion region (FD of FIG. 1). For another example, the second isolation trench 118h and the second isolation layer 118 may be arranged between the photosensitive device PD and the floating diffusion region FD. The second isolation trench 118h and the second isolation layer 118 may extend from the second surface 114 of the semiconductor layer 110 toward the first surface 112. The second isolation trench 118h and the second isolation layer 118 may extend from the second surface 114 of the semiconductor layer 110 into the semiconductor layer 110 to not to contact the first surface 112. Charges generated by the photosensitive device PD by absorbing light between the second isolation layer 118 and the first surface 112 may be transmitted to the charge storage device SD.

The first isolation layer 116 and the second isolation layer 118 may be apart from the photosensitive device PD.

Light incident to the charge storage device SD may affect the amount of charges stored in the charge storage device SD. For example, if the charge storage device SD is a diode, the charge storage device SD may be configured to accumulate charges based on absorbed light like a photodiode. In this case, the amount of charges temporarily stored by the charge storage device SD and transmitted out of the unit pixel 10 may include an error. The second isolation layer 118 may be configured to block light that travels toward the charge storage device SD via the semiconductor layer 110. Light transmitted through the lens layer 150 and the color filter layer 140 may be incident to the semiconductor layer 110. Light incident to the semiconductor layer 110 may be reflected by the semiconductor layer 110 and the second isolation layer 118 and may not be incident to the charge storage device SD. For example, if the refractive index of a material of the second isolation layer 118 is lower than the refractive index of a material constituting the semiconductor layer 110 and an incidence angle of light incident to the second isolation layer 118 via the semiconductor layer 110 is greater than a critical angle, the light may be reflected at the interface between the semiconductor layer 110 and the second isolation layer 118 due to total reflection.

The transistor layer 120 and the semiconductor layer 110 may constitute a transistor for controlling the photosensitive device PD and the charge storage device SD. For example, as shown in FIG. 1, the unit pixel 10 may include the first transmission transistor 11 that forms a charge moving path between the photosensitive device PD and the charge storage device SD, where a first gate TG-1 of the first transmission transistor 11 may be formed in the transistor layer 120. In the same regard, a gate (not shown) of the second transmission transistor 12 shown in FIG. 1 may be formed in the transistor layer 120. A wiring layer (not shown) including a plurality of wirings formed of or include a conductive material may be further formed in the transistor layer 120. The transistor layer 120 may include gates constituting the first and second transmission transistors 11 and 12 and an insulation material surrounding the wiring layer.

The insulation layer 130 may be a passivation layer for protecting the semiconductor layer 110. The insulation layer 130 may have a stacked structure in which a plurality of insulation materials are stacked. For example, the insulation layer 130 may be formed of or include an oxide, a nitride, an oxynitride, or a combination thereof.

The insulation layer 130 may also be configured to reduce or substantially prevent diffusion or reflection of light. In this case, the insulation layer 130 may be formed as a multi layer in which materials with different refraction indexes are stacked. For example, the insulation layer 130 may include stacked layers including an oxide layer and a nitride layer (oxide layer/nitride layer or nitride layer/oxide layer) or stacked layers including an oxide layer and a carbon-containing layer (SiC) (oxide layer/SiC or SiC/oxide layer). For example, the oxide layer may be formed of or include one of borophosphosilicate glass (BPSG), phosphosilicate glass (PSG), borosilicate glass (BSG), un-doped silicate glass (USG), tetra ethyle ortho silicate (TEOS), and a high density plasma (HDP) layer. For example, the nitride layer may be formed as a silicon nitride layer ($Si_xN_y$, where x and y are natural numbers) or a silicon oxynitride layer ($Si_xO_yN_z$, where x, y, and z are natural numbers).

A first blocking layer 132 may be arranged in the insulation layer 130. A portion of the insulation layer 130 formed between the second surface 114 of the semiconductor layer 110 and the first blocking layer 132 may be an interlayer insulation layer (130a of FIG. 33). The first blocking layer 132 may be formed in the insulation layer 130 to reduce or substantially prevent light incident toward the insulation layer 130 through the lens layer 150 and the color filter layer 140 from being absorbed by the charge storage device SD. For example, the first blocking layer 132 may be arranged at a location in the insulation layer 130, which corresponds to that of the charge storage device SD. Furthermore, the first blocking layer 132 may be arranged to extend to a location in the insulation layer 130 corresponding to the second isolation layer 118. The charge storage device SD may be configured to overlap substantially the entire first blocking layer 132 in a direction perpendicular to the second surface 114 of the semiconductor layer 110. The first blocking layer 132 may be configured to overlap a portion of the first isolation layer 116 in a vertical direction. The first blocking layer 132 may be configured to overlap a portion of the second isolation layer 118 in a vertical direction.

Light transmitted through the lens layer 150 and the color filter layer 140 and being incident toward the charge storage device SD may be blocked by the first blocking layer 132 arranged in the insulation layer 130 and may not be incident to the semiconductor layer 110. Therefore, the charge storage device SD may be configured to store charges accumulated by the photosensitive device PD without being affected by light incident toward the charge storage device SD. The first blocking layer 132 may contain a material that substantially does not transmit light therethrough. For example, the first blocking layer 132 may contain a metal. For example, the first blocking layer 132 may contain aluminium (Al), silver (Ag), an alloy thereof, a Ag-based oxide (Ag—O), or an APC alloy (an alloy containing Ag, Pd, and Cu) and may further contain at least one of rhodium (Rh), copper (Cu), palladium (Pd), nickel (Ni), ruthenium (Ru), iridium (Ir), and platinum (Pt).

A second blocking layer 136 may be formed in the transistor layer 120. The second blocking layer 136 may be configured to prevent light from being incident to the charge storage device SD via the transistor layer 120. The second blocking layer 136 may contain a material that does not transmit light therethrough. For example, the second blocking layer 136 may contain aluminium (Al), silver (Ag), an alloy thereof, a Ag-based oxide (Ag—O), or an APC alloy (an alloy containing Ag, Pd, and Cu) and may further contain at least one of rhodium (Rh), copper (Cu), palladium (Pd), nickel (Ni), ruthenium (Ru), iridium (Ir), and platinum (Pt).

An interface covering region 162, a well region 164, and a leakage photogenerated charge drain region 170 may be formed in the semiconductor layer 110. The interface covering region 162 may surround the first isolation layer 116. The interface covering region 162 may be formed to surround the first isolation layer 116 in the semiconductor layer 110. The interface covering region 162 may be configured to remove charges formed due to defects that may exist at the interface between the first isolation layer 116 and the semiconductor layer 110. The interface covering region 162 may be configured to reduce or substantially prevent charges formed due to defects that may exist at the interface between the first isolation layer 116 and the semiconductor layer 110 from being accumulated in the photosensitive device PD. The interface covering region 162 may be a first conduction type impurity region exhibiting higher impurity concentration than the semiconductor layer 110. For example, the interface covering region 162 may be a p-type impurity region.

The well region 164 may be arranged in a portion of the semiconductor layer 110 on the charge storage device SD. The well region 164 may be formed in the semiconductor layer 110 to extend from the second surface 114 to a location that is near the charge storage device SD. The well region 164 may surround the second isolation layer 118 in the semiconductor layer 110. The well region 164 may remove charges formed due to defects that may exist at the interface between the second isolation layer 118 and the semiconductor layer 110. The well region 164 may be a second conduction type impurity region exhibiting higher impurity concentration than the semiconductor layer 110. For example, the well region 164 may be a p-type impurity region.

The leakage photogenerated charge drain region 170, which is apart from the charge storage device SD and is arranged above the charge storage device SD, may be formed in a portion of the semiconductor layer 110 near the second surface 114. The well region 164 may be arranged between the leakage photogenerated charge drain region 170 and the charge storage device SD. The well region 164 may surround the leakage photogenerated charge drain region 170 in the semiconductor layer 110. The leakage photogenerated charge drain region 170 may be formed to be apart from the isolation layers 116 and 118. The leakage photogenerated charge drain region 170 may be apart from the second isolation layer 118 by interposing a portion of the well region 164 therebetween. The leakage photogenerated charge drain region 170 may be apart from the first isolation layer 116 by interposing the interface covering region 162 therebetween. Although FIG. 3 shows that the interface covering region 162 and the well region 164 are arranged across the leakage photogenerated charge drain region 170 and the first isolation layer 116, the inventive concepts are not limited thereto, and the leakage photogenerated charge drain region 170 may be formed to contact the interface covering region 162. The leakage photogenerated charge drain region 170 may be a second conduction type impurity region. For example, the leakage photogenerated charge drain region 170 may be a n-type impurity region.

The leakage photogenerated charge drain region 170 may be electrically connected to the first blocking layer 132 via a drain contact plug 134. The drain contact plug 134 may be simultaneously or contemporaneously formed with the first blocking layer 132 and may be formed of or include a same material as the first blocking layer 132. The drain contact plug 134 may penetrate through an interlayer insulation layer (130a of FIG. 33), which is a portion of the insulation layer 130. The drain contact plug 134 and the first blocking layer 132 may be integrated with each other. The drain contact plug 134 and the first blocking layer 132 may be formed of or include a metal, for example. A positive bias VP may be applied to the first blocking layer 132. In other words, while the image sensor 100 is operating, the positive bias VP may be continuously applied to the first blocking layer 132. The positive bias VP may be applied to the first blocking layers 132 of the respective unit pixels 10 in common.

Even in case of blocking light incident toward the charge storage device SD by using the first and second blocking layers 132 and 136 and the isolation layers 116 and 118, a small amount of light may be incident toward the charge storage device SD due to structural limits or reflection/diffusion of light. For example, if light is incident to the well region 164 via a gap at which the first and second blocking layers 132 and 136 are not formed or light that is not completely reflected by the isolation layers 116 and 118 is incident to the well region 164 as leakage light, leakage photogenerated charges may be formed in a portion of the well region 164 that is near the charge storage device SD due to the leakage light. If the leakage photogenerated charges are accumulated in the charge storage device SD, image distortion may occur. However, if the positive bias VP is applied to the leakage photogenerated charge drain region 170 via the drain contact plug 134 and the first blocking layer 132, the leakage photogenerated charges are discharged to the outside via the leakage photogenerated charge drain region 170, and thus image distortion may be reduced or substantially prevented.

The color filter layer 140 may include a red (R) filter, a blue (B) filter, and a green (G) filter. Alternatively, the color filter layer 140 may include a cyan (C) filter, a yellow (Y) filter, and a magenta (M) filter. The color filter layer 140 including one of a R filter, a B filter, and a G filter or the color filter layer 140 including one of a C filter, a Y filter, and a M filter is formed in each of the unit pixels 10, and thus each of the unit pixels 10 may detect a single color.

The lens layer 150 may be configured to focus light incident to the image sensor 100 onto the unit pixels 10. If unit pixels 10 include photodiodes, the lens layer 150 may focus light incident to the image sensor 100 to the photodiodes of the unit pixels 10. The lens layer 150 may be formed of or include a TMR-based resin (a product of Tokyo Ohka Kogyo, Co.) or a MFR-based resin (a product of Japan Synthetic Rubber Corporation).

Figure 4:
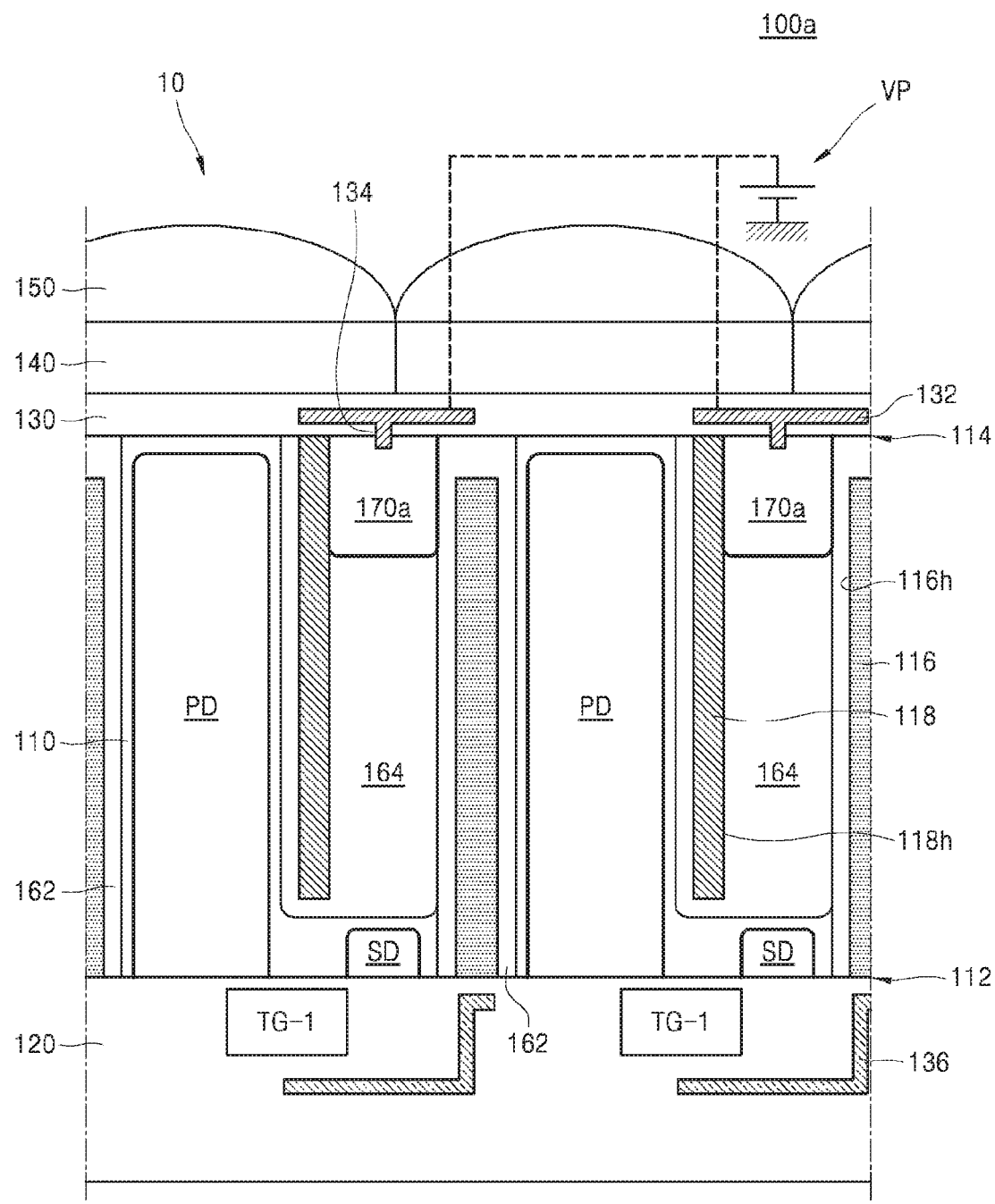
FIG. 4 is a sectional view diagram showing main elements of an image sensor according to another example embodiment.

FIG. 4 is a sectional view diagram showing main elements of an image sensor according to another example embodiment. FIG. 4 is a diagram showing sections of two unit pixels which were taken along a line II-II' shown in FIG. 29. Descriptions identical to those given above with reference to FIG. 3 may be omitted below.

Referring to FIG. 4, an image sensor 100a may include the semiconductor layer 110, the transistor layer 120, the color filter layer 140, and the lens layer 150. The semiconductor layer 110 may include the first surface 112 and the second surface 114 that are opposite to each other, and the transistor layer 120 may be formed on the first surface 112 of the semiconductor layer 110.

The color filter layer 140 and the lens layer 150 may be stacked, for example sequentially stacked, on the second surface 114 of the semiconductor layer 110. The image sensor 100a may include a pixel array including the plurality of unit pixels 10. Each of the unit pixels 10 included in the image sensor 100a may include the photosensitive device PD and the charge storage device SD formed on the semiconductor layer 110.

The image sensor 100a may include the isolation trenches 116h and 118h formed in the semiconductor layer 110 and the isolation layers 116 and 118 buried in the isolation trenches 116h and 118h, respectively. The isolation layers 116 and 118 may be apart from the photosensitive device PD.

The transistor layer 120 and the semiconductor layer 110 may constitute a transistor for controlling the photosensitive device PD and the charge storage device SD.

The first blocking layer 132 may be arranged in the insulation layer 130. A portion of the insulation layer 130 may be an interlayer insulation layer (130a of FIG. 33) formed between the second surface 114 of the semiconductor layer 110 and the first blocking layer 132. The second blocking layer 136 may be formed in the transistor layer 120.

An interface covering region 162, a well region 164, and a leakage photogenerated charge drain region 170 may be formed in the semiconductor layer 110. The interface covering region 162 may surround the first isolation layer 116. The interface covering region 162 may be formed to surround the first isolation layer 116 in the semiconductor layer 110. The well region 164 may be arranged in a portion of the semiconductor layer 110 on the charge storage device SD. The well region 164 may surround the second isolation layer 118 in the semiconductor layer 110.

A leakage photogenerated charge drain region 170a, which is apart from the charge storage device SD and is arranged above the charge storage device SD, may be formed in a portion of the semiconductor layer 110 near the second surface 114. The well region 164 may be arranged between the leakage photogenerated charge drain region 170a and the charge storage device SD. The well region 164 may contact the leakage photogenerated charge drain region 170a in the semiconductor layer 110. The leakage photogenerated charge drain region 170a may contact the second isolation layer 118, but the inventive concepts are not limited thereto. A portion of the well region 164 may be arranged between the leakage photogenerated charge drain region 170a and the second isolation layer 118. The leakage photogenerated charge drain region 170a may be apart from the first isolation layer 116 by interposing the interface covering region 162 therebetween. The leakage photogenerated charge drain region 170a may contact the interface covering region 162.

The leakage photogenerated charge drain region 170a may be electrically connected to the first blocking layer 132 via the drain contact plug 134. If the positive bias VP is applied to the leakage photogenerated charge drain region 170a via the drain contact plug 134 and the first blocking layer 132, leakage photogenerated charges based on leakage light that is not completely reflected or blocked are discharged to the outside via the leakage photogenerated charge drain region 170a, thereby reducing or substantially preventing image distortion.

Figure 5:
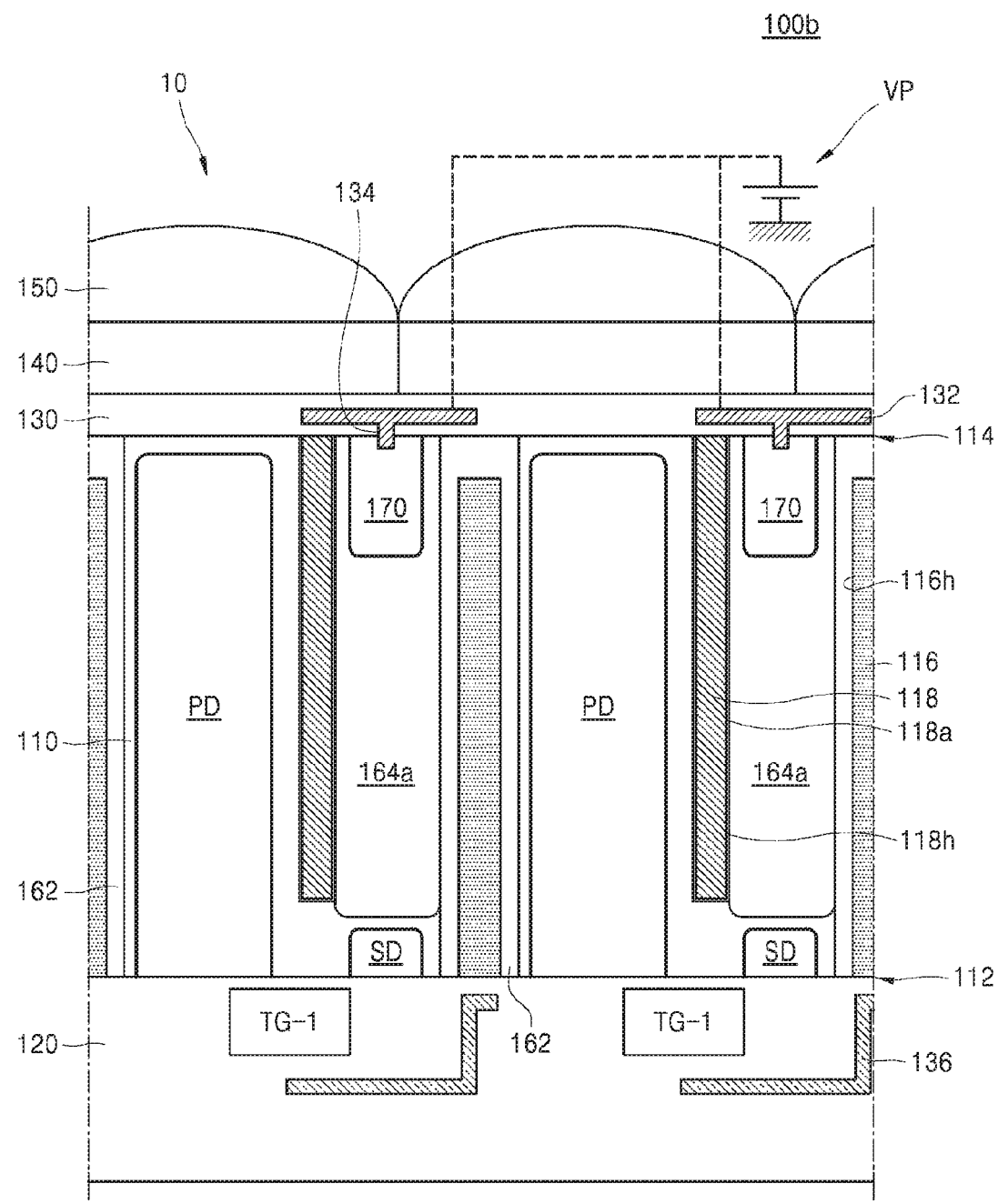
FIG. 5 is a schematic diagram showing an image sensor including a unit pixel as shown in FIG. 1, according to another example embodiment.

FIG. 5 is a schematic diagram showing an image sensor including a unit pixel as shown in FIG. 1, according to another example embodiment. FIG. 5 is a diagram showing sections of two unit pixels which were taken along a line I-I' shown in FIG. 27. Descriptions identical to those given above with reference to FIG. 3 may be omitted below.

Referring to FIG. 5, an image sensor 100b may include the semiconductor layer 110, the transistor layer 120, the color filter layer 140, and the lens layer 150. The semiconductor layer 110 may include the first surface 112 and the second surface 114 that are opposite to each other, and the transistor layer 120 may be formed on the first surface 112 of the semiconductor layer 110.

The color filter layer 140 and the lens layer 150 may be stacked, for example sequentially stacked, on the second surface 114 of the semiconductor layer 110. The image sensor 100a may include a pixel array including the plurality of unit pixels 10. Each of the unit pixels 10 included in the image sensor 100a may include the photosensitive device PD and the charge storage device SD formed on the semiconductor layer 110.

The image sensor 100a may include the isolation trenches 116h and 118h formed in the semiconductor layer 110 and the isolation layers 116 and 118 buried in the isolation trenches 116h and 118h, respectively. The isolation layers 116 and 118 may be apart from the photosensitive device PD.

An interface insulation layer 118a may be formed on a surface of the second isolation layer 118 in the semiconductor layer 110. The interface insulation layer 118a may conformally cover inner walls of the second isolation trench 118h. The second isolation layer 118 may be formed to substantially fill the second isolation trench 118h having formed thereon the interface insulation layer 118a. In other words, the interface insulation layer 118a may be configured to cover the interface between the second isolation layer 118 and the semiconductor layer 110. The interface insulation layer 118a may be formed of or include a material having a permittivity greater than the permittivity of a silicon oxide. For example, the interface insulation layer 118a may be formed of or include at least one of barium titanium oxide (BaTiO), hafnium oxide (HfO), hafnium silicate (HfSiO), hafnium oxynitride (HfON), hafnium silicon oxynitride (HfSiON), lanthanum oxide (LaO), lanthanum aluminium oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), strontium titanium oxide (SrTiO), yttrium oxide (YO), aluminium oxide (AlO), and lead scandium tantalum oxide (PbScTaO). The interface insulation layer 118a may be configured to minimize charges formed based on defects that may exist at the interface between the second isolation layer 118 and the semiconductor layer 110.

The transistor layer 120 and the semiconductor layer 110 may constitute a transistor for controlling the photosensitive device PD and the charge storage device SD.

The first blocking layer 132 may be arranged in the insulation layer 130. A portion of the insulation layer 130 may be an interlayer insulation layer (130a of FIG. 33) formed between the second surface 114 of the semiconductor layer 110 and the first blocking layer 132. The second blocking layer 136 may be formed in the transistor layer 120.

The interface covering region 162, a well region 164a, and the leakage photogenerated charge drain region 170 may be formed in the semiconductor layer 110. The interface covering region 162 may surround the first isolation layer 116. The interface covering region 162 may be formed to surround the first isolation layer 116 in the semiconductor layer 110. The well region 164a may be arranged in a portion of the semiconductor layer 110 on the charge storage device SD. The well region 164a may be formed in a portion of the semiconductor layer 110 between the first isolation layer 116 and the second isolation layer 118.

The leakage photogenerated charge drain region 170, which is apart from the charge storage device SD and is arranged above the charge storage device SD, may be formed in a portion of the semiconductor layer 110 near the second surface 114. The well region 164a may be arranged between the leakage photogenerated charge drain region 170 and the charge storage device SD. The well region 164a may surround the leakage photogenerated charge drain region 170 in the semiconductor layer 110. The leakage photogenerated charge drain region 170 may be formed to be apart from the isolation layers 116 and 118. The leakage photogenerated charge drain region 170 may be apart from the second isolation layer 118 by interposing a portion of the well region 164a therebetween. The leakage photogenerated charge drain region 170 may be apart from the first isolation layer 116 by interposing the interface covering region 162 therebetween.

The leakage photogenerated charge drain region 170 may be electrically connected to the first blocking layer 132 via the drain contact plug 134. If the positive bias VP is applied to the leakage photogenerated charge drain region 170 via the drain contact plug 134 and the first blocking layer 132, leakage photogenerated charges are discharged to the outside via the leakage photogenerated charge drain region 170, thereby reducing or substantially preventing image distortion.

Figure 6:
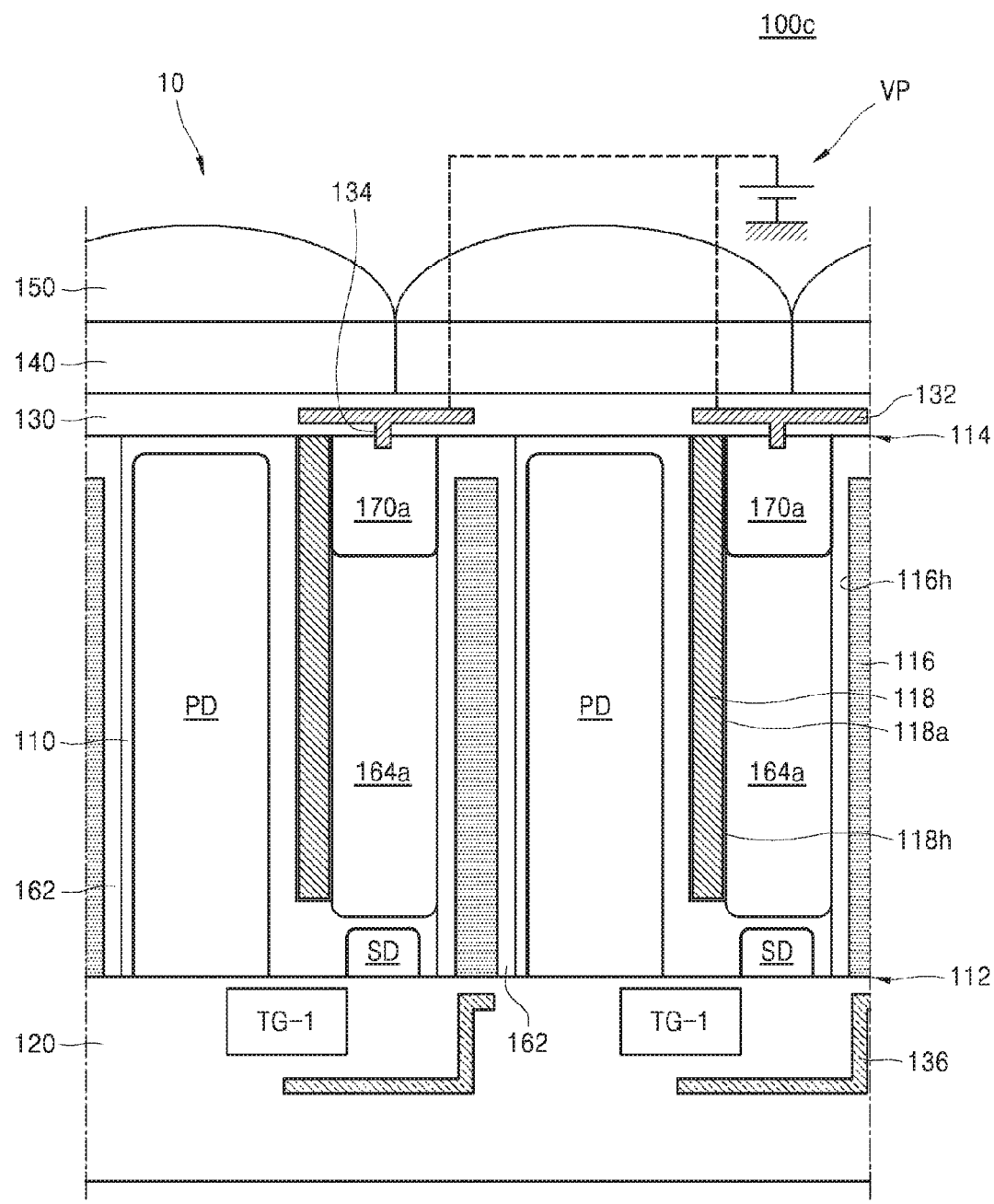
FIG. 6 is a sectional view diagram showing main elements of an image sensor according to another example embodiment.

FIG. 6 is a sectional view diagram showing main elements of an image sensor according to another example embodiment. FIG. 6 is a diagram showing sections of two unit pixels which were taken along a line II-II' shown in FIG. 28 or FIG. 29. Descriptions identical to those given above with reference to FIGS. 3 through 5 may be omitted below.

Referring to FIG. 6, an image sensor 100c may include the semiconductor layer 110, the transistor layer 120, the color filter layer 140, and the lens layer 150. The semiconductor layer 110 may include the first surface 112 and the second surface 114 that are opposite to each other, and the transistor layer 120 may be formed on the first surface 112 of the semiconductor layer 110.

The color filter layer 140 and the lens layer 150 may be stacked, for example sequentially stacked on the second surface 114 of the semiconductor layer 110. The image sensor 100c may include a pixel array including the plurality of unit pixels 10. Each of the unit pixels 10 included in the image sensor 100c may include the photosensitive device PD and the charge storage device SD formed on the semiconductor layer 110.

The image sensor 100c may include the isolation trenches 116h and 118h formed in the semiconductor layer 110 and the isolation layers 116 and 118 buried in the isolation trenches 116h and 118h, respectively. The isolation layers 116 and 118 may be apart from the photosensitive device PD.

The transistor layer 120 and the semiconductor layer 110 may constitute a transistor for controlling the photosensitive device PD and the charge storage device SD. The interface insulation layer 118a may be formed on a surface of the second isolation layer 118 in the semiconductor layer 110. The interface insulation layer 118a may conformally cover inner walls of the second isolation trench 118h. The second isolation layer 118 may be formed to substantially fill the second isolation trench 118h having formed thereon the interface insulation layer 118a. In other words, the interface insulation layer 118a may cover the interface between the second isolation layer 118 and the semiconductor layer 110.

The first blocking layer 132 may be arranged in the insulation layer 130. A portion of the insulation layer 130 may be an interlayer insulation layer (130a of FIG. 33) formed between the second surface 114 of the semiconductor layer 110 and the first blocking layer 132. The second blocking layer 136 may be formed in the transistor layer 120.

The interface covering region 162, the well region 164, and the leakage photogenerated charge drain region 170a may be formed in the semiconductor layer 110. The interface covering region 162 may surround the first isolation layer 116. The interface covering region 162 may be formed to surround the first isolation layer 116 in the semiconductor layer 110. The well region 164 may be arranged in a portion of the semiconductor layer 110 on the charge storage device SD. The well region 164 may be formed in a portion of the semiconductor layer 110 that is close to the charge storage device SD from the second isolation layer 118.

A leakage photogenerated charge drain region 170a, which is apart from the charge storage device SD and is arranged above the charge storage device SD, may be formed in a portion of the semiconductor layer 110 near the second surface 114. The well region 164a may be arranged between the leakage photogenerated charge drain region 170a and the charge storage device SD. The well region 164a may contact the leakage photogenerated charge drain region 170a in the semiconductor layer 110. The leakage photogenerated charge drain region 170a may contact the second isolation layer 118 and the interface insulation layer 118a covering a surface of the second isolation layer 118, but the inventive concepts are not limited thereto. A portion of the well region 164a may be arranged between the leakage photogenerated charge drain region 170a and the second isolation layer 118. The leakage photogenerated charge drain region 170a may be apart from the first isolation layer 116 by interposing the interface covering region 162 therebetween. The leakage photogenerated charge drain region 170a may contact the interface covering region 162.

The leakage photogenerated charge drain region 170a may be electrically connected to the first blocking layer 132 via the drain contact plug 134. If the positive bias VP is applied to the leakage photogenerated charge drain region 170a via the drain contact plug 134 and the first blocking layer 132, leakage photogenerated charges based on leakage light that is not completely reflected or blocked are discharged to the outside via the leakage photogenerated charge drain region 170a, thereby reducing or substantially preventing image distortion.

Figure 7:
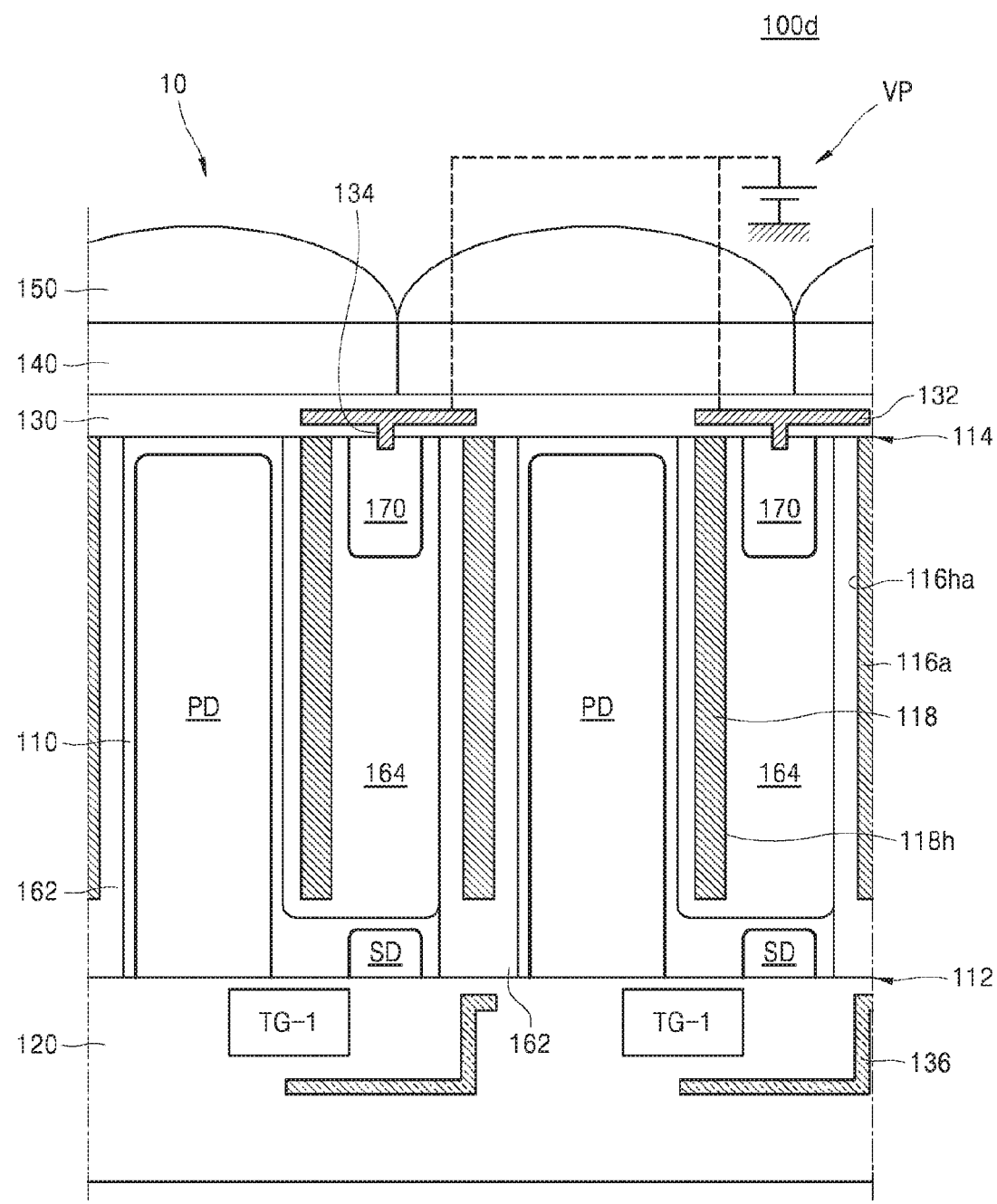
FIG. 7 is a sectional view diagram showing main elements of an image sensor according to another example embodiment.

FIG. 7 is a sectional view diagram showing main elements of an image sensor according to another example embodiment. FIG. 7 is a diagram showing sections of two unit pixels which were taken along a line I-I' shown in FIG. 27. Descriptions identical to those given above with reference to FIG. 3 may be omitted below.

Referring to FIG. 7, an image sensor 100d may include the semiconductor layer 110, the transistor layer 120, the color filter layer 140, and the lens layer 150. The semiconductor layer 110 may include the first surface 112 and the second surface 114 that are opposite to each other, and the transistor layer 120 may be formed on the first surface 112 of the semiconductor layer 110.

The color filter layer 140 and the lens layer 150 may be stacked, for example sequentially stacked on the second surface 114 of the semiconductor layer 110. The image sensor 100a may include a pixel array including the plurality of unit pixels 10. Each of the unit pixels 10 included in the image sensor 100a may include the photosensitive device PD and the charge storage device SD formed on the semiconductor layer 110.

The image sensor 100d may include isolation trenches 116ha and 118h formed in the semiconductor layer 110 and the isolation layers 116a and 118 buried in the isolation trenches 116ha and 118h, respectively. The isolation layers 116a and 118 may be apart from the photosensitive device PD.

The first isolation trench 116ha and the first isolation layer 116a may extend from the second surface 114 of the semiconductor layer 110 toward the first surface 112. The second isolation trench 118h and the second isolation layer 118 may extend from the second surface 114 of the semiconductor layer 110 toward the first surface 112. The first isolation trench 116ha and the second isolation trench 118h may be simultaneously or contemporaneously formed. The 116a and the second isolation layer 118 may be simultaneously or contemporaneously formed.

The transistor layer 120 and the semiconductor layer 110 may constitute a transistor for controlling the photosensitive device PD and the charge storage device SD.

The first blocking layer 132 may be arranged in the insulation layer 130. A portion of the insulation layer 130 may be an interlayer insulation layer (130a of FIG. 33) formed between the second surface 114 of the semiconductor layer 110 and the first blocking layer 132. The second blocking layer 136 may be formed in the transistor layer 120.

The interface covering region 162, a well region 164, and the leakage photogenerated charge drain region 170 may be formed in the semiconductor layer 110. The interface covering region 162 may surround the first isolation layer 116. The interface covering region 162 may be formed to surround the first isolation layer 116 in the semiconductor layer 110. The well region 164 may be arranged in a portion of the semiconductor layer 110 on the charge storage device SD. The well region 164 may surround the second isolation layer 118 in the semiconductor layer 110.

The leakage photogenerated charge drain region 170, which is apart from the charge storage device SD and is arranged above the charge storage device SD, may be formed in a portion of the semiconductor layer 110 near the second surface 114. The well region 164 may be arranged between the leakage photogenerated charge drain region 170 and the charge storage device SD. The well region 164 may substantially surround the leakage photogenerated charge drain region 170 in the semiconductor layer 110. The leakage photogenerated charge drain region 170 may be formed to be apart from the isolation layers 116a and 118. The leakage photogenerated charge drain region 170 may be apart from the second isolation layer 118 by interposing a portion of the well region 164 therebetween. The leakage photogenerated charge drain region 170 may be apart from the first isolation layer 116a by interposing the interface covering region 162 therebetween.

The leakage photogenerated charge drain region 170 may be electrically connected to the first blocking layer 132 via the drain contact plug 134. If the positive bias VP is applied to the leakage photogenerated charge drain region 170 via the drain contact plug 134 and the first blocking layer 132, leakage photogenerated charges are discharged to the outside via the leakage photogenerated charge drain region 170, thereby reducing or substantially preventing image distortion.

Figure 8:
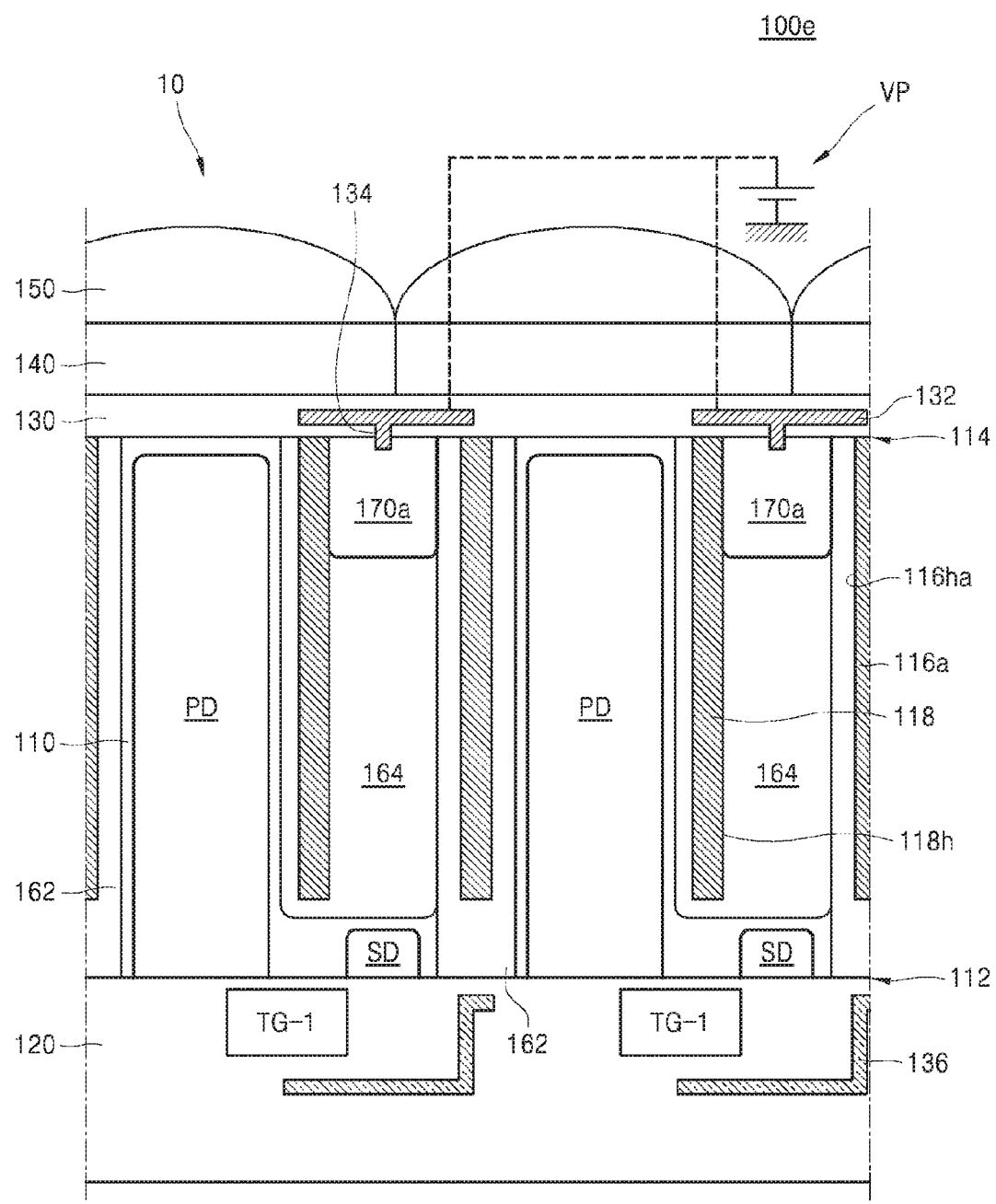
FIG. 8 is a sectional view diagram showing main elements of an image sensor according to another example embodiment.

FIG. 8 is a sectional view diagram showing main elements of an image sensor according to another example embodiment. FIG. 8 is a diagram showing sections of two unit pixels which were taken along a line II-II' shown in FIG. 28 or FIG. 29. Descriptions identical to those given above with reference to FIG. 4 may be omitted below.

Referring to FIG. 8, an image sensor 100e may include the semiconductor layer 110, the transistor layer 120, the color filter layer 140, and the lens layer 150. The semiconductor layer 110 may include the first surface 112 and the second surface 114 that are opposite to each other, and the transistor layer 120 may be formed on the first surface 112 of the semiconductor layer 110.

The color filter layer 140 and the lens layer 150 may be stacked, for example sequentially stacked on the second surface 114 of the semiconductor layer 110. The image sensor 100e may include a pixel array including the plurality of unit pixels 10. Each of the unit pixels 10 included in the image sensor 100e may include the photosensitive device PD and the charge storage device SD formed on the semiconductor layer 110.

The image sensor 100e may include the isolation trenches 116ha and 118h formed in the semiconductor layer 110 and the isolation layers 116a and 118 buried in the isolation trenches 116ha and 118h, respectively. The isolation layers 116a and 118 may be apart from the photosensitive device PD.

The first isolation trench 116ha and the first isolation layer 116a may extend from the second surface 114 of the semiconductor layer 110 toward the first surface 112. The second isolation trench 118h and the second isolation layer 118 may extend from the second surface 114 of the semiconductor layer 110 toward the first surface 112. The first isolation trench 116ha and the second isolation trench 118h may be simultaneously or contemporaneously formed. The 116a and the second isolation layer 118 may be simultaneously or contemporaneously formed.

The transistor layer 120 and the semiconductor layer 110 may constitute a transistor for controlling the photosensitive device PD and the charge storage device SD.

The first blocking layer 132 may be arranged in the insulation layer 130. A portion of the insulation layer 130 may be an interlayer insulation layer (130a of FIG. 33) formed between the second surface 114 of the semiconductor layer 110 and the first blocking layer 132. The second blocking layer 136 may be formed in the transistor layer 120.

The interface covering region 162, the well region 164, and the leakage photogenerated charge drain region 170a may be formed in the semiconductor layer 110. The interface covering region 162 may surround the first isolation layer 116a. The interface covering region 162 may be formed to surround the first isolation layer 116a in the semiconductor layer 110. The well region 164 may be arranged in a portion of the semiconductor layer 110 on the charge storage device SD. The well region 164 may be formed in the semiconductor layer 110 to surround the second isolation layer 118.

The leakage photogenerated charge drain region 170a, which is apart from the charge storage device SD and is arranged above the charge storage device SD, may be formed in a portion of the semiconductor layer 110 near the second surface 114. The well region 164 may be arranged between the leakage photogenerated charge drain region 170a and the charge storage device SD. The well region 164 may contact the leakage photogenerated charge drain region 170a in the semiconductor layer 110. The leakage photogenerated charge drain region 170a may contact the second isolation layer 118 and the interface insulation layer 118a covering a surface of the second isolation layer 118, but the inventive concepts are not limited thereto. A portion of the well region 164 may be arranged between the leakage photogenerated charge drain region 170a and the second isolation layer 118. The leakage photogenerated charge drain region 170a may be apart from the first isolation layer 116a by interposing the interface covering region 162 therebetween. The leakage photogenerated charge drain region 170a may contact the interface covering region 162.

The leakage photogenerated charge drain region 170a may be electrically connected to the first blocking layer 132 via the drain contact plug 134. If the positive bias VP is applied to the leakage photogenerated charge drain region 170a via the drain contact plug 134 and the first blocking layer 132, leakage photogenerated charges based on leakage light that is not completely reflected or blocked are discharged to the outside via the leakage photogenerated charge drain region 170a, thereby reducing or substantially preventing image distortion.

Figure 9:
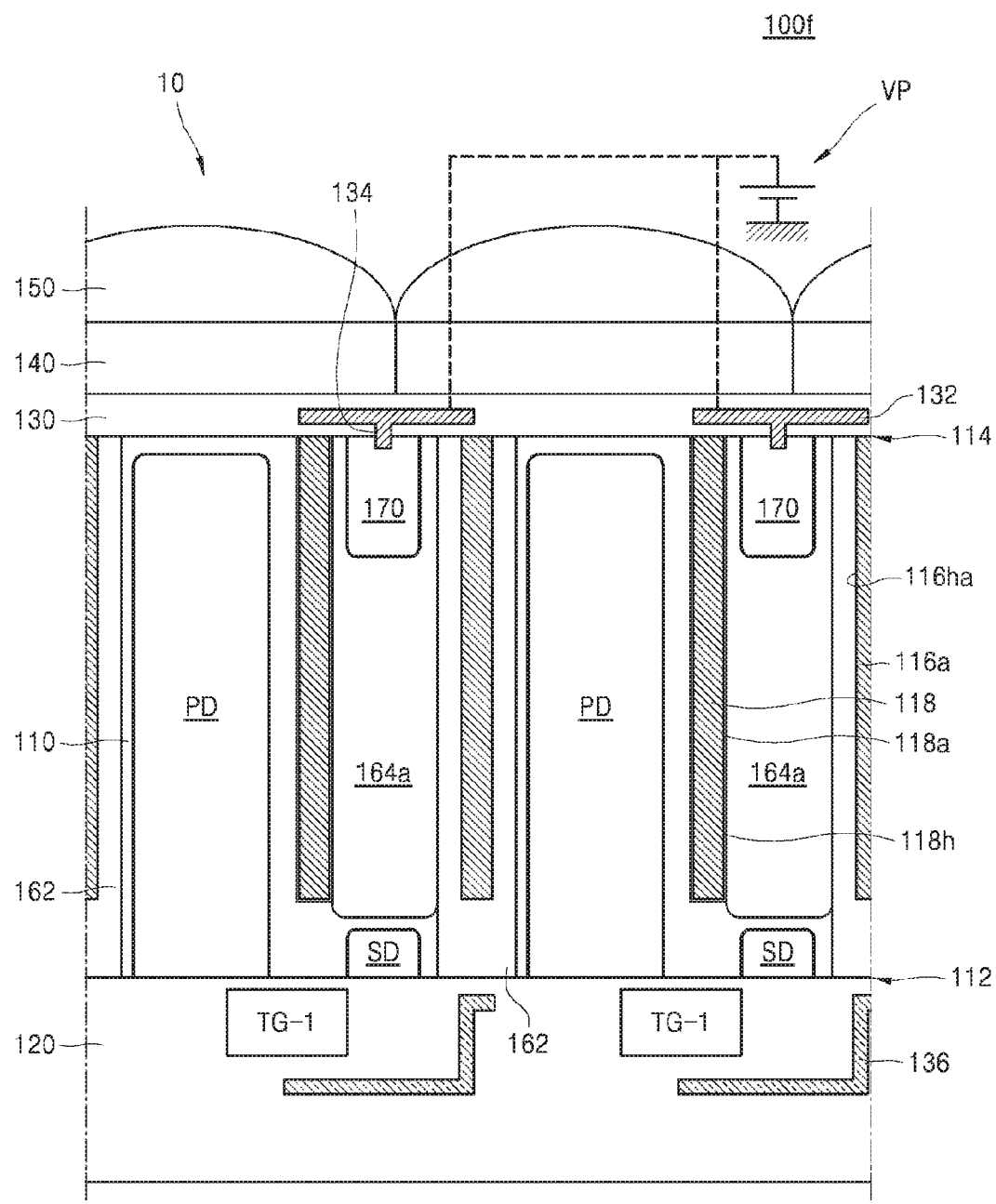
FIG. 9 is a sectional view diagram showing main elements of an image sensor according to another example embodiment.

FIG. 9 is a sectional view diagram showing main elements of an image sensor according to another example embodiment. FIG. 9 is a diagram showing sections of two unit pixels which were taken along a line I-I' shown in FIG. 27. Descriptions identical to those given above with reference to FIG. 5 may be omitted below.

Referring to FIG. 9, an image sensor 100f may include the semiconductor layer 110, the transistor layer 120, the color filter layer 140, and the lens layer 150. The semiconductor layer 110 may include the first surface 112 and the second surface 114 that are opposite to each other, and the transistor layer 120 may be formed on the first surface 112 of the semiconductor layer 110.

The color filter layer 140 and the lens layer 150 may be stacked, for example sequentially stacked on the second surface 114 of the semiconductor layer 110. The image sensor 100a may include a pixel array including the plurality of unit pixels 10. Each of the unit pixels 10 included in the image sensor 100a may include the photosensitive device PD and the charge storage device SD formed on the semiconductor layer 110.

The image sensor 100f may include isolation trenches 116ha and 118h formed in the semiconductor layer 110 and the isolation layers 116a and 118 buried in the isolation trenches 116ha and 118h, respectively. The isolation layers 116a and 118 may be apart from the photosensitive device PD.

The first isolation trench 116ha and the first isolation layer 116a may extend from the second surface 114 of the semiconductor layer 110 toward the first surface 112. The second isolation trench 118h and the second isolation layer 118 may extend from the second surface 114 of the semiconductor layer 110 toward the first surface 112. The first isolation trench 116ha and the second isolation trench 118h may be simultaneously or contemporaneously formed. The 116a and the second isolation layer 118 may be simultaneously or contemporaneously formed.

The interface insulation layer 118a may be formed on a surface of the second isolation layer 118 in the semiconductor layer 110. The interface insulation layer 118a may be configured to conformally cover inner walls of the second isolation trench 118h. The second isolation layer 118 may be formed to substantially fill the second isolation trench 118h having formed thereon the interface insulation layer 118a. In other words, the interface insulation layer 118a may be configured to cover the interface between the second isolation layer 118 and the semiconductor layer 110. The interface insulation layer 118a may minimize charges formed based on defects that may exist at the interface between the second isolation layer 118 and the semiconductor layer 110.

The transistor layer 120 and the semiconductor layer 110 may constitute a transistor for controlling the photosensitive device PD and the charge storage device SD.

The first blocking layer 132 may be arranged in the insulation layer 130. A portion of the insulation layer 130 may be an interlayer insulation layer (130a of FIG. 33) formed between the second surface 114 of the semiconductor layer 110 and the first blocking layer 132. The second blocking layer 136 may be formed in the transistor layer 120.

The interface covering region 162, a well region 164a, and the leakage photogenerated charge drain region 170 may be formed in the semiconductor layer 110. The interface covering region 162 may surround the first isolation layer 116. The interface covering region 162 may be formed to surround the first isolation layer 116 in the semiconductor layer 110. The well region 164a may be arranged in a portion of the semiconductor layer 110 on the charge storage device SD. The well region 164a may be formed in a portion of the semiconductor layer 110 that is close to the charge storage device SD from the second isolation layer 118.

The leakage photogenerated charge drain region 170, which is apart from the charge storage device SD and is arranged above the charge storage device SD, may be formed in a portion of the semiconductor layer 110 near the second surface 114. The well region 164a may be arranged between the leakage photogenerated charge drain region 170 and the charge storage device SD. The well region 164a may surround the leakage photogenerated charge drain region 170 in the semiconductor layer 110. The leakage photogenerated charge drain region 170 may be formed to be apart from the isolation layers 116a and 118. The leakage photogenerated charge drain region 170 may be apart from the second isolation layer 118 by interposing a portion of the well region 164a therebetween. The leakage photogenerated charge drain region 170 may be apart from the first isolation layer 116a by interposing the interface covering region 162 therebetween.

The leakage photogenerated charge drain region 170 may be electrically connected to the first blocking layer 132 via the drain contact plug 134. If the positive bias VP is applied to the leakage photogenerated charge drain region 170 via the drain contact plug 134 and the first blocking layer 132, leakage photogenerated charges are discharged to the outside via the leakage photogenerated charge drain region 170, thereby reducing or substantially preventing image distortion.

Figure 10:
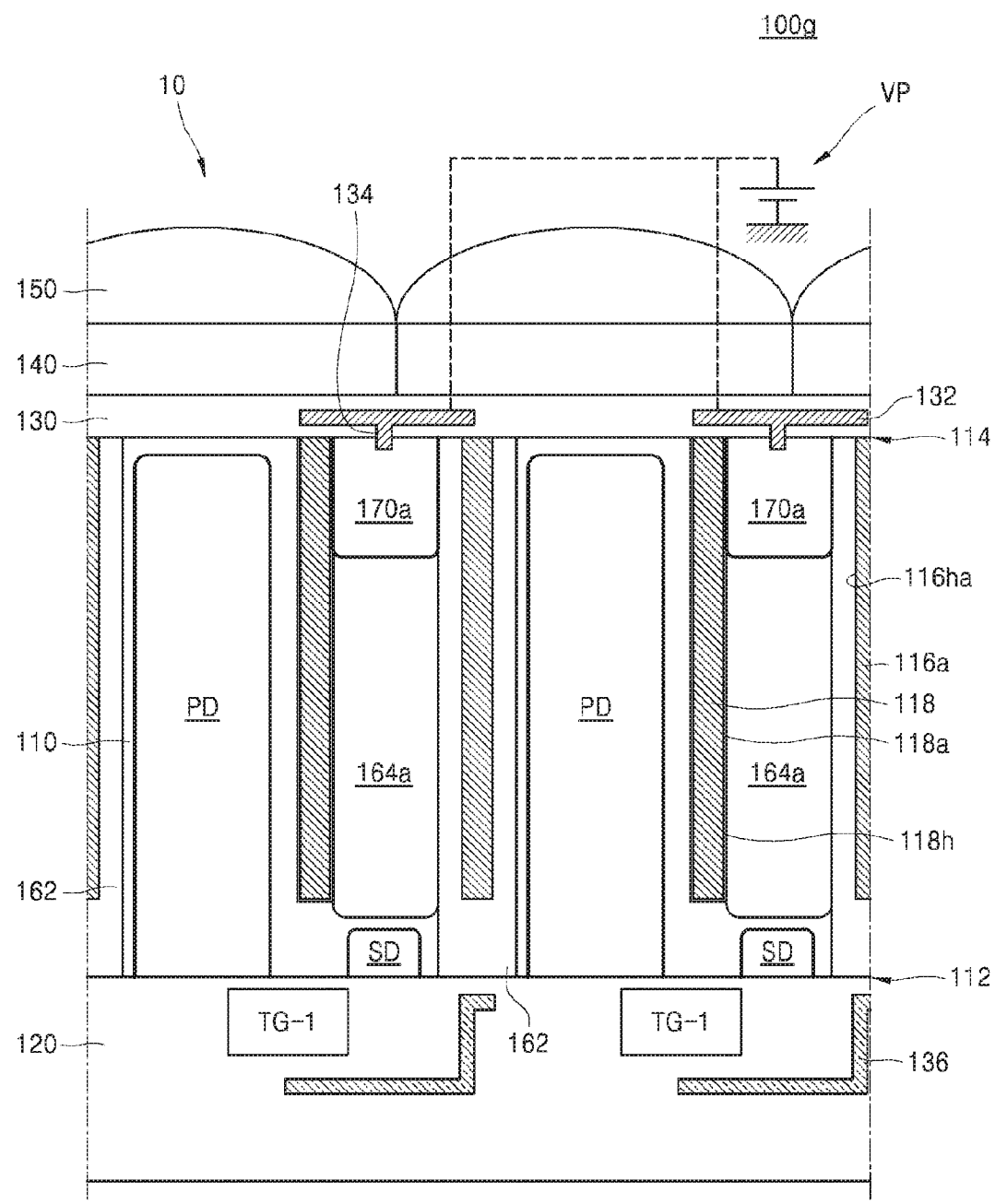
FIG. 10 is a sectional view diagram showing main elements of an image sensor according to another example embodiment.

FIG. 10 is a sectional view diagram showing main elements of an image sensor according to another example embodiment. FIG. 10 is a diagram showing sections of two unit pixels which were taken along a line II-II' shown in FIG.

Figure 29:
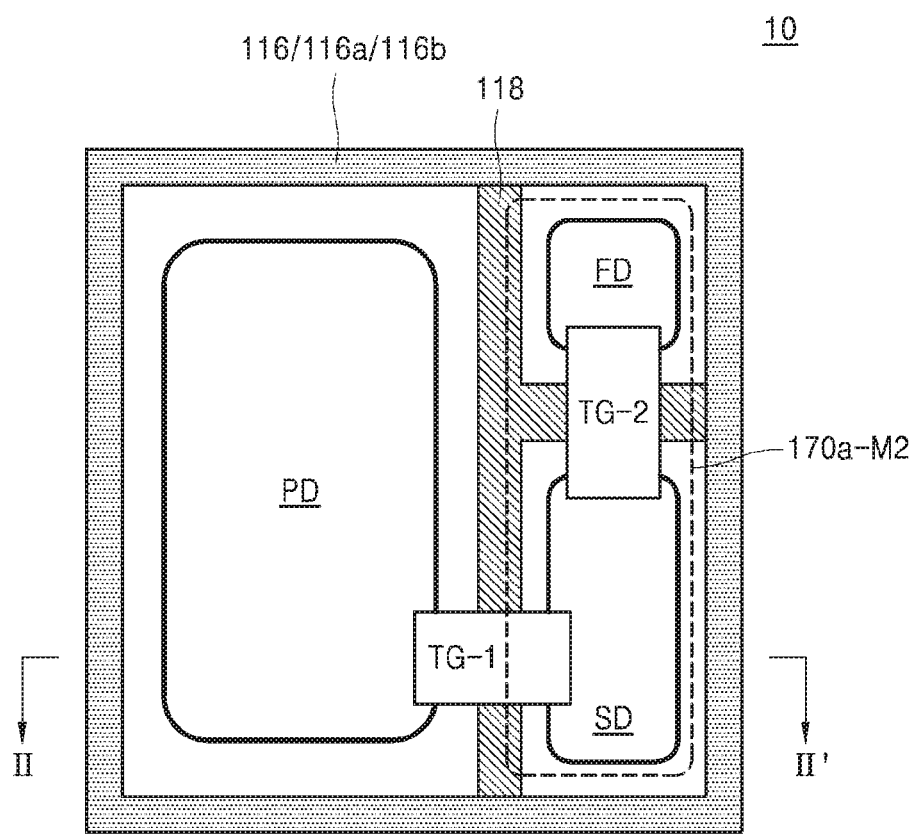
FIG. 29 is a plan view diagram showing main elements of image sensors according to example embodiments.

28 or FIG. 29. Descriptions identical to those given above with reference to FIGS. 3 through 5 may be omitted below.

Referring to FIG. 10, an image sensor 100*g* may include the semiconductor layer 110, the transistor layer 120, the color filter layer 140, and the lens layer 150. The semiconductor layer 110 may include the first surface 112 and the second surface 114 that are opposite to each other, and the transistor layer 120 may be formed on the first surface 112 of the semiconductor layer 110.

The color filter layer 140 and the lens layer 150 may be stacked, for example sequentially stacked on the second surface 114 of the semiconductor layer 110. The image sensor 100*g* may include a pixel array including the plurality of unit pixels 10. Each of the unit pixels 10 included in the image sensor 100*g* may include the photosensitive device PD and the charge storage device SD formed on the semiconductor layer 110.

The image sensor 100*g* may include the isolation trenches 116*ha* and 118*h* formed in the semiconductor layer 110 and the isolation layers 116*a* and 118 buried in the isolation trenches 116*ha* and 118*h,* respectively. The isolation layers 116*a* and 118 may be apart from the photosensitive device PD.

The first isolation trench 116*ha* and the first isolation layer 116*a* may extend from the second surface 114 of the semiconductor layer 110 toward the first surface 112. The second isolation trench 118*h* and the second isolation layer 118 may extend from the second surface 114 of the semiconductor layer 110 toward the first surface 112. The first isolation trench 116*ha* and the second isolation trench 118*h* may be simultaneously or contemporaneously formed. The 116*a* and the second isolation layer 118 may be simultaneously or contemporaneously formed.

The transistor layer 120 and the semiconductor layer 110 may constitute a transistor for controlling the photosensitive device PD and the charge storage device SD. The interface insulation layer 118*a* may be formed on a surface of the second isolation layer 118 in the semiconductor layer 110. The interface insulation layer 118*a* may conformally cover inner walls of the second isolation trench 118*h*. The second isolation layer 118 may be formed to substantially fill the second isolation trench 118*h* having formed thereon the interface insulation layer 118*a*. In other words, the interface insulation layer 118*a* may cover the interface between the second isolation layer 118 and the semiconductor layer 110.

The first blocking layer 132 may be arranged in the insulation layer 130. A portion of the insulation layer 130 may be an interlayer insulation layer (130*a* of FIG. 33) formed between the second surface 114 of the semiconductor layer 110 and the first blocking layer 132. The second blocking layer 136 may be formed in the transistor layer 120.

The interface covering region 162, the well region 164*a*, and the leakage photogenerated charge drain region 170*a* may be formed in the semiconductor layer 110. The interface covering region 162 may surround the first isolation layer 116*a*. The interface covering region 162 may be formed to surround the first isolation layer 116*a* in the semiconductor layer 110. The well region 164*a* may be arranged in a portion of the semiconductor layer 110 on the charge storage device SD. The well region 164*a* may be formed in a portion of the semiconductor layer 110 close to the charge storage device SD from the second isolation layer 118.

A leakage photogenerated charge drain region 170*a*, which is apart from the charge storage device SD and is arranged above the charge storage device SD, may be formed in a portion of the semiconductor layer 110 near the second surface 114. The well region 164*a* may be arranged between the leakage photogenerated charge drain region 170*a* and the charge storage device SD. The well region 164*a* may contact the leakage photogenerated charge drain region 170*a* in the semiconductor layer 110. The leakage photogenerated charge drain region 170*a* may contact the second isolation layer 118 and the interface insulation layer 118*a* covering a surface of the second isolation layer 118, but the inventive concepts are not limited thereto. A portion of the well region 164*a* may be arranged between the leakage photogenerated charge drain region 170*a* and the second isolation layer 118. The leakage photogenerated charge drain region 170*a* may be apart from the first isolation layer 116*a* by interposing the interface covering region 162 therebetween. The leakage photogenerated charge drain region 170*a* may contact the interface covering region 162.

The leakage photogenerated charge drain region 170*a* may be electrically connected to the first blocking layer 132 via the drain contact plug 134. If the positive bias VP is applied to the leakage photogenerated charge drain region 170*a* via the drain contact plug 134 and the first blocking layer 132, leakage photogenerated charges based on leakage light that is not completely reflected or blocked are discharged to the outside via the leakage photogenerated charge drain region 170*a*, thereby reducing or substantially preventing image distortion.

FIGS. 11 through 14 are sectional view diagrams showing main elements of image sensors according to other example embodiments. In detail, descriptions identical to those given above with reference to FIGS. 3 through 6 may be omitted below.

Referring to FIGS. 11 through 14, each of, or one or more of, image sensors 100*h*, 100*i*, 100*j*, and 100*k* may include a first isolation trench 116*hb* formed in the semiconductor layer 110 and a first isolation layer 116*b* buried in the first isolation trench 116*hb*. The first isolation trench 116*hb* may extend from the first surface 112 of the semiconductor layer 110 to the second surface 114 of the semiconductor layer 110. The first isolation layer 116*b* buried in the first isolation trench 116*hb* may be a DTI formed to extend from the first surface 112 of the semiconductor layer 110 to the second surface 114 of the semiconductor layer 110.

FIGS. 15 through 18 are sectional view diagrams showing main elements of image sensors according to other example embodiments. In detail, descriptions identical to those given above with reference to FIGS. 3 through 6 may be omitted below.

Referring to FIGS. 15 through 18, each of, or one or more of, image sensors 100*l*, 100*m,* 100*n*, and 100*o* may include the insulation layer 130, and the first blocking layer 132, the drain contact plug 134, and a first extended blocking layer 134*a* that are arranged in the insulation layer 130. The first extended blocking layer 134*a* may extend from the first blocking layer 132, penetrate through a portion of the insulation layer 130, and contact the second isolation layer 118. The first extended blocking layer 134*a* may be formed together with the first blocking layer 132, and the first extended blocking layer 134*a* may be formed of or include a same material as the first blocking layer 132. A portion of the first extended blocking layer 134*a* may extend into the second isolation layer 118. The first extended blocking layer 134*a* may be simultaneously or contemporaneously formed with the drain contact plug 134. The first extended blocking layer 134*a* may block light that is incident to the semiconductor layer 110 via a gap between the first blocking layer 132 and the second isolation layer 118.

FIGS. 19 through 22 are sectional view diagrams showing main elements of image sensors according to other example embodiments. In detail, descriptions identical to those given above with reference to FIGS. 7 through 10 may be omitted below.

Referring to FIGS. 19 through 22, each of image sensors 100*p*, 100*q*, 100*r*, and 100*s* may include the insulation layer 130, and the first blocking layer 132, the drain contact plug 134, a first extended blocking layer 134*a*, and a second extended blocking layer 134*b* that are arranged in the insulation layer 130. The first extended blocking layer 134*a* may extend from the first blocking layer 132, penetrate through a portion of the insulation layer 130, and contact the second isolation layer 118. The second extended blocking layer 134*b* may extend from the first blocking layer 132, penetrate through a portion of the insulation layer 130, and contact the first isolation layer 116*a*.

The first extended blocking layer 134*a* and the second extended blocking layer 134*b* may be formed together with the first blocking layer 132, and the first extended blocking layer 134*a* and the second extended blocking layer 134*b* may be formed of or include a same material as the first blocking layer 132. A portion of the first extended blocking layer 134*a* may extend into the second isolation layer 118. A portion of the second extended blocking layer 134*b* may extend into the first isolation layer 116*a*. The first extended blocking layer 134*a* and the second extended blocking layer 134*b* may be simultaneously or contemporaneously formed with the drain contact plug 134. The first extended blocking layer 134*a* may block light that is incident to the semiconductor layer 110 via a gap between the first blocking layer 132 and the second isolation layer 118. The second extended blocking layer 134*b* may block light that is incident to the semiconductor layer 110 via a gap between first blocking layer 132 and the first isolation layer 116*a*.

FIGS. 23 through 26 are sectional view diagrams showing main elements of image sensors according to other example embodiments. In detail, descriptions identical to those given above with reference to FIGS. 11 through 14 may be omitted below.

Referring to FIGS. 23 through 26, each of image sensors 100*t*, 100*u*, 100*v*, and 100*w* may include the insulation layer 130, and the first blocking layer 132, the drain contact plug 134, the first extended blocking layer 134*a*, and the second extended blocking layer 134*b* that are arranged in the insulation layer 130. The first extended blocking layer 134*a* may extend from the first blocking layer 132, penetrate through a portion of the insulation layer 130, and contact the second isolation layer 118. The second extended blocking layer 134*b* may extend from the first blocking layer 132, penetrate through a portion of the insulation layer 130, and contact the first isolation layer 116*b*.

The first extended blocking layer 134*a* and the second extended blocking layer 134*b* may be formed together with the first blocking layer 132, and the first extended blocking layer 134*a* and the second extended blocking layer 134*b* may be formed of or include a same material as the first blocking layer 132. A portion of the first extended blocking layer 134*a* may extend into the second isolation layer 118. A portion of the second extended blocking layer 134*b* may extend into the first isolation layer 116*b*. The first extended blocking layer 134*a* and the second extended blocking layer 134*b* may be simultaneously or contemporaneously formed with the drain contact plug 134. The first extended blocking layer 134*a* may block light that is incident to the semiconductor layer 110 via a gap between the first blocking layer 132 and the second isolation layer 118. The second extended blocking layer 134*b* may block light that is incident to the semiconductor layer 110 via a gap between first blocking layer 132 and the first isolation layer 116*b*.

Figure 27:
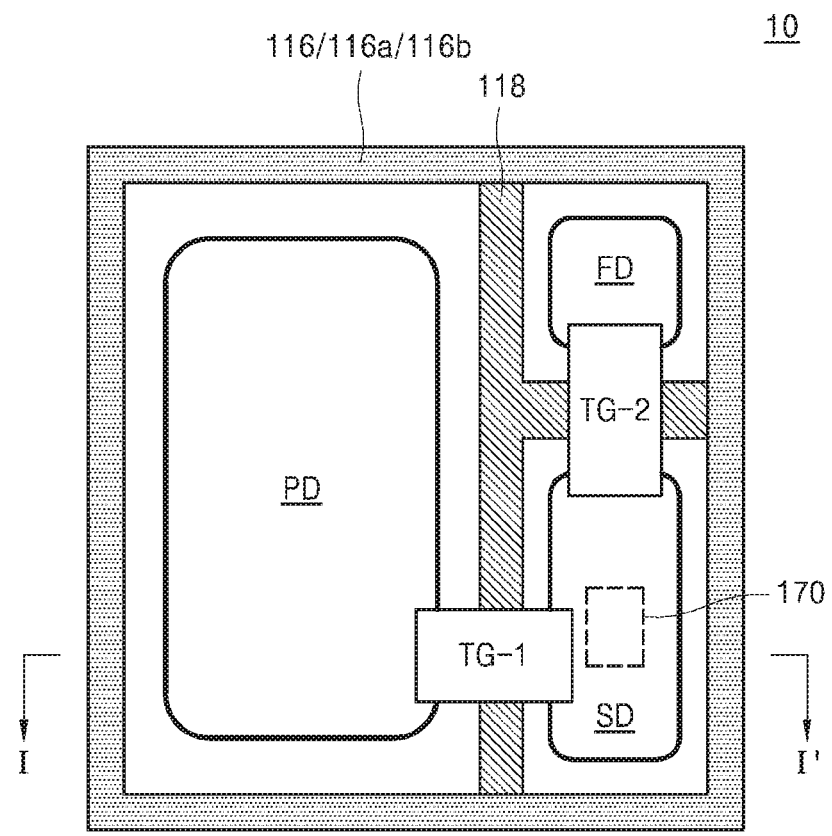
FIG. 27 is a plan view diagram showing main elements of image sensors according to example embodiments.

FIG. 27 is a plan view diagram showing main elements of image sensors according to example embodiments. In detail, FIG. 27 is a plan view diagram showing main elements of image sensors 100, 100*b*, 100*d*, 100*f*, 100*h*, 100*j*, 100*l*, 100*n*, 100*p*, 100*r*, 100*t*, and 100*v* shown in FIGS. 3, 5, 7, 9, 11, 13, 15, 17, 19, 21, 23, and 25, respectively, where descriptions identical to those given above with reference to FIGS. 3, 5, 7, 9, 11, 13, 15, 17, 19, 21, 23, and 25 may be omitted below.

Referring to FIG. 27, movement of charges between the photosensitive device PD and the charge storage device SD may be controlled by a first gate TG-1 of a first transmission transistor (11 of FIG. 1). The floating diffusion region FD, which charges stored in the charge storage device SD are transmitted thereto and stored therein, may be formed in a semiconductor layer (110 of FIGS. 3, 5, 7, 9, 11, 13, 15, 17, 19, 21, 23, and 25) in a shape similar to or the same as the shape of the charge storage device SD. Since the shape of the section of the charge storage device SD shown in FIG. 27, which is cut along locations corresponding to the floating diffusion region FD, is similar to or the same as the shapes shown in FIGS. 3, 5, 7, 9, 11, 13, 15, 17, 19, 21, 23, and 25, detailed descriptions thereof will be omitted.

A voltage based on charges received by the floating diffusion region FD may be amplified by transistors (13 and 14 of FIG. 1) formed in a transistor layer (120 of FIGS. 3, 5, 7, 9, 11, 13, 15, 17, 19, 21, 23, and 25) and output to the outside of the unit pixel 10.

A second transmission transistor (12 of FIG. 1) may form a charge moving path between the charge storage device SD and the floating diffusion region FD, and a second gate TG-2 of the second transmission transistor 12 may be formed on the first surface 112 of the semiconductor layer 110 like the first gate TG-1 of the first transmission transistor 11. Since the shape of the section of the second gate TG-2 shown in FIG. 11, which is cut along locations corresponding to the floating diffusion region FD, is similar to or the same as the shape of the first gate TG-1 shown in FIGS. 3, 5, 7, 9, 11, 13, 15, 17, 19, 21, 23, and 25, detailed descriptions thereof will be omitted.

A first isolation layer 116, 116*a*, or 116*b* may be formed to surround the unit pixel 10. Although the first isolation layer 116 shown in FIGS. 3, 5, 15, and 17, the first isolation layer 116*a* shown in FIGS. 7, 9, 19, and 21, and the first isolation layer 116*b* shown in FIGS. 11, 13, 23, and 25 have different sectional shapes, the first isolation layer 116 shown in FIGS. 3, 5, 15, and 17, the first isolation layer 116*a* shown in FIGS. 7, 9, 19, and 21, and the first isolation layer 116*b* shown in FIGS. 11, 13, 23, and 25 have a same 2-dimensional configuration, and thus any of the first isolation layers 116, 116*a*, and 116*b* may be included in the structure shown in FIG. 27. The first isolation layer 116, 116*a*, or 116*b* may separate adjacent unit pixels 10 from one another.

Figure 11:
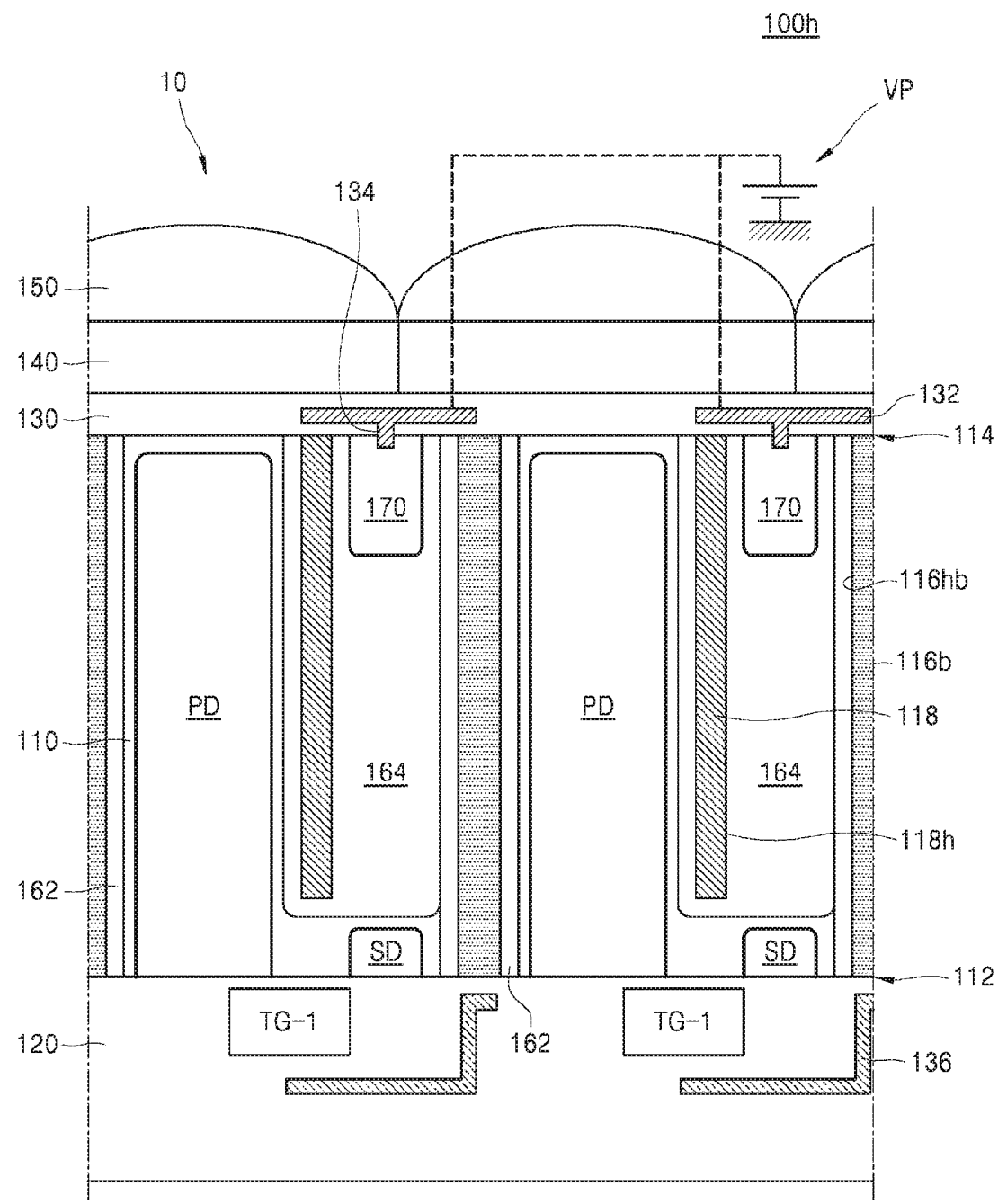
FIG. 11 is a sectional view diagram showing main elements of an image sensor according to another example embodiment.
Figure 12:
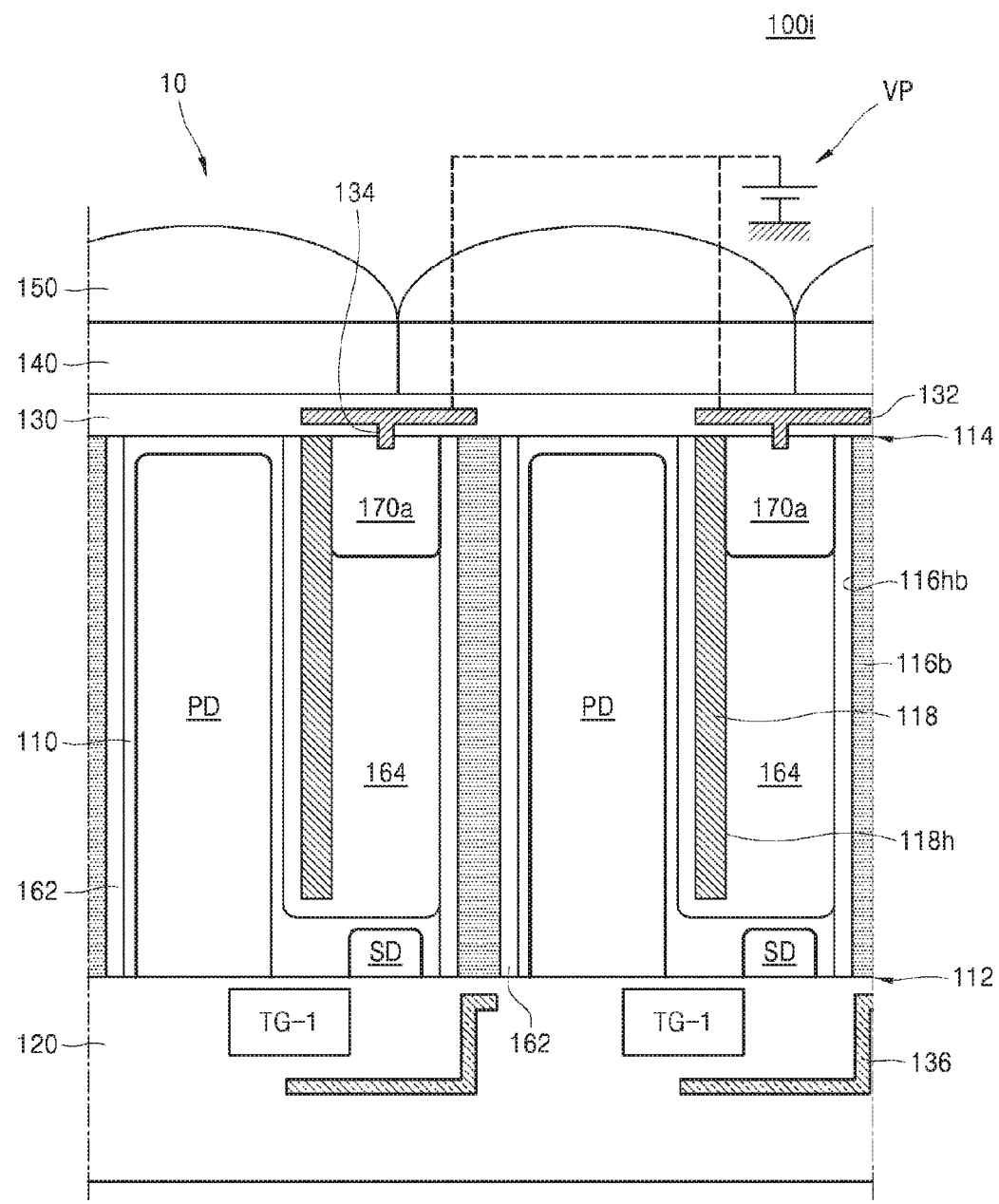
FIG. 12 is a sectional view diagram showing main elements of an image sensor according to another example embodiment.
Figure 13:
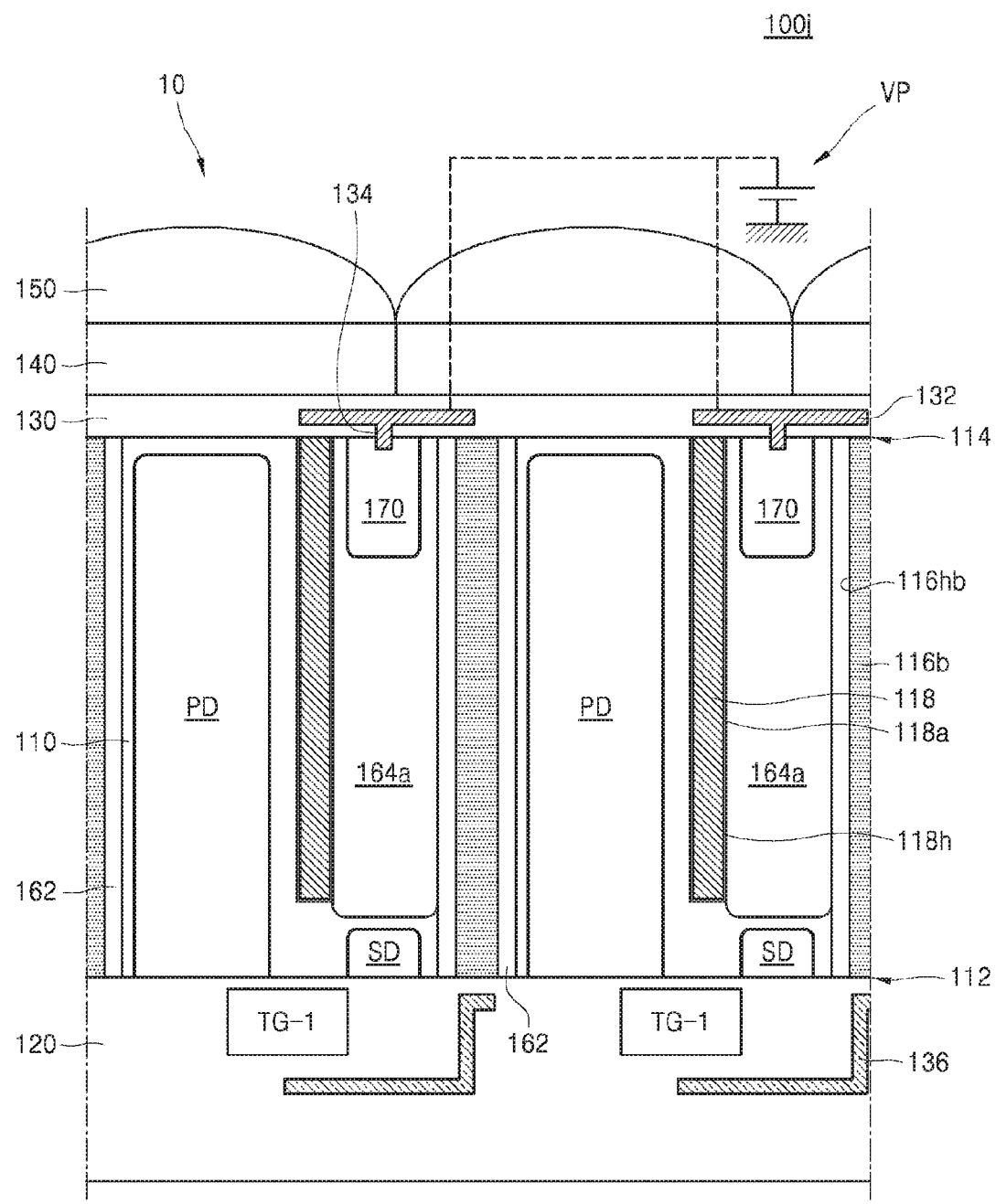
FIG. 13 is a sectional view diagram showing main elements of an image sensor according to another example embodiment.
Figure 14:
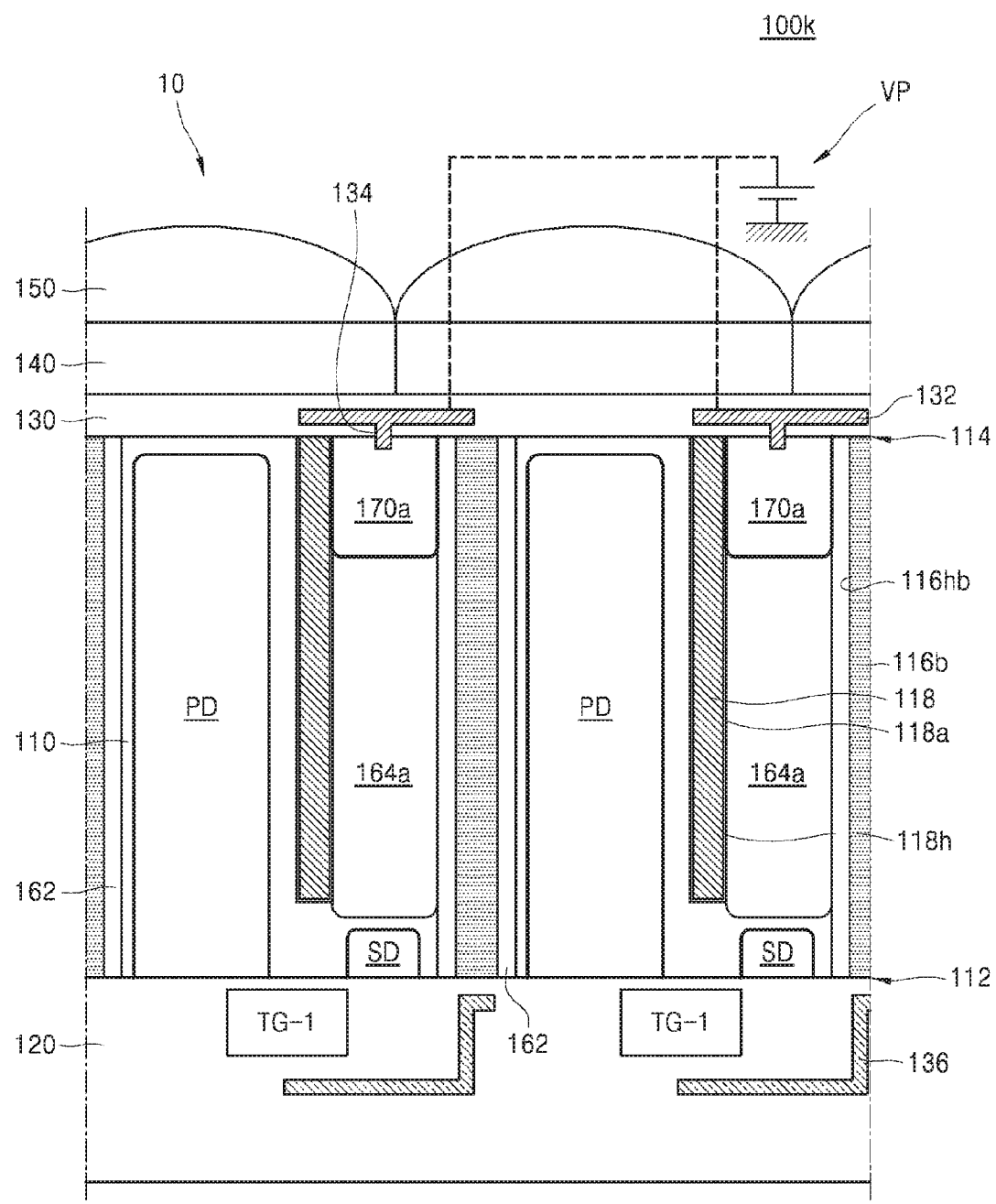
FIG. 14 is a sectional view diagram showing main elements of an image sensor according to another example embodiment.
Figure 15:
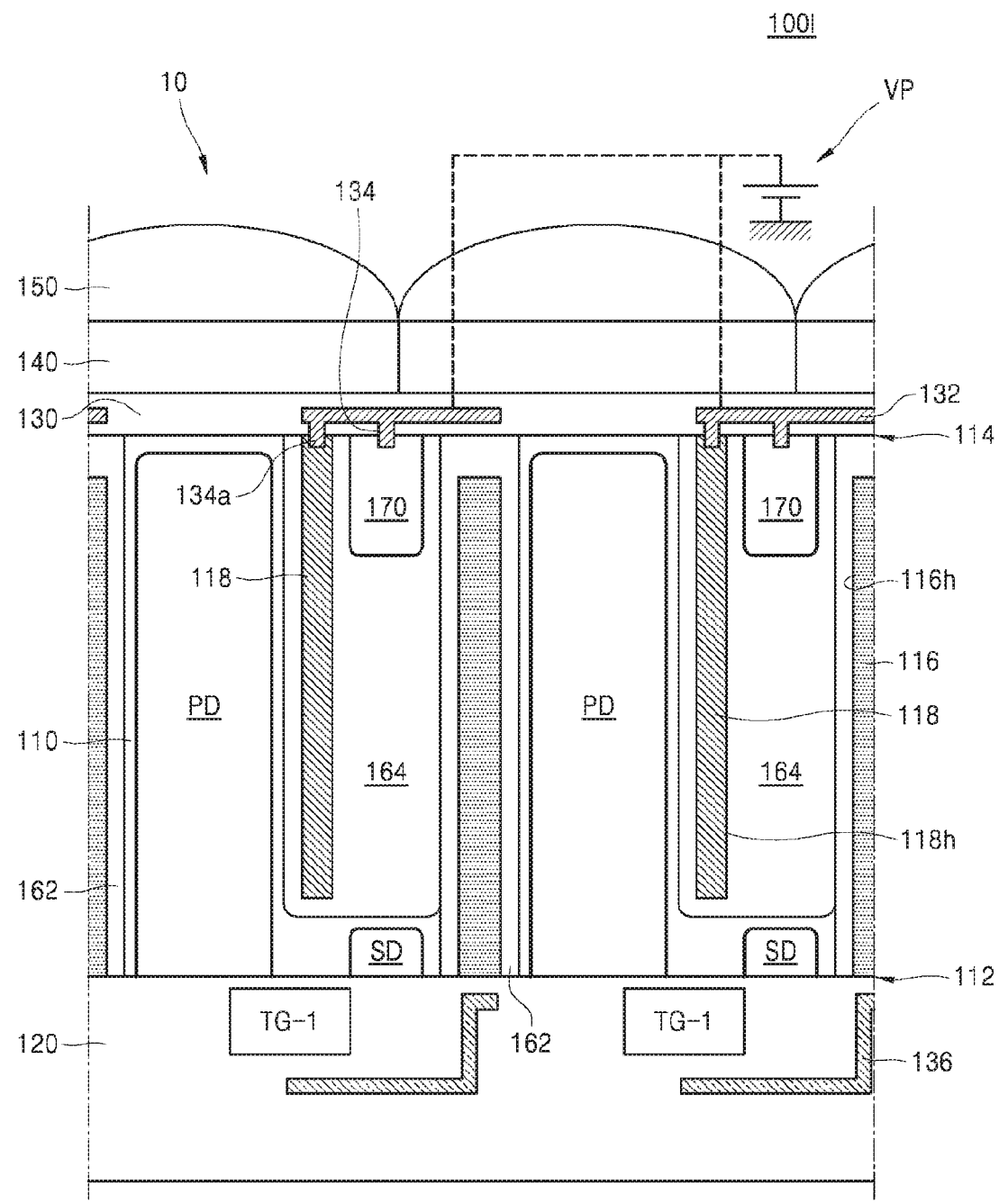
FIG. 15 is a sectional view diagram showing main elements of an image sensor according to another example embodiment.

The second isolation layer 118 may be formed between components constituting the unit pixel 10. Although FIG. 11 shows that the second isolation layer 118 is formed between the photosensitive device PD and the charge storage device SD, between the charge storage device SD and the floating diffusion region FD, and the photosensitive device PD and the floating diffusion region FD, the inventive concepts are not limited thereto. For example, the second isolation layer 118 may only be arranged between the photosensitive device PD and the charge storage device SD in the unit pixel 10. For another example, the second isolation layer 118 may be arranged between the photosensitive device PD and the charge storage device SD and between the charge storage device SD and the floating diffusion region FD. For another example, the second isolation layer 118 may be arranged between the photosensitive device PD and the charge storage device SD and between the photosensitive device PD and the floating diffusion region FD.

The first isolation layer 116, 116a, or 116b and the second isolation layer 118 may be separated from the photosensitive device PD.

The leakage photogenerated charge drain region 170 may be arranged on the charge storage device SD. The leakage photogenerated charge drain region 170 may be formed to be apart from the first and second isolation layers 116, 116a, or 116b and 118.

Figure 28:
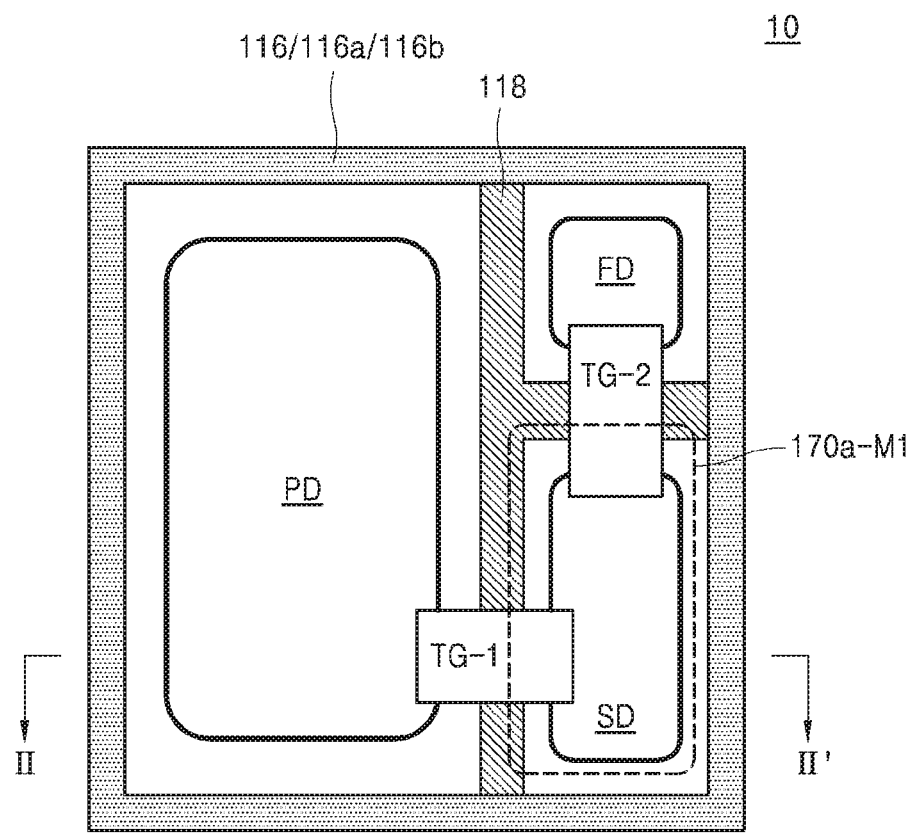
FIG. 28 is a plan view diagram showing main elements of image sensors according to example embodiments.

FIG. 28 is a plan view diagram showing main elements of image sensors according to example embodiments. In detail, FIG. 28 is a plan view diagram showing main elements of image sensors 100a, 100c, 100e, 100g, 100i, 100k, 100m, 100o, 100q, 100s, 100u, and 100w shown in FIGS. 4, 6, 8, 10, 12, 14, 16, 18, 20, 22, and 24, respectively, where descriptions identical to those given above with reference to FIGS. 4, 6, 8, 10, 12, 14, 16, 18, 20, 22, and 24 may be omitted below.

Referring to FIG. 28, movement of charges between the photosensitive device PD and the charge storage device SD may be controlled by a first gate TG-1 of a first transmission transistor (11 of FIG. 1). The floating diffusion region FD, which charges stored in the charge storage device SD are transmitted thereto and stored therein, may be formed in a semiconductor layer (110 of FIGS. 4, 6, 8, 10, 12, 14, 16, 18, 20, 22, and 24) in a shape similar to or the same as the shape of the charge storage device SD. Since the shape of the section of the charge storage device SD shown in FIG. 27, which is cut along locations corresponding to the floating diffusion region FD, is similar to or the same as the shapes shown in FIGS. 4, 6, 8, 10, 12, 14, 16, 18, 20, 22, and 24, detailed descriptions thereof will be omitted.

A voltage based on charges received by the floating diffusion region FD may be amplified by transistors (13 and 14 of FIG. 1) formed in a transistor layer (120 of FIGS. 4, 6, 8, 10, 12, 14, 16, 18, 20, 22, and 24) and output to the outside of the unit pixel 10.

A second transmission transistor (12 of FIG. 1) may form a charge moving path between the charge storage device SD and the floating diffusion region FD, and a second gate TG-2 of the second transmission transistor 12 may be formed on the first surface 112 of the semiconductor layer 110 like the first gate TG-1 of the first transmission transistor 11. Since the shape of the section of the second gate TG-2 shown in FIG. 11, which is cut along locations corresponding to the floating diffusion region FD, is similar to or the same as the shape of the first gate TG-1 shown in FIGS. 4, 6, 8, 10, 12, 14, 16, 18, 20, 22, and 24, detailed descriptions thereof will be omitted.

A first isolation layer 116, 116a, or 116b may be formed to surround the unit pixel 10. Although the first isolation layer 116 shown in FIGS. 4, 6, 16, and 18, the first isolation layer 116a shown in FIGS. 8, 10, 20, and 22, and the first isolation layer 116b shown in FIGS. 12, 14, 24, and 26 have different sectional shapes, the first isolation layer 116 shown in FIGS. 4, 6, 16, and 18, the first isolation layer 116a shown in FIGS. 8, 10, 20, and 22, and the first isolation layer 116b shown in FIGS. 12, 14, 24, and 26 have a same 2-dimensional configuration, and thus any of the first isolation layers 116, 116a, and 116b may be included in the structure shown in FIG. 28. The first isolation layer 116, 116a, or 116b may separate adjacent unit pixels 10 from one another.

The second isolation layer 118 may be formed between components constituting the unit pixel 10. Although FIG. 11 shows that the second isolation layer 118 is formed between the photosensitive device PD and the charge storage device SD, between the charge storage device SD and the floating diffusion region FD, and the photosensitive device PD and the floating diffusion region FD, the inventive concepts are not limited thereto. For example, the second isolation layer 118 may only be arranged between the photosensitive device PD and the charge storage device SD in the unit pixel 10. For another example, the second isolation layer 118 may be arranged between the photosensitive device PD and the charge storage device SD and between the charge storage device SD and the floating diffusion region FD. For another example, the second isolation layer 118 may be arranged between the photosensitive device PD and the charge storage device SD and between the photosensitive device PD and the floating diffusion region FD.

The first isolation layer 116, 116a, or 116b and the second isolation layer 118 may be separated from the photosensitive device PD.

A leakage photogenerated charge drain region (170a of FIGS. 4, 6, 8, 10, 12, 14, 16, 18, 20, 22, and 24) may be formed by forming a drain mask pattern exposing a region 170a-M1 of a second surface (114 of FIGS. 4, 6, 8, 10, 12, 14, 16, 18, 20, 22, and 24) of a portion of a semiconductor layer (110 of FIGS. 4, 6, 8, 10, 12, 14, 16, 18, 20, 22, and 24) on the charge storage device SD and implanting impurities thereto. Therefore, the leakage photogenerated charge drain region 170a may contact the second isolation layer 118. The leakage photogenerated charge drain region 170a may be apart from the first isolation layer 116. From among the impurities implanted to the region 170a-M1 of the semiconductor layer 110, an impurity implanted to a portion corresponding to the second isolation layer 118 is removed with the semiconductor layer 110 during formation of the second isolation layer 118, and thus the impurity may not be included in the leakage photogenerated charge drain region 170a. Alternatively, if an impurity is implanted to the region 170a-M1 of the semiconductor layer 110 after the second isolation layer 118 is formed and the second isolation layer 118 is an insulation layer, an impurity implanted to the second isolation layer 118 does not have an electric function, and thus a portion of the second isolation layer 118 doped with the impurity may not be included in the leakage photogenerated charge drain region 170a.

FIG. 29 is a plan view diagram showing main elements of a unit pixel included in an image sensor, according to example embodiments. In detail, FIG. 29 is a plan view diagram showing main elements of the unit pixel 10 included in image sensors 100a, 100c, 100e, 100g, 100i, 100k, 100m, 100o, 100q, 100s, 100u, and 100w shown in FIGS. 4, 6, 8, 10, 12, 14, 16, 18, 20, 22, and 24, respectively, where descriptions identical to those given above with reference to FIGS. 4, 6, 8, 10, 12, 14, 16, 18, 20, 22, and 24 may be omitted below. Furthermore, descriptions identical to those given above with reference to FIG. 28 may be omitted.

Referring to FIG. 29, a leakage photogenerated charge drain region (170a of FIGS. 4, 6, 8, 10, 12, 14, 16, 18, 20, 22, and 24) may be formed by forming a drain mask pattern exposing a portion 170a-M2 of a second surface (114 of FIGS. 4, 6, 8, 10, 12, 14, 16, 18, 20, 22, and 24) of portions of a semiconductor layer (110 of FIGS. 4, 6, 8, 10, 12, 14, 16, 18, 20, 22, and 24) on the charge storage device SD and the floating diffusion region FD and implanting impurities thereto. Therefore, the leakage photogenerated charge drain region 170a may be arranged on both the charge storage device SD and the floating diffusion region FD.

FIGS. 30 through 34 are sectional view diagrams showing operations for fabricating an image sensor according to an example embodiment. In detail, FIGS. 30 through 34 are sectional view diagrams showing operations for fabricating the image sensor 100 shown in FIG. 3. Operations for fabricating the image sensors 100a, 100b, 100c, 100d, 100e, 100f, 100g, 100h, 100i, 100j, 100k, 100l, 100m, 100n, 100o, 100p, 100q, 100r, 100s, 100t, 100u, 100v, and 100w shown in FIGS. 4 through 26 may be described with respect to differences from the operations for fabricating the image sensor 100 with reference to FIGS. 30 through 34.

Figure 30:
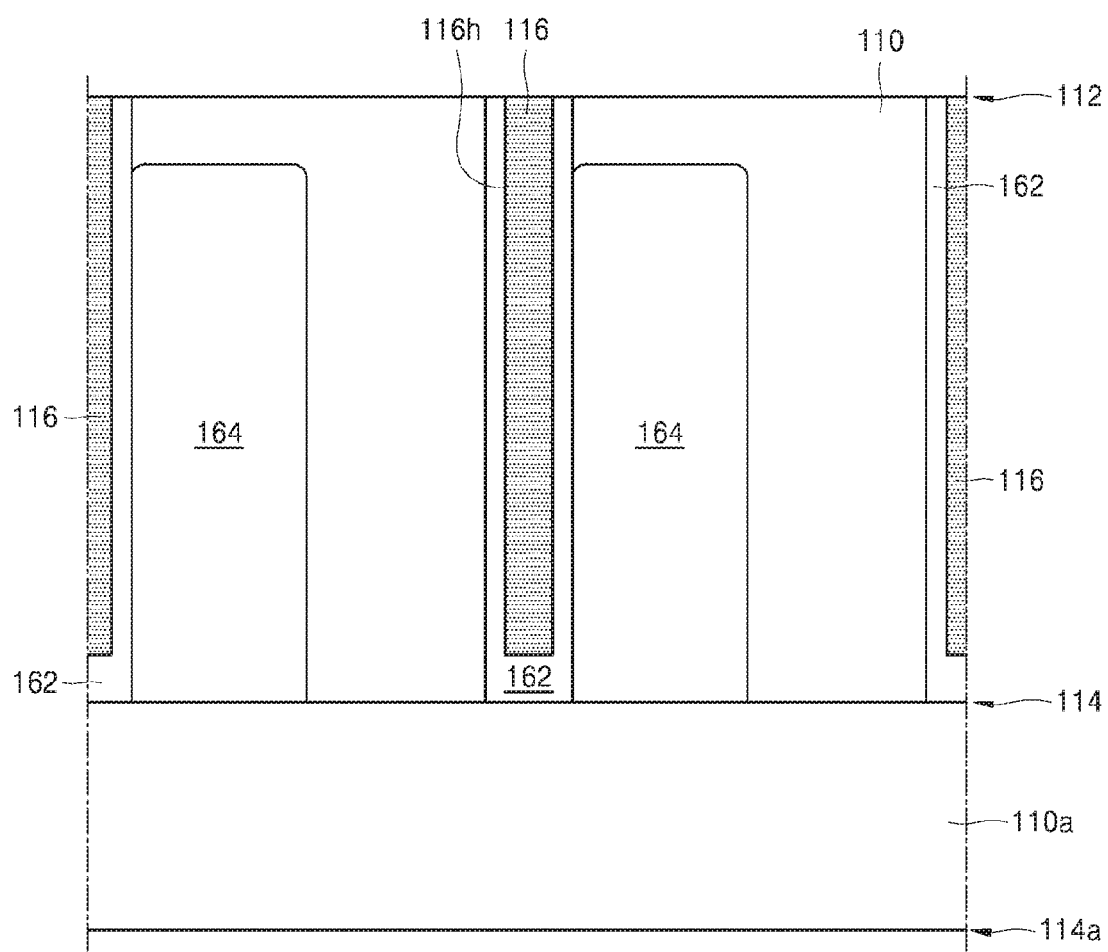
FIGS. 30 through 34 are sectional view diagrams showing operations for fabricating an image sensor according to an example embodiment.

Referring to FIG. 30, the semiconductor layer 110 is prepared on a supporting substrate 110a. A surface of the semiconductor layer 110 contacted by the supporting substrate 110a is referred to as the first surface 112 of the semiconductor layer 110, whereas a surface of the semiconductor layer 110 opposite to the first surface 112 is referred to as the second surface 114. The supporting substrate 110a and the semiconductor layer 110 may be bulk substrates, epitaxial substrates, or SOI substrates that are integrated with each other. In this case, the supporting substrate 110a may be a portion to be removed from an integrated substrate in a operation performed after. Alternatively, the supporting substrate 110a may be a bulk substrate, and the semiconductor layer 110 may be an epitaxial layer formed on the supporting substrate 110a. The semiconductor layer 110 may be formed of or include a p-type semiconductor.

The first isolation trench 116h, the first isolation layer 116, the interface covering region 162, and the well region 164 are formed in the semiconductor layer 110. The first isolation trench 116h may be formed to extend into the semiconductor layer 110 from the first surface 112 toward the second surface 114. The first isolation layer 116 may extend from the first surface 112 and may not contact the second surface 114.

The interface covering region 162 may be formed by forming the first isolation trench 116h and implanting an impurity thereto via plasma doping (PLAD). The interface covering region 162 may be an impurity region exhibiting higher impurity concentration than the semiconductor layer 110. The interface covering region 162 may be a p-type impurity region, for example. The first isolation layer 116 may be formed by substantially filling the first isolation trench 116h.

The well region 164 may be formed after the first isolation layer 116 is formed or before the first isolation trench 116h is formed. The well region 164 may be formed, for example, via ion implantation. The well region 164 may be an impurity region exhibiting higher impurity concentration than the semiconductor layer 110. The well region 164 may be a p-type impurity region, for example.

In case of fabricating the image sensors 100d, 100e, 100f, 100g, 100p, 100q, 100r, 100s shown in FIGS. 7 through 10 and 19 through 22, the first isolation trench 116h, the first isolation layer 116, and the interface covering region 162 may not be formed.

In case of fabricating the image sensors 100h, 100i, 100j, 100k, 100t, 100u, 100v, and 100w shown in FIGS. 11 through 14 and 23 through 26, a first isolation trench (116hb of FIGS. 11 through 14 and 23 through 26) and a first isolation layer (116b of FIGS. 11 through 14 and 23 through 26) may be formed instead of the first isolation trench 116h and the first isolation layer 116.

In case of fabricating the image sensors 100b, 100c, 100f, 100g, 100i, 100j, 100n, 100o, 100r, 100s, 100v, and 100w shown in FIGS. 5, 6, 9, 10, 13, 14, 17, 19, 21, 22, 25, and 26, a well region (164a of FIGS. 5, 6, 9, 10, 13, 14, 17, 19, 21, 22, 25, and 26) having a relatively small width compared to the well region 164 shown in FIG. 30 may be formed instead of the well region 164.

Figure 31:
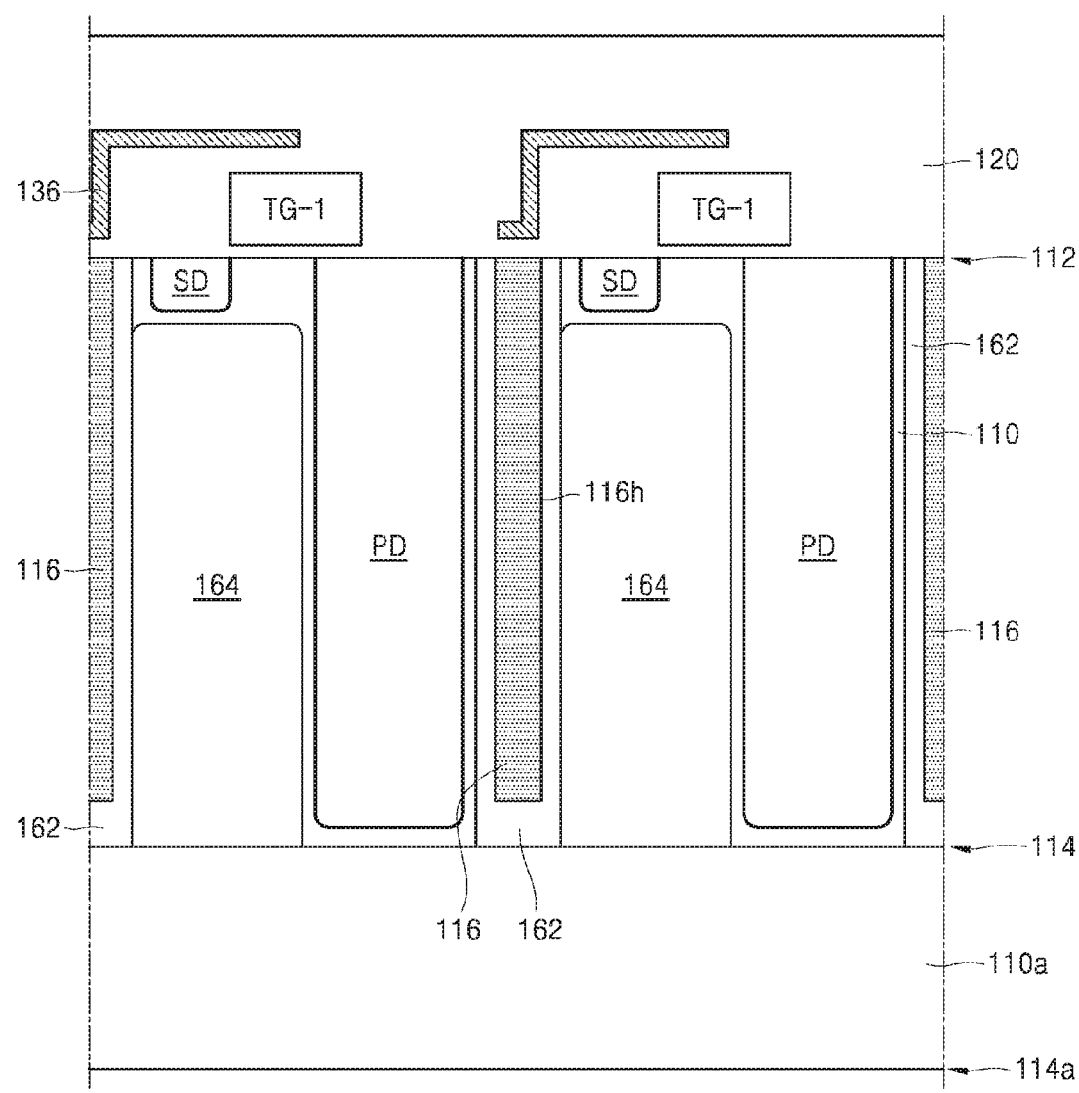

Referring to FIG. 31, the photosensitive device PD and the charge storage device SD are formed in the semiconductor layer 110. The photosensitive device PD and the charge storage device SD may be formed in the semiconductor layer 110 near the first surface 112 of the semiconductor layer 110. The photosensitive device PD and the charge storage device SD may be formed via, for example, ion implantation. The photosensitive device PD and the charge storage device SD may be n-type impurity regions, for example.

The transistor layer 120 is formed on the first surface 112 of the semiconductor layer 110. The transistor layer 120 and the semiconductor layer 110 may constitute a transistor. The first gate TG-1 for constituting the first transmission transistor 11 as shown in FIG. 1 may be formed in the transistor layer 120. In the same regard, a second gate (not shown) of the second transmission transistor 12 shown in FIG. 1 may also be formed in the transistor layer 120. Gate insulation layers (not shown) may be arranged between the first surface 112 of the semiconductor layer 110, the first gate TG-1, and the second gate. Source/drain regions (not shown) for constituting the first and second transmission transistors 11 and 12 may be formed on the first surface 112 of the semiconductor layer 110. A wiring layer (not shown) including a plurality of wirings formed of or include a conductive material may be further formed in the transistor layer 120. The transistor layer 120 may include gates constituting the first and second transmission transistors 11 and 12 and an insulation material surrounding the wiring layer.

The second blocking layer 136 may be formed in the transistor layer 120. The second blocking layer 136 may be formed in a portion of the transistor layer 120 on the charge storage device SD. The second blocking layer 136 may be formed to extend from the first isolation layer 116 to the charge storage device SD. The second blocking layer 136 may be formed to overlap the charge storage device SD and not to overlap the photosensitive device PD in a direction perpendicular to the first surface 112 of the semiconductor layer 110. The charge storage device SD may overlap substantially the entire second blocking layer 136 in a vertical direction. The second blocking layer 136 may overlap a portion of the first isolation layer 116 in a vertical direction. Furthermore, the second blocking layer 136 may overlap a portion of the second isolation layer 118 in a vertical direction as described below with reference to FIG. 32.

Figure 32:
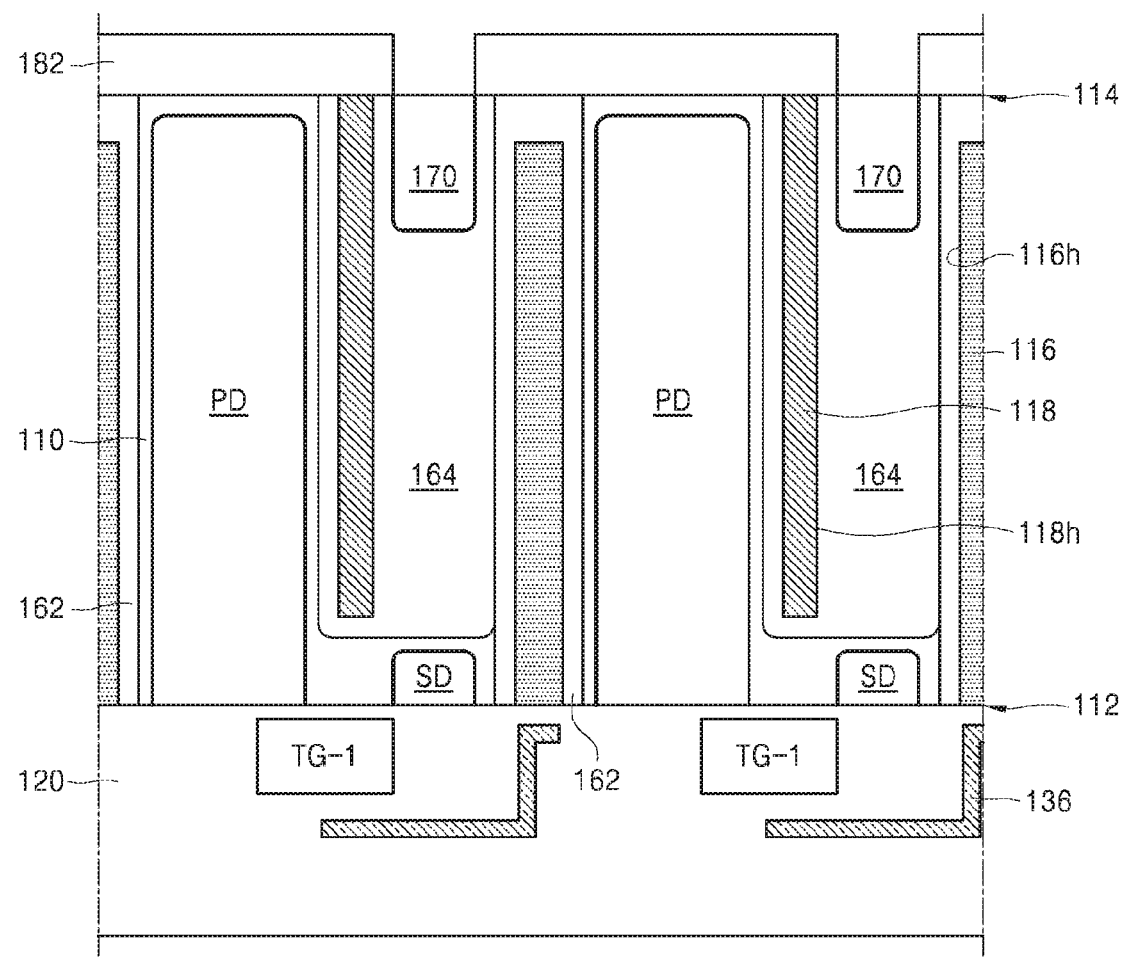

Referring to FIGS. 31 and 32, the structure of FIG. 31 in which the transistor layer 120 is formed on the supporting substrate 110a and the semiconductor layer 110 is turned upside down, a surface of the transistor layer 120 is supported by an auxiliary supporting substrate (not shown), and the supporting substrate 110a is removed. For example, the supporting substrate 110a may be removed via, for example, a CMP operation. Alternatively, the supporting substrate 110a may be partially removed by using a grinder, and the remaining supporting substrate 110a may be removed via, for example, an etching operation. After the supporting substrate 110a is removed and the second surface 114 of the semiconductor layer 110 is exposed, the second isolation trench 118h is formed in portions of the semiconductor layer 110 between the photosensitive device PD and the charge storage device SD. The second isolation trench 118h may be formed to extend into the semiconductor layer 110 from the second surface 114 of the semiconductor layer 110 and not to contact the first surface 112. The second isolation layer 118 may be formed by substantially filling the second isolation trench 118h.

Next, after a mask layer 182 covering a portion of the second surface 114 of the semiconductor layer 110 is formed, the leakage photogenerated charge drain region 170 may be formed via, for example, an ion implantation operation. The leakage photogenerated charge drain region 170 may be arranged on the charge storage device SD in the semiconductor layer 110 and apart from the charge storage device SD. The well region 164 may be arranged between the leakage photogenerated charge drain region 170 and the charge storage device SD. The well region 164 may surround the leakage photogenerated charge drain region 170 in the semiconductor layer 110. The leakage photogenerated charge drain region 170 may be a n-type impurity region, for example.

In case of fabricating the image sensors 100d, 100e, 100f, 100g, 100p, 100q, 100r, and 100s shown in FIGS. 7 through 10 and 19 through 22, the first isolation trench 116ha may be formed together with the second isolation trench 118h, and the first isolation layer 116 may be formed together with the first isolation layer 116a. Furthermore, the interface covering region 162 may be formed by forming the first isolation trench 116ha and implanting an impurity thereto via, for example, PLAD. Next, the first isolation layer 116a may be formed by substantially filling the first isolation trench 116ha.

In case of fabricating the image sensors 100b, 100c, 100f, 100g, 100i, 100j, 100n, 100o, 100r, 100s, 100v, and 100w shown in FIGS. 5, 6, 9, 10, 13, 14, 17, 19, 21, 22, 25, and 26, the second isolation layer 118 may be formed by conformally covering inner walls of the second isolation trench 118h with the interface insulation layer 118a and substantially filling the second isolation trench 118h having formed therein the interface insulation layer 118a.

In case of fabricating the image sensors 100a, 100c, 100e, 100g, 100i, 100k, 100m, 100o, 100r, 100t, 100v, and 100w shown in FIGS. 4, 6, 8, 10, 12, 14, 16, 18, 20, 22, 24, and 26, the leakage photogenerated charge drain region 170a may be formed by forming a mask layer exposing portions 170a-M1 and 170a-M2 of the second surface 114 of the semiconductor layer 110, as shown in FIGS. 28 and 29, and implanting impurity ions thereto.

Figure 33:
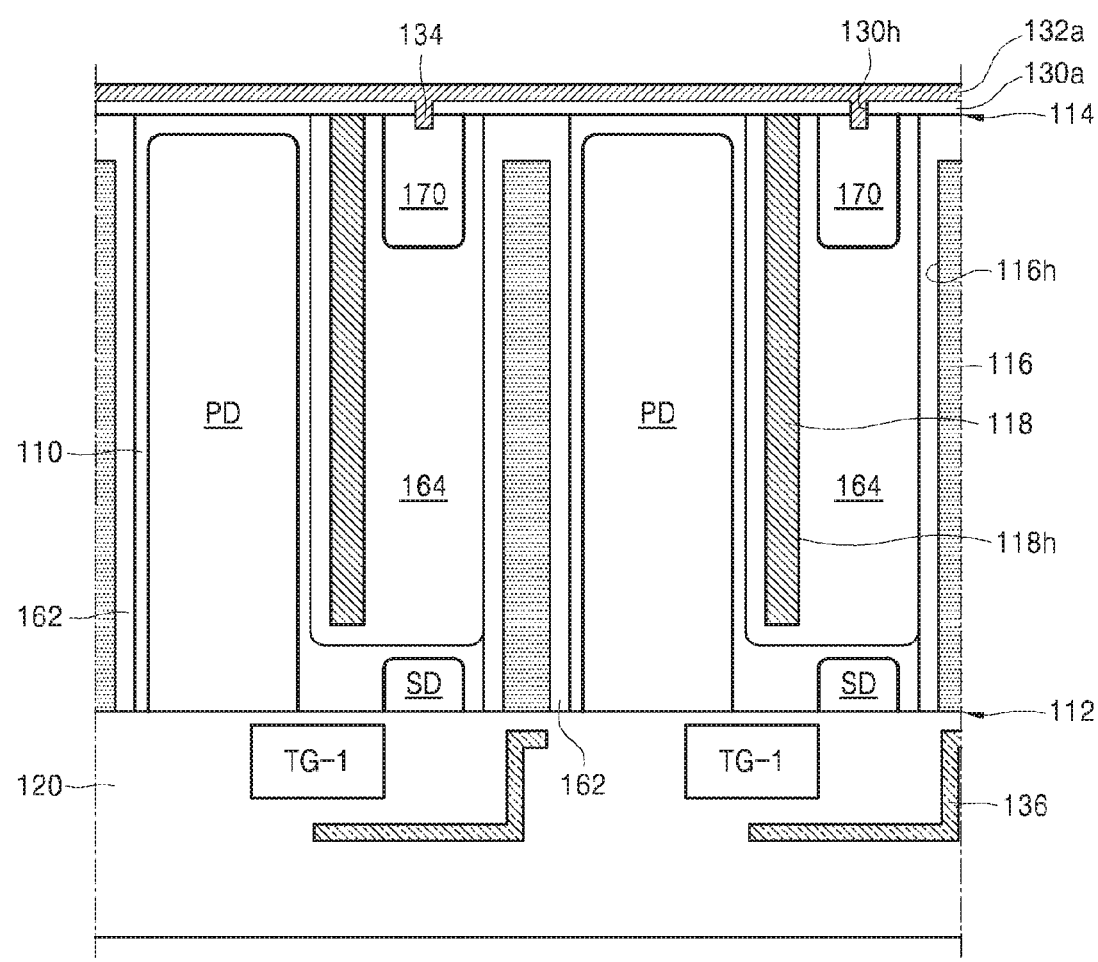

Referring to FIG. 33, the interlayer insulation layer 130a including contact holes 130h is formed on the second surface 114 of the semiconductor layer 110. The contact holes 130h may expose the leakage photogenerated charge drain region 170. The contact holes 130h may penetrate through the interlayer insulation layer 130a and extend into the leakage photogenerated charge drain region 170. Next, a blocking material layer 132a covering the second surface 114 of the semiconductor layer 110 is formed. The blocking material layer 132a may be formed to substantially fill the contact holes 130h. The blocking material layer 132a may contain a material that does not transmit light therethrough. For example, the blocking material layer 132a may contain a metal.

In case of fabricating the image sensors 100l, 100m, 100n, and 100o shown in FIGS. 15 through 18, the contact holes 130h and a recessed space (not shown) may be formed in a space for forming a first extended blocking layer (134a of FIGS. 15 through 18), and the blocking material layer 132a may be formed to substantially fill the recessed space, too. A portion of the blocking material layer 132a substantially filling the recessed space may become the first extended blocking layer 134a.

In case of fabricating the image sensors 100p, 100q, 100r, 100s, 100t, 100u, 100v, and 100w shown in FIGS. 19 through 26, the contact holes 130h and a recessed space (not shown) may be formed in spaces for forming a first extended blocking layer (134a of FIGS. 19 through 26) and a second extended blocking layer (134b of FIGS. 19 through 26), and the blocking material layer 132a may be formed to substantially fill the recessed spaces, too. Portions of the blocking material layer 132a substantially filling the recessed spaces may become the first extended blocking layer 134a and the second extended blocking layer 134b.

Figure 34:
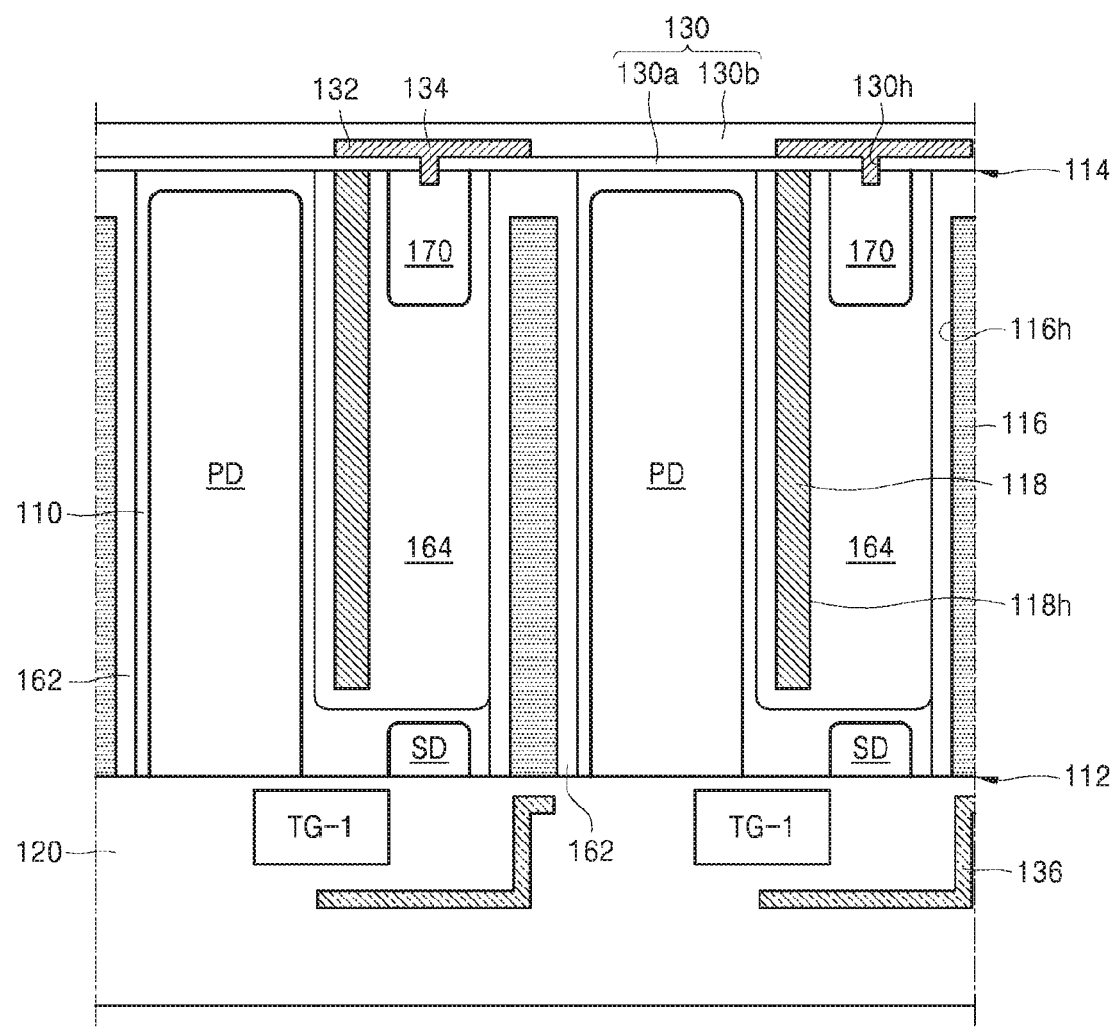

Referring to FIGS. 33 and 34, the first blocking layer 132 is formed by patterning the blocking material layer 132a. A portion of the blocking material layer 132a substantially filling the contact holes 130h may become the drain contact plug 134. Therefore, the first blocking layer 132 and the drain contact plug 134 may be integrated with each other. If the blocking material layer 132a is formed of or include a metal, the first blocking layer 132 and the drain contact plug 134 may be formed of or include a metal.

A portion of the blocking material layer 132a may extend from the first blocking layer 132 and may be electrically connected to an external pad (not shown) that may be connected to the positive bias VP as shown in FIG. 3. Alternatively, a separate conductive line for electrically connecting the first blocking layer 132 to the external pad may be formed.

Next, a cover insulation layer 130b covering the first blocking layer 132 is formed. The interlayer insulation layer 130a and the cover insulation layer 130b may be referred to as the insulation layer 130 together.

Next, as shown in FIG. 3, the color filter layer 140 and the lens layer 150 may be formed, thereby fabricating the image sensor 100. The external pad may be continuously connected to the positive bias VP while the image sensor 100 is operating.

Figure 35:
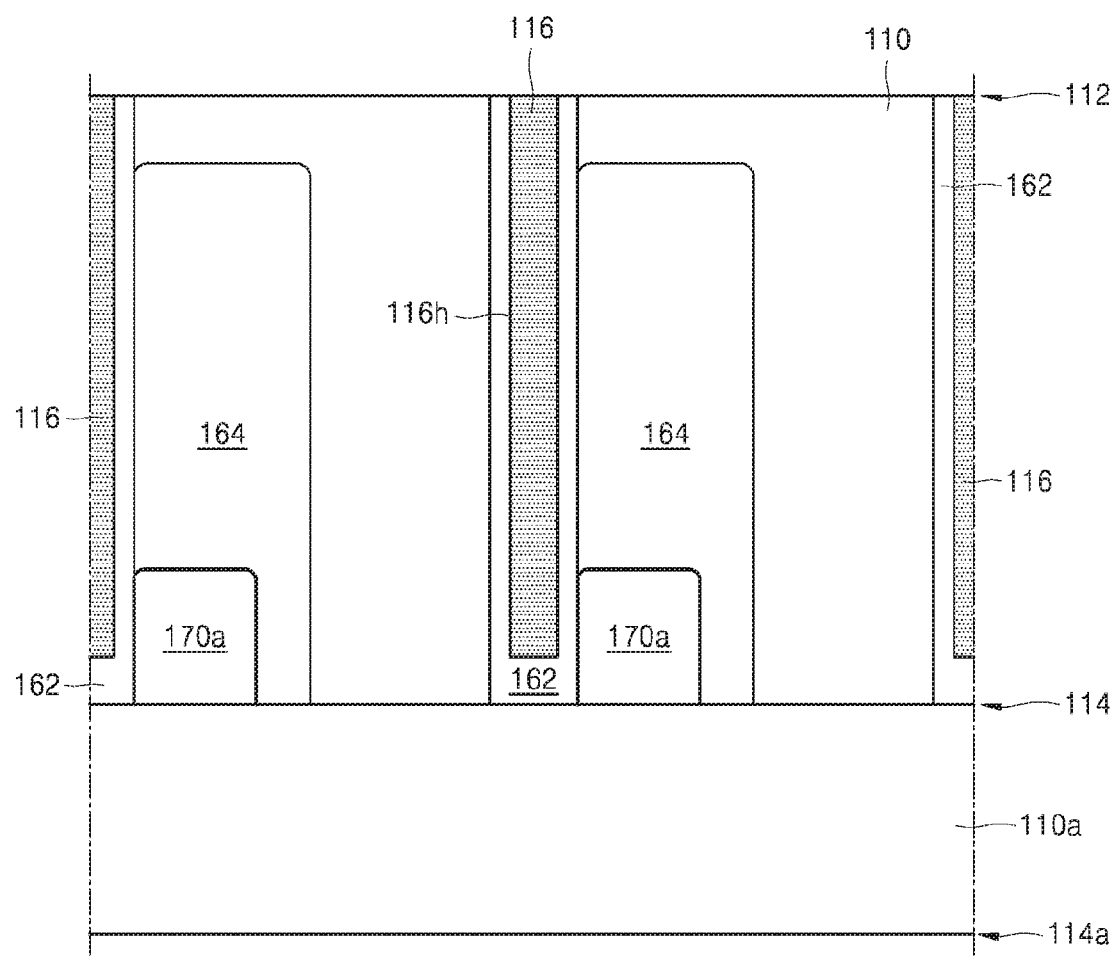
FIGS. 35 and 36 are sectional view diagrams showing operations for fabricating an image sensor according to another example embodiment.
Figure 36:
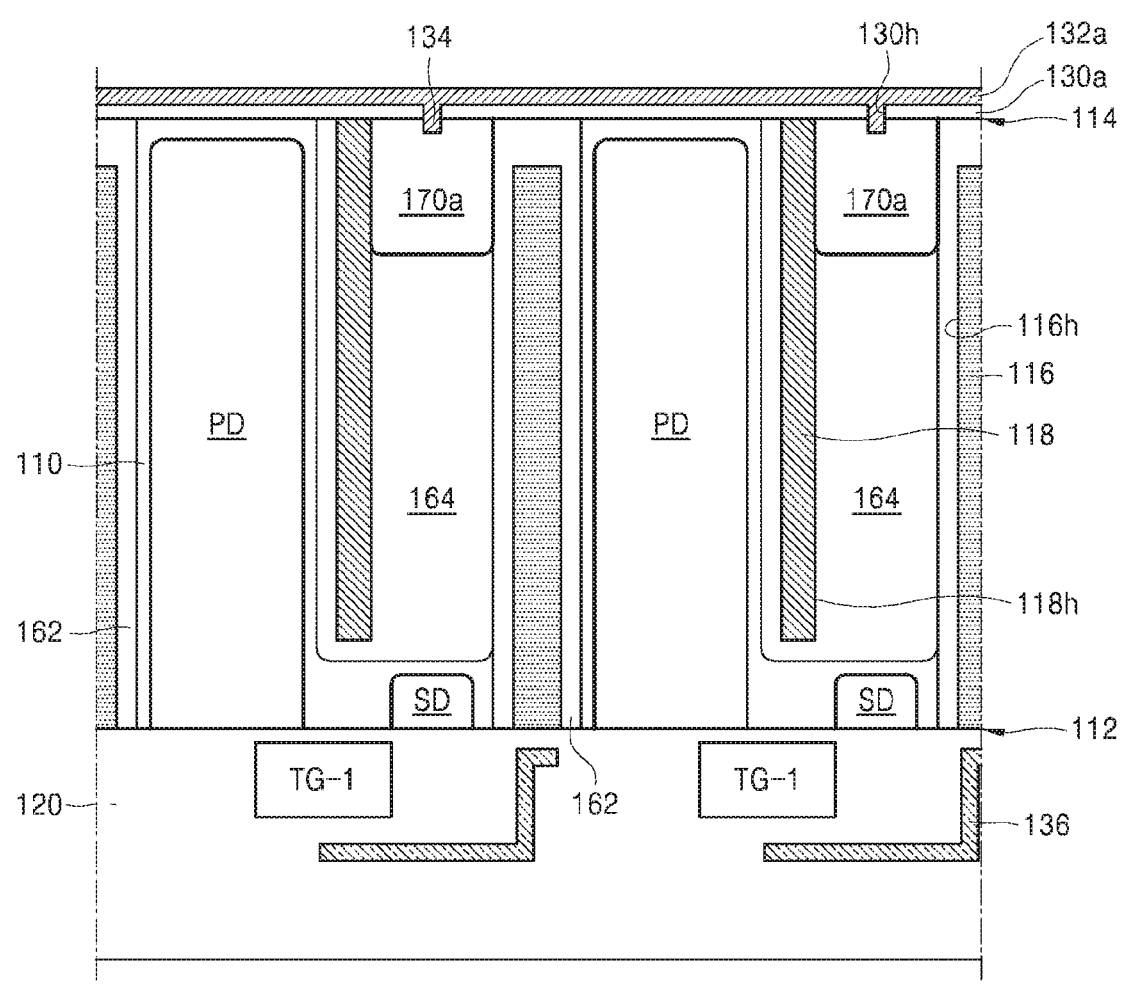

FIGS. 35 and 36 are sectional view diagrams showing operations for fabricating an image sensor according to an example embodiment. In detail, FIGS. 35 and 36 are sectional view diagrams showing operations for fabricating the image sensor 100 shown in FIG. 4. Operations for fabricating the image sensors 100c, 100e, 100g, 100i, 100k, 100m, 100o, 100q, 100s, 100u, 100w shown in FIGS. 6, 8, 10, 12, 14, 16, 18, 20, 22, 24, and 26 may be described with respect to differences from the operations for fabricating the image sensor 100 with reference to FIGS. 35 and 36. Descriptions identical to those given above with reference to FIGS. 30 through 34 may be omitted below.

Referring to FIG. 35, the semiconductor layer 110 is prepared on the supporting substrate 110a. The semiconductor layer 110 may be formed of or include a p-type semiconductor, for example.

The first isolation trench 116h, the first isolation layer 116, the interface covering region 162, the well region 164, and the leakage photogenerated charge drain region 170a are formed in the semiconductor layer 110. The well region 164 and the leakage photogenerated charge drain region 170a may be formed after the first isolation layer 116 is formed or before the first isolation trench 116h is formed. The well region 164 and the leakage photogenerated charge drain region 170a may be formed via, for example, ion implantation. One of the well region 164 and the leakage photogenerated charge drain region 170a may be formed first via, for example, ion implantation, and then the other region may be formed by additionally performing ion implantation for implanting an impurity region with an opposite conduction type. The well region 164 may be a p-type impurity region, for example. The leakage photogenerated charge drain region 170a may be a n-type impurity region, for example.

In case of fabricating the image sensors 100e, 100g, 100q, and 100s shown in FIGS. 8, 10, 20, and 22, the first isolation trench 116h, the first isolation layer 116, and the interface covering region 162 may not be formed.

In case of fabricating the image sensors 100c, 100g, 100j, 100o, 100s, and 100w shown in FIGS. 6, 10, 14, 18, 22, and 26, a well region (164a of FIGS. 6, 10, 14, 18, 22, and 26) having a relatively small width compared to the well region 164 shown in FIG. 35 may be formed instead of the well region 164.

Next, as described above with reference to FIG. 31, the photosensitive device PD, the charge storage device SD, the transistor layer 120, the first gate TG-1, and the second blocking layer 136 are formed. Furthermore, as described above with reference to FIG. 16, the second isolation trench 118h and the second isolation layer 118 are formed.

In case of fabricating the image sensors 100e, 100g, 100q, 100s shown in FIGS. 8, 10, 20, and 22, the first isolation trench 116ha may be formed together with the second isolation trench 118h, and the first isolation layer 116a may be formed together with the second isolation layer 118. Furthermore, the interface covering region 162 may be formed by forming the first isolation trench 116ha and implanting an impurity thereto via, for example, PLAD. Next, the first isolation layer 116a may be formed by substantially filling the first isolation trench 116ha.

In case of fabricating the image sensors 100c, 100g, 100j, 100o, 100s, and 100w shown in FIGS. 6, 10, 14, 18, 22, and 26, the second isolation layer 118 may be formed by conformally covering inner walls of the second isolation trench 118h with the interface insulation layer 118a and substantially filling the second isolation trench 118h having formed therein the interface insulation layer 118a.

Referring to FIG. 36, the interlayer insulation layer 130a including contact holes 130h is formed on the second surface 114 of the semiconductor layer 110. The contact holes 130h may expose the leakage photogenerated charge drain region 170a. The contact holes 130h may penetrate through the interlayer insulation layer 130a and extend into the leakage photogenerated charge drain region 170a. Next, the blocking material layer 132a covering the second surface 114 of the semiconductor layer 110 is formed. The blocking material layer 132a may be formed to substantially fill the contact holes 130h.

Figure 16:
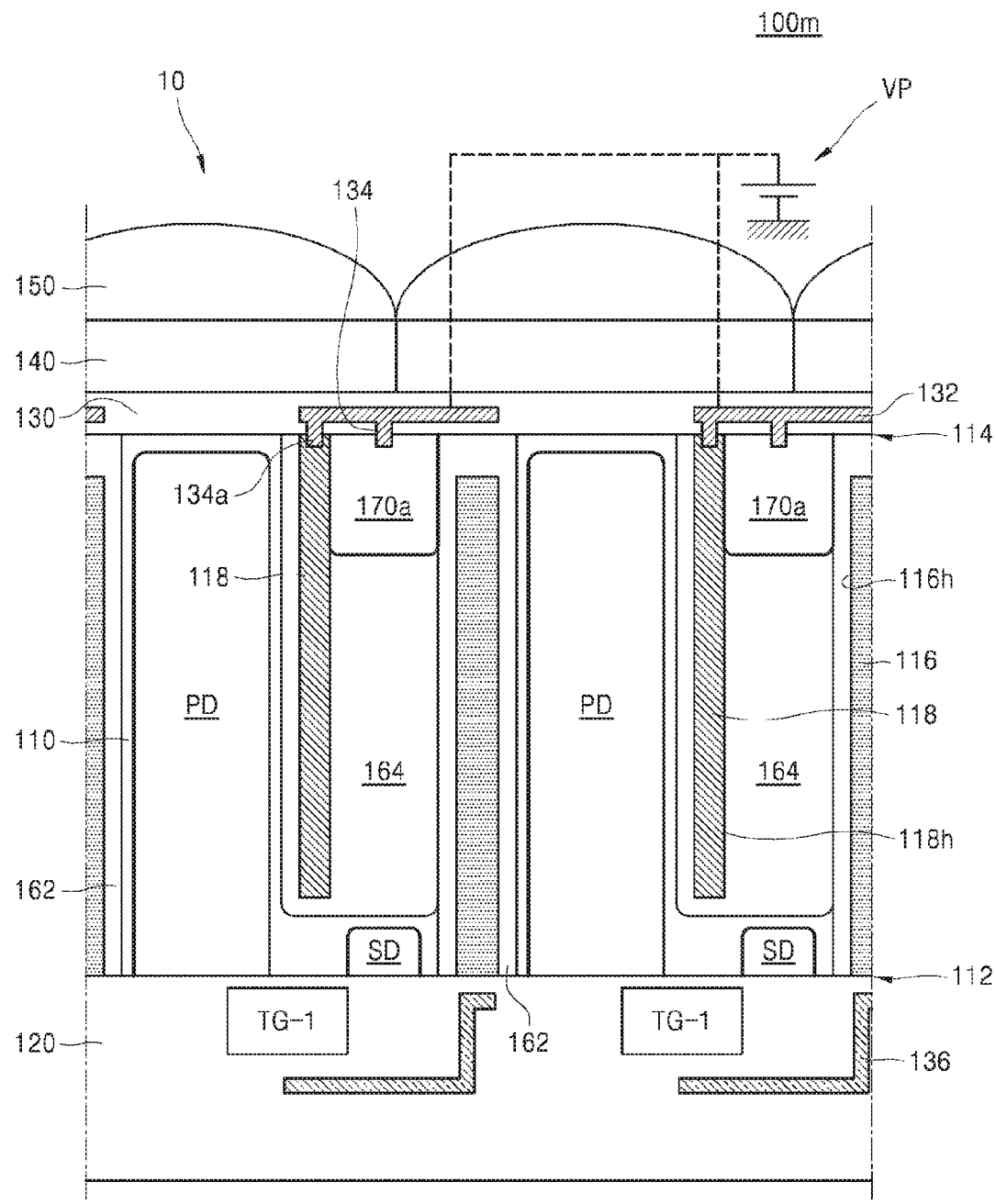
FIG. 16 is a sectional view diagram showing main elements of an image sensor according to another example embodiment.
Figure 17:
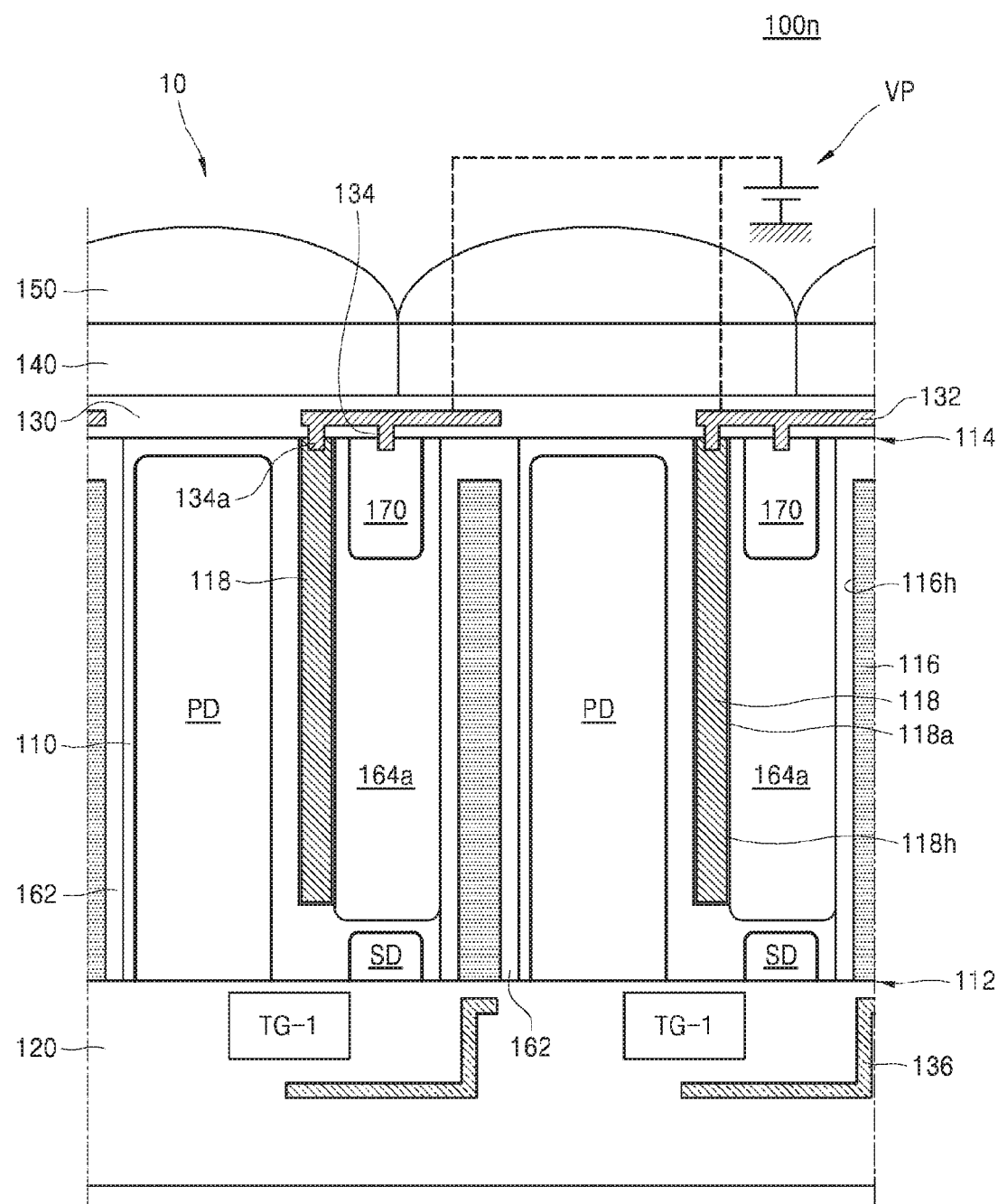
FIG. 17 is a sectional view diagram showing main elements of an image sensor according to another example embodiment.
Figure 18:
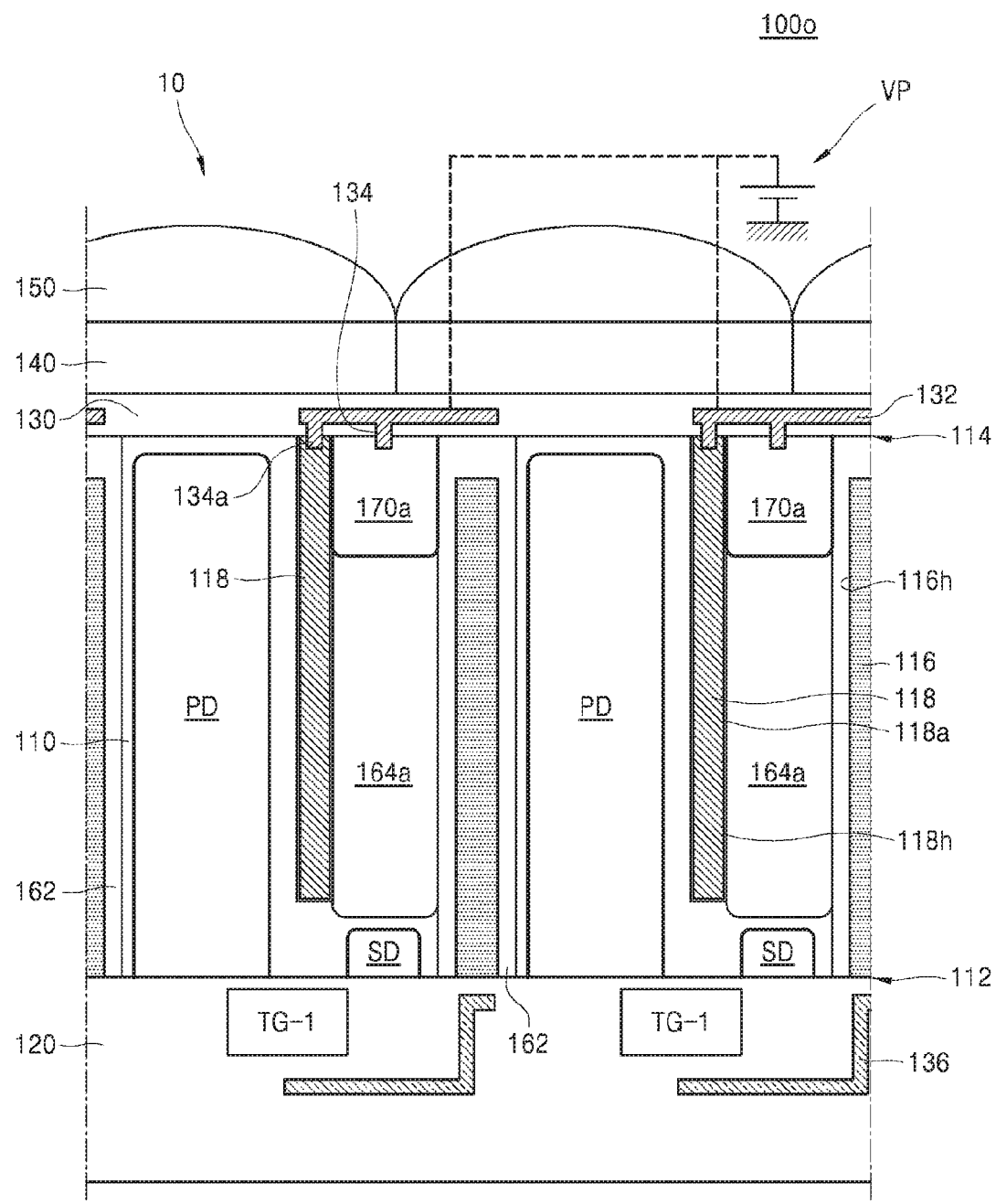
FIG. 18 is a sectional view diagram showing main elements of an image sensor according to another example embodiment.
Figure 19:
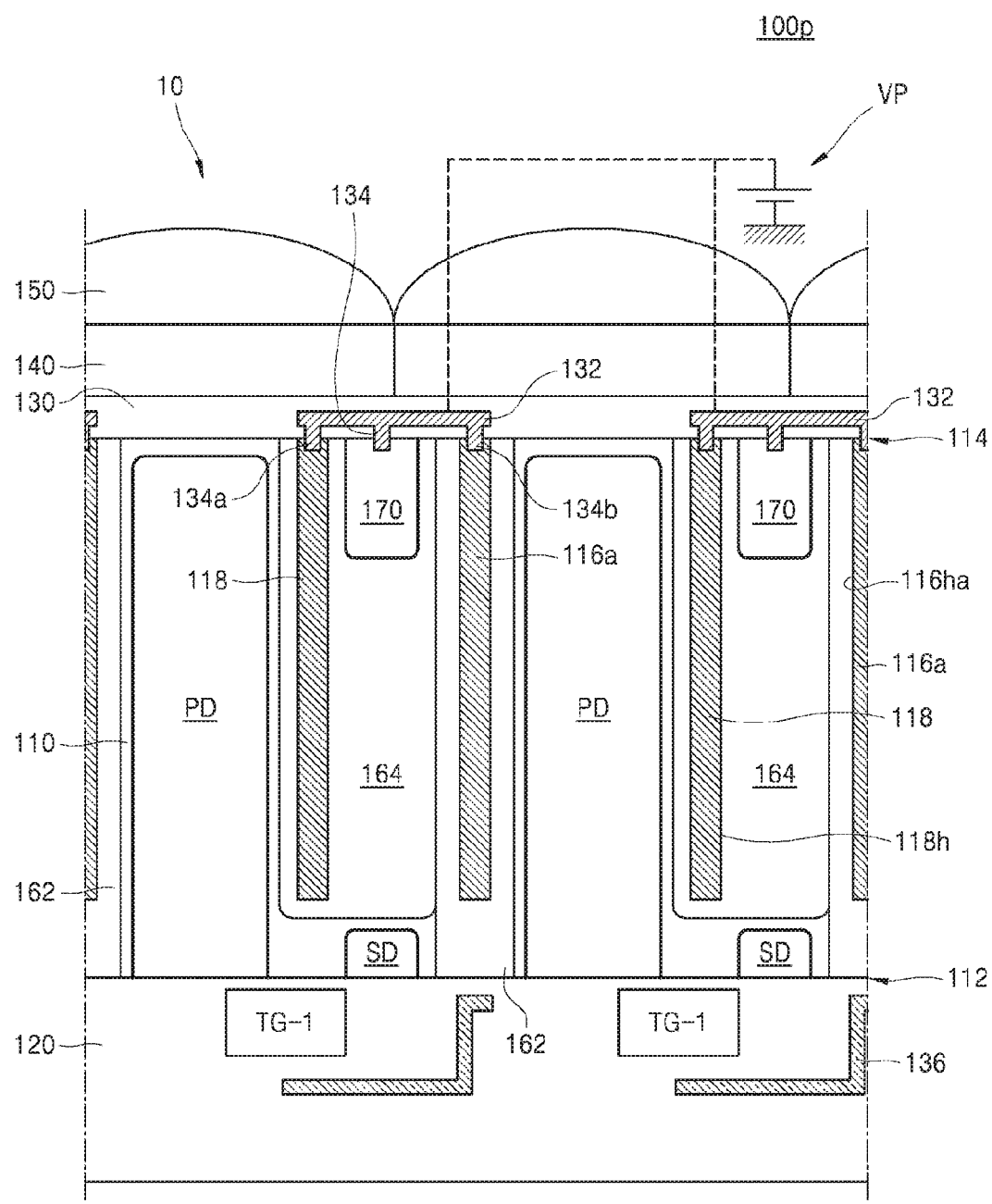
FIG. 19 is a sectional view diagram showing main elements of an image sensor according to another example embodiment.
Figure 20:
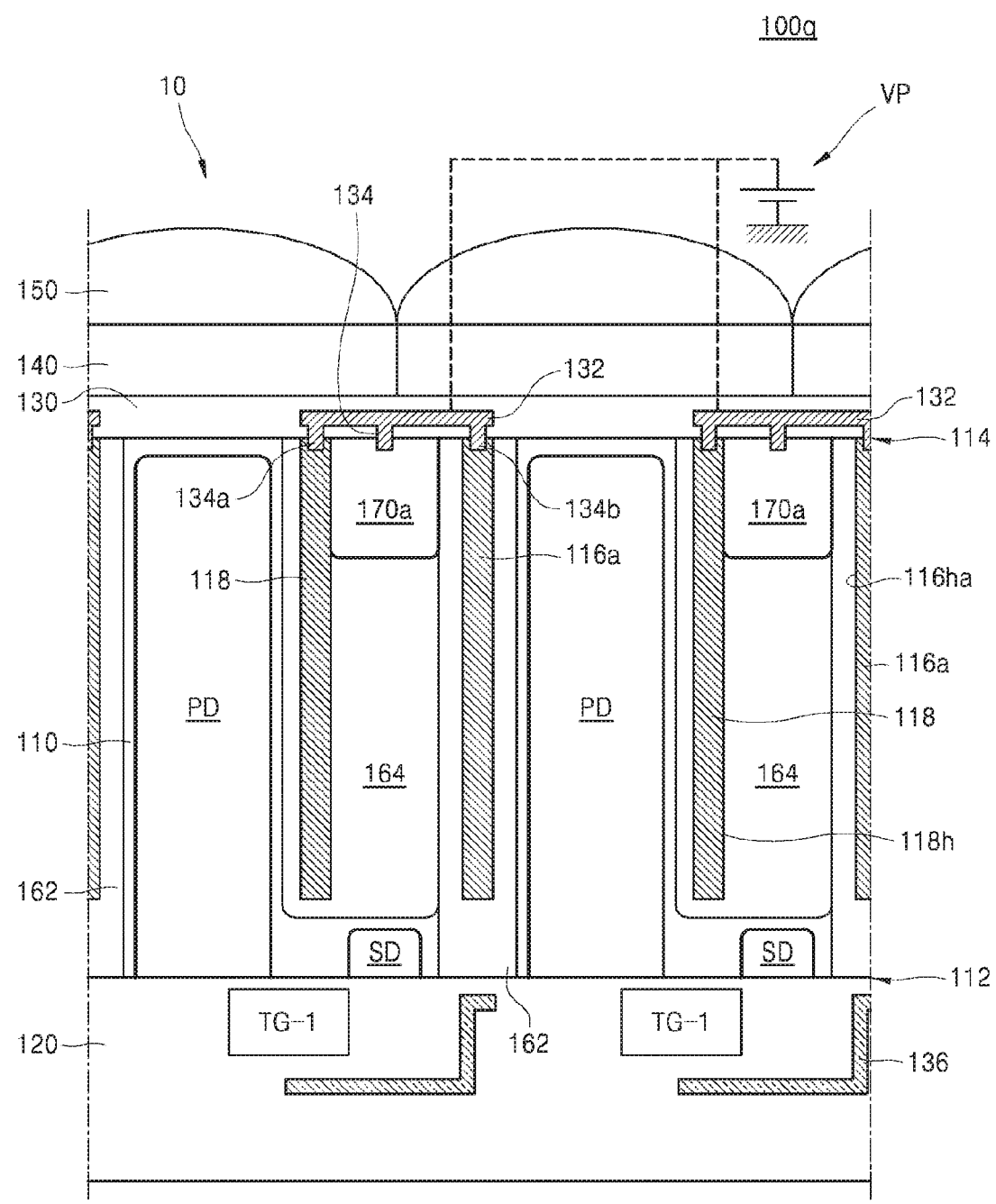
FIG. 20 is a sectional view diagram showing main elements of an image sensor according to another example embodiment.
Figure 21:
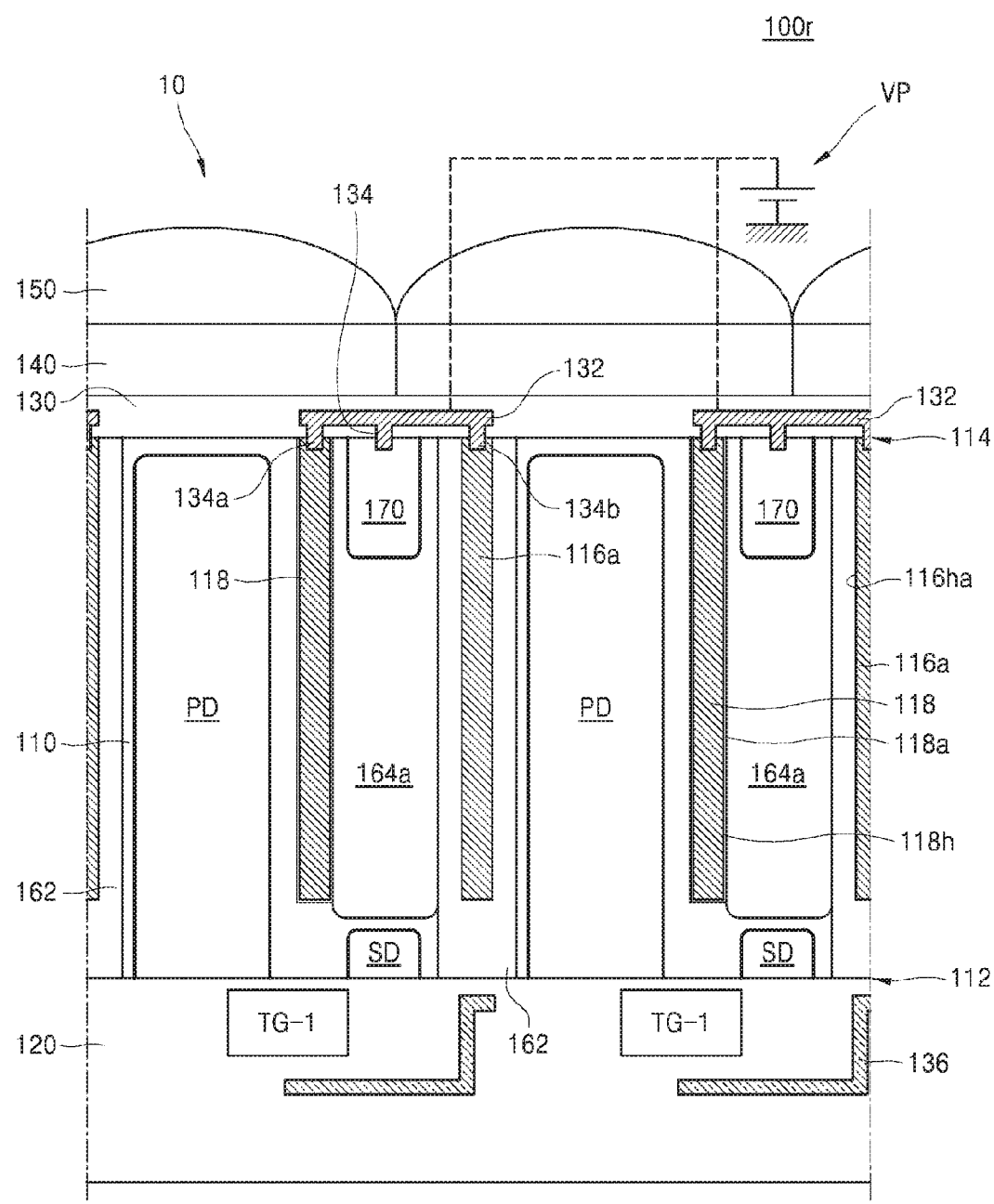
FIG. 21 is a sectional view diagram showing main elements of an image sensor according to another example embodiment.
Figure 22:
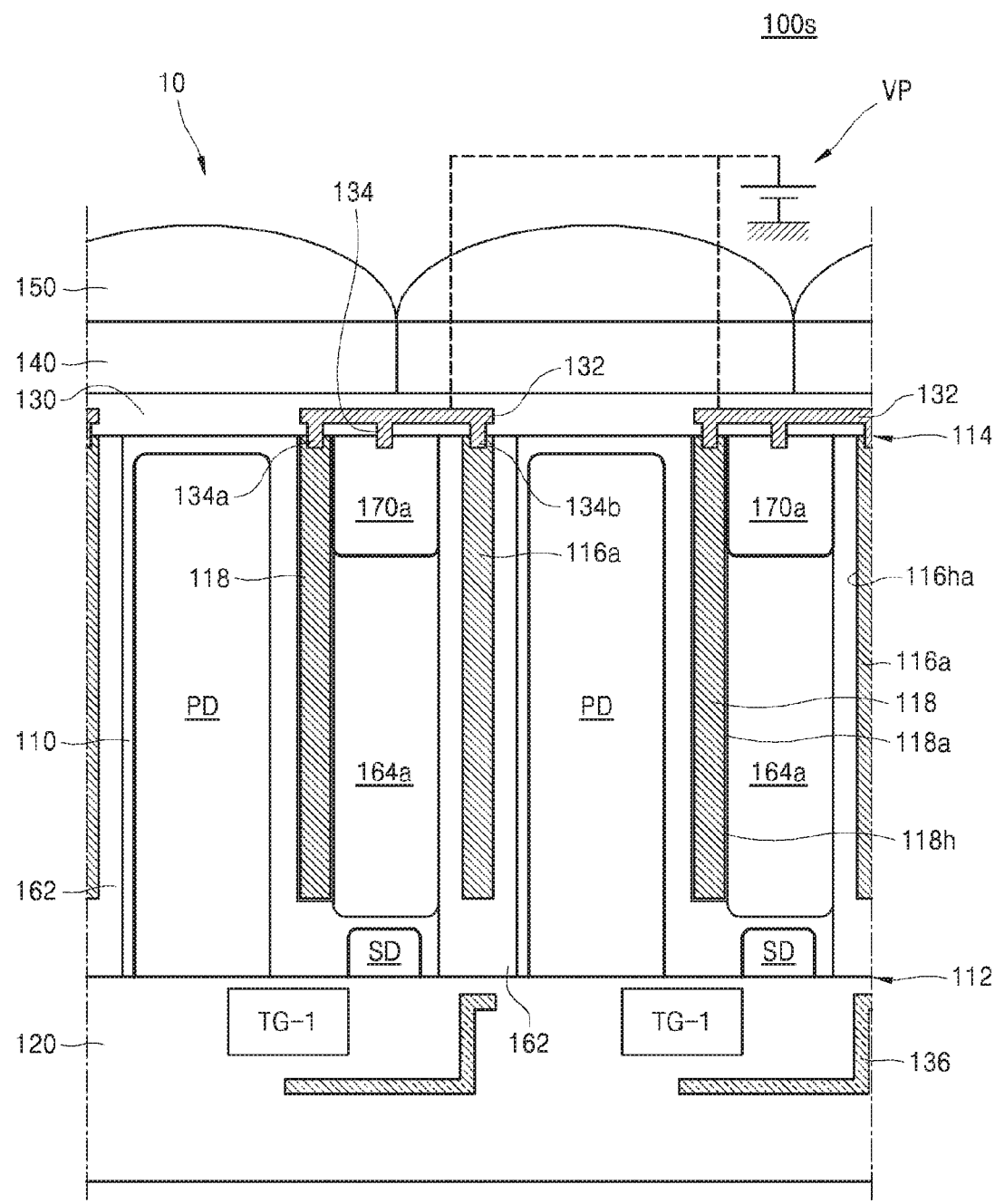
FIG. 22 is a sectional view diagram showing main elements of an image sensor according to another example embodiment.
Figure 23:
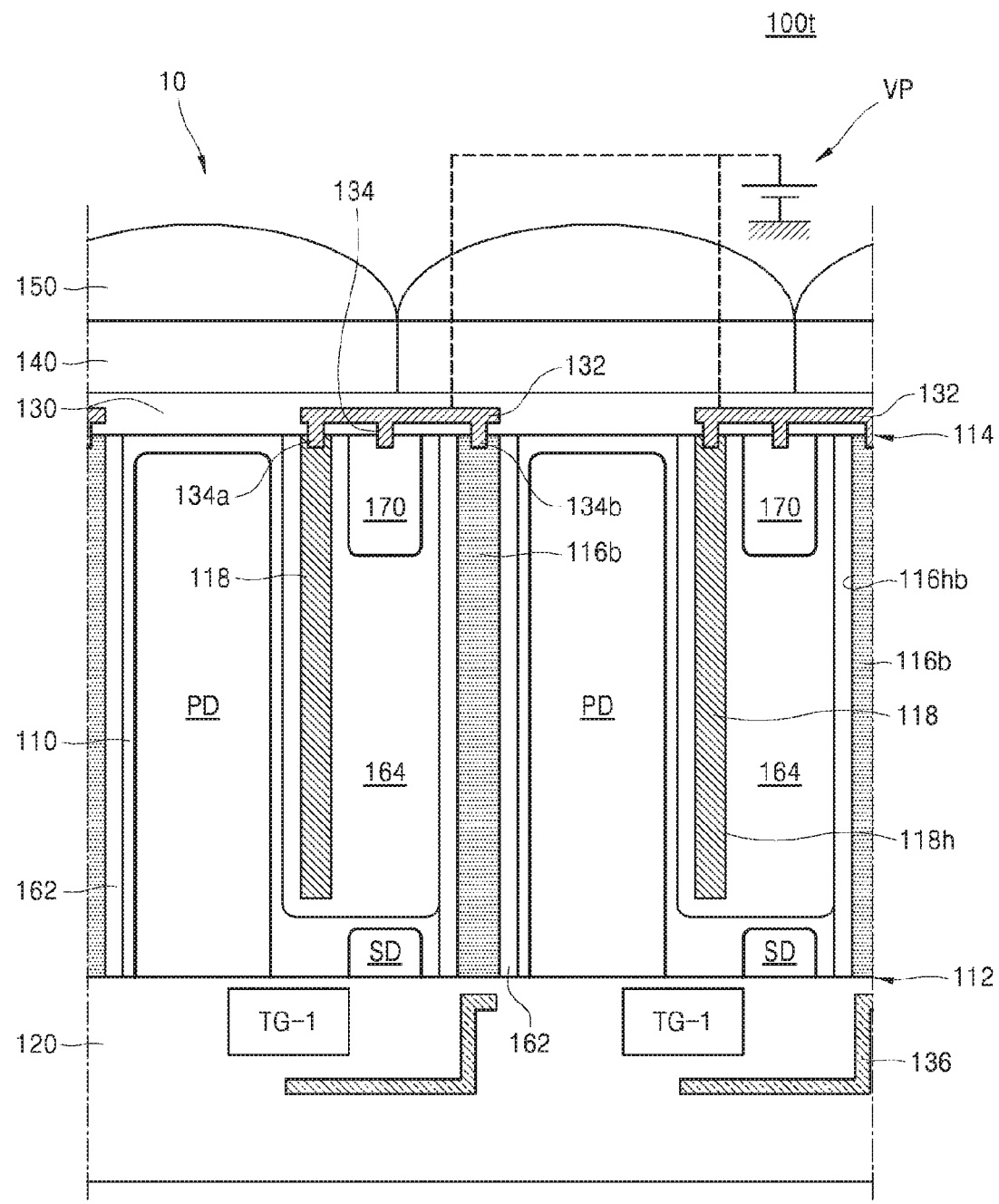
FIG. 23 is a sectional view diagram showing main elements of an image sensor according to another example embodiment.
Figure 24:
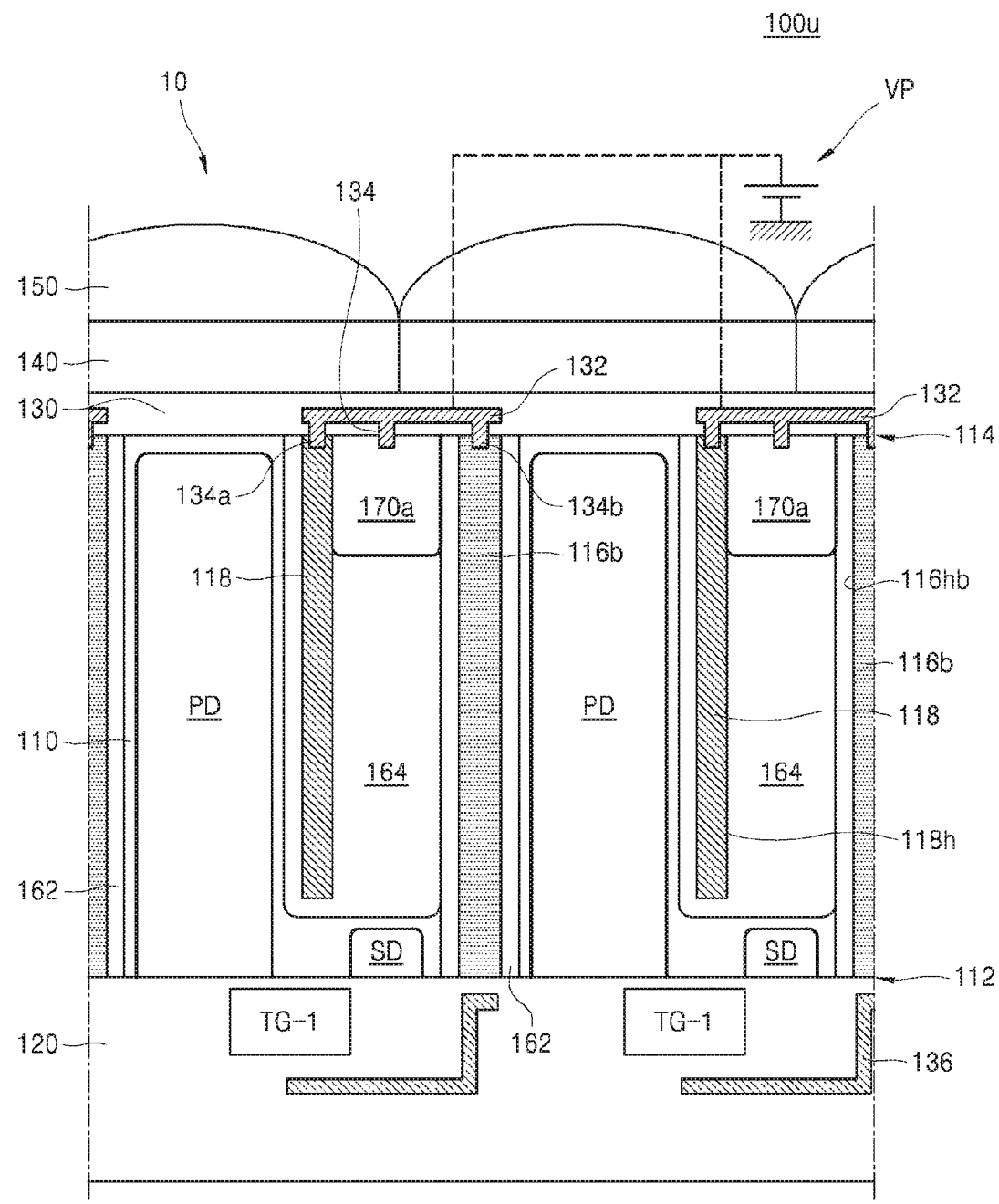
FIG. 24 is a sectional view diagram showing main elements of an image sensor according to another example embodiment.
Figure 25:
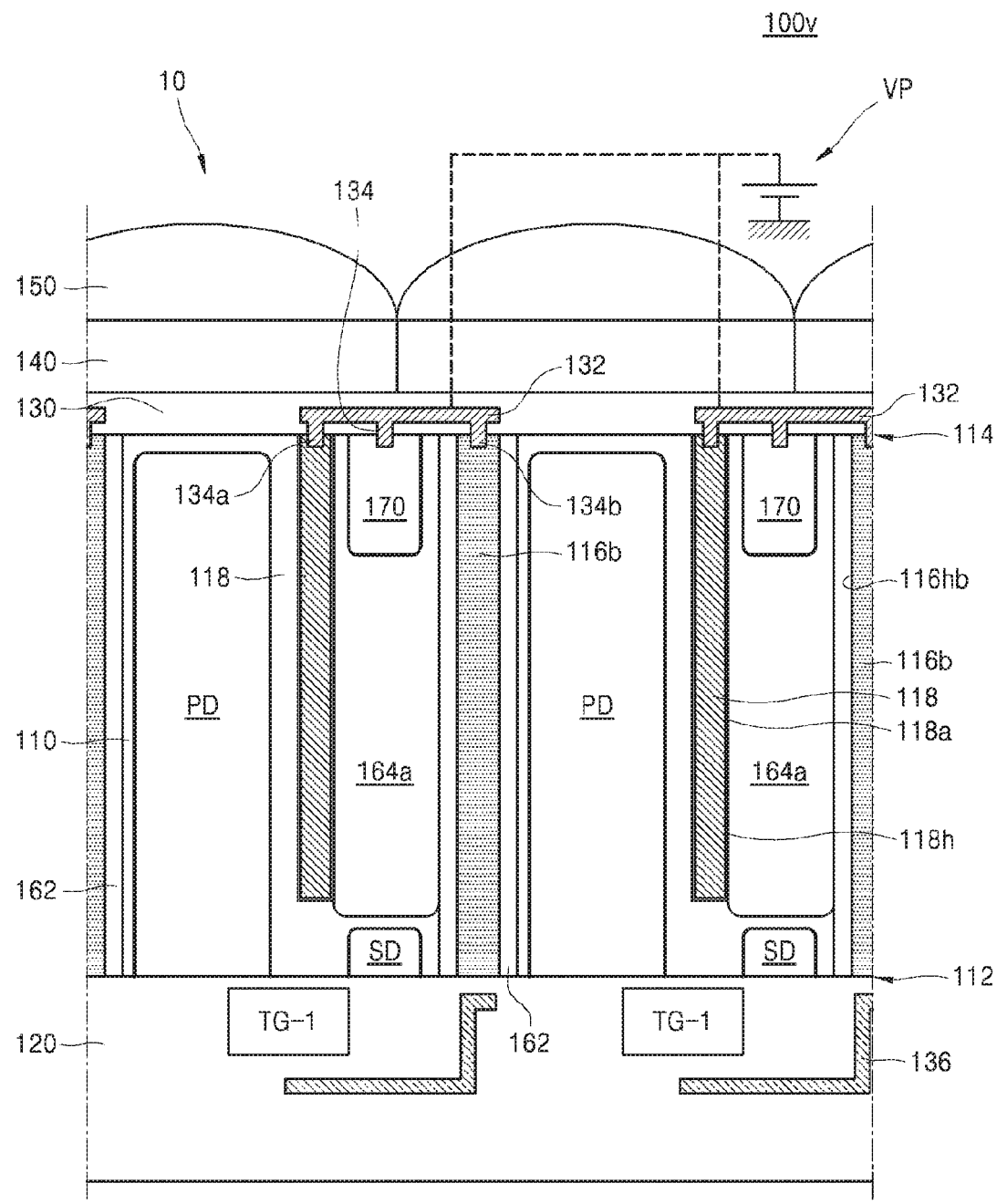
FIG. 25 is a sectional view diagram showing main elements of an image sensor according to another example embodiment.
Figure 26:
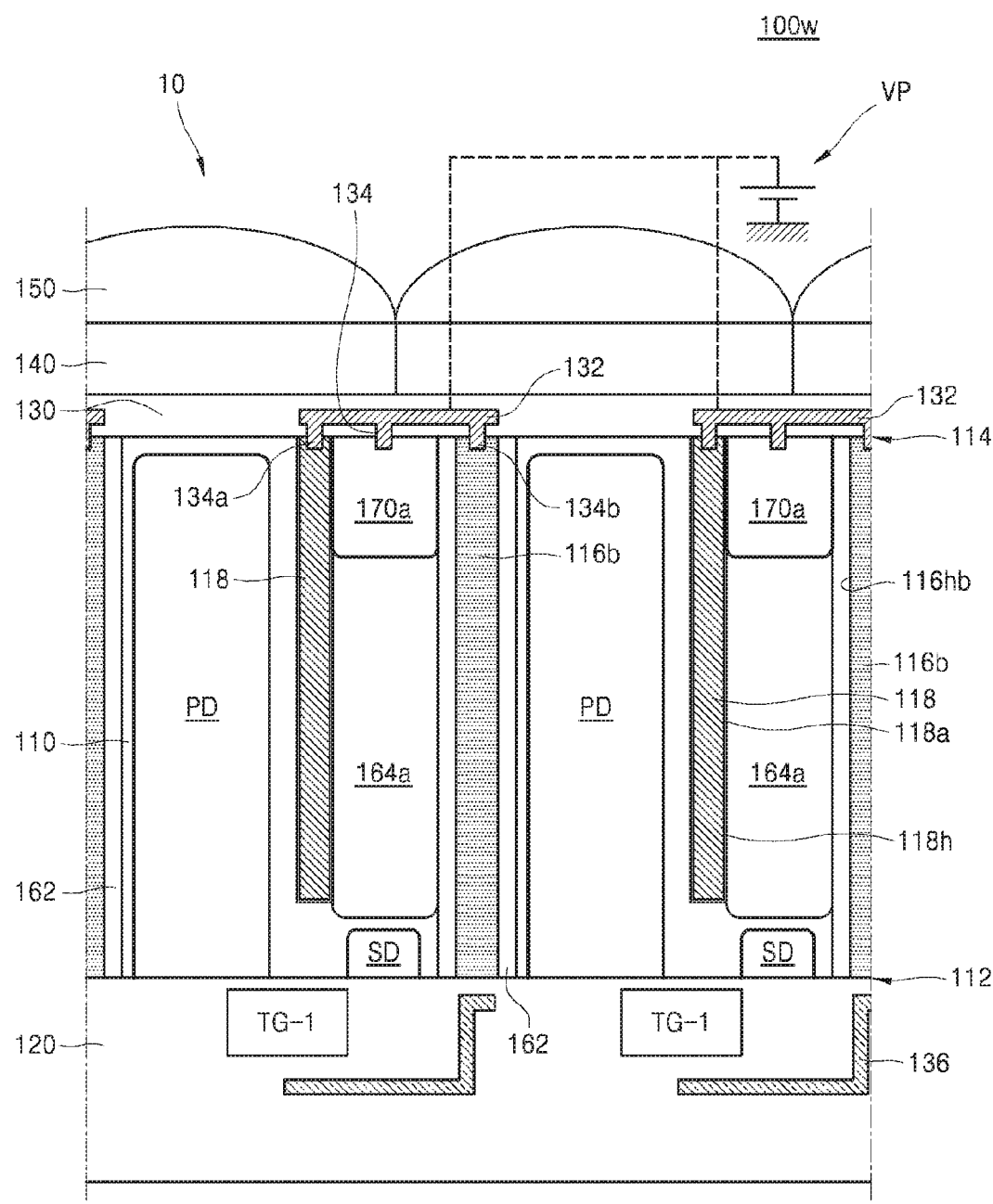
FIG. 26 is a sectional view diagram showing main elements of an image sensor according to another example embodiment.

In case of fabricating the image sensors 100m and 100o shown in FIGS. 16 and 18, the contact holes 130h and a recessed space (not shown) may be formed in spaces for forming a first extended blocking layer (134a of FIGS. 16 and 18), and the blocking material layer 132a may be formed to substantially fill the recessed space, too. A portion of the blocking material layer 132a substantially filling the recessed spaces may become the first extended blocking layer 134a.

In case of fabricating the image sensors 100q, 100s, 100u, 100w shown in FIGS. 20, 22, 24, and 26, the contact holes 130h and a recessed space (not shown) may be formed in spaces for forming a first extended blocking layer (134a of FIGS. 20, 22, 24, and 26) and a second extended blocking layer (134b of FIGS. 20, 22, 24, and 26), and the blocking material layer 132a may be formed to substantially fill the recessed spaces, too. Portions of the blocking material layer 132a substantially filling the recessed spaces may become the first extended blocking layer 134a and the second extended blocking layer 134b.

Next, as shown in FIG. 34, the first blocking layer 132 and the drain contact plug 134 may be formed by patterning the blocking material layer 132a and, as shown in FIG. 4, the image sensor 100a may be fabricated by forming the color filter layer 140 and the lens layer 150.

Figure 37:
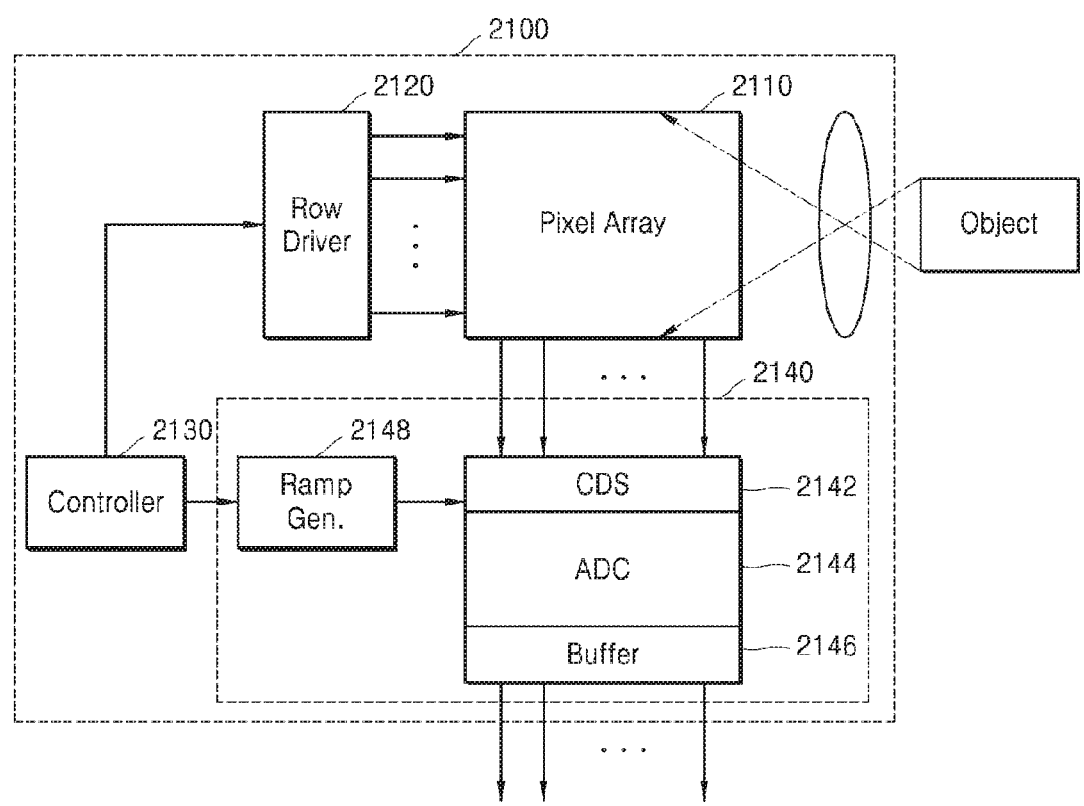
FIG. 37 is a block diagram showing configuration of an image sensor according to an example embodiment.

FIG. 37 is a block diagram showing configuration of an image sensor according to an example embodiment.

Referring to FIG. 37, an image sensor 2100 may include a pixel array 2110, a controller 2130, a row driver 2120, and a pixel signal processing unit 2140. The image sensor 2100 includes at least one of the image sensors 100, 100a, 100b, 100c, 100d, 100e, 100f, 100g, 100h, 100i, 100j, 100k, 100l, 100m, 100n, 100o, 100p, 100q, 100r, 100s, 100t, 100u, 100v, and 100w described above with reference to FIGS. 3 through 26. The pixel array 2110 may include the unit pixels 10 according to example embodiments as described above with reference to FIGS. 3 through 26. In other words, the charge storage device SD included in the unit pixel 10 may temporarily store charges accumulated by the photosensitive device PD and transmit the accumulated charges to the floating diffusion region FD, without being affected by light absorbed from outside.

The pixel array 2110 may include the plurality of unit pixels 10 that are 2-dimensionally arranged, where each of the unit pixels 10 may include the photosensitive device PD. The photosensitive device PD absorbs light and generates charges, and an electric signal (output voltage) based on the generated charges may be provided to the pixel signal processing unit 2140 via, for example, a vertical signal line. Each row of unit pixels of the pixel array 2110 may provide an output voltage at a time, and thus unit pixels in a row of the pixel array 2110 may be simultaneously or contemporaneously activated by a selection signal output by the row driver 2120. Unit pixels in a selected row may provide an output voltage based on absorbed light to an output line of a corresponding column.

The controller 2130 may control the row driver 2120, such that the pixel array 2110 absorbs light and accumulate charges, temporarily stores accumulated charges, and outputs electric signals based on the stored charges to the outside of the pixel array 2110. Furthermore, the controller 2130 may control the pixel signal processing unit 2140 to measure an output voltage provided by the pixel array 2110.

The pixel signal processing unit 2140 may include a correlation double sampler (CDS) 2142, an analog-digital converter (ADC) 2144, and a buffer 2146. The CDS 2142 may sample and hold an output voltages provided by the pixel array 2110. The CDS 2142 may double-sample a particular noise level and a level based on a generated output voltage and output a level corresponding to a difference therebetween. Furthermore, the CDS 2142 may receive ramp signals generated by the ramp signal generator 2148, compare the ramp signals to each other, and output a result of the comparison.

The ADC 2144 may convert an analog signal corresponding to a level received from the CDS 2142 to a digital signal. The buffer 2146 may latch digital signals, and latched signals may be sequentially output to the outside of the image sensor 2100 and transmitted to an image processor (not shown).

Figure 38:
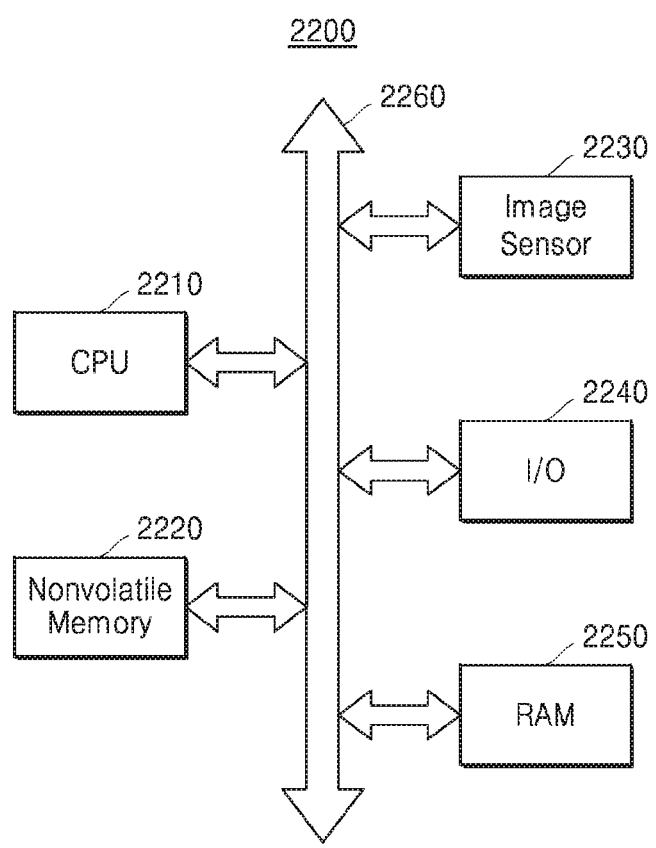
FIG. 38 is a block diagram showing a system including an image sensor according to an example embodiment.

FIG. 38 is a block diagram showing a system including an image sensor according to an example embodiment.

Referring to FIG. 38, a system 2200 may be one of a computing system, a camera system, a scanner, an automobile navigation, a video phone, a security system, or a motion detecting system that needs image data.

The system 2200 includes a central processing unit (CPU) (or a processor) 2210, a non-volatile memory 2220, an image sensor 2230, an input/output device 2240, and RAM 2250. The CPU 2210 may communicate with the non-volatile memory 2220, the image sensor 2230, the input/output device 2240, and the RAM 2250 via a bus 2260. The input/output device 2240 may be embodied as an independent semiconductor chip or may be integrated with the CPU 2210 as a single semiconductor chip. The image sensor 2230 may include at least one of the image sensors 100, 100a, 100b, 100c, 100d, 100e, 100f, 100g, 100h, 100i, 100j, 100k, 100l, 100m, 100n, 100o, 100p, 100q, 100r, 100s, 100t, 100u, 100v, and 100w described above with reference to FIGS. 3 through 26 and may include the unit pixels 10 according to the example embodiments described above with reference to FIGS. 3 through 26. In other words, the charge storage device SD included in the unit pixel 10 may temporarily store charges accumulated by the photosensitive device PD and transmit the accumulated charges to the floating diffusion region FD, without being affected by light absorbed from outside.

Figure 39:
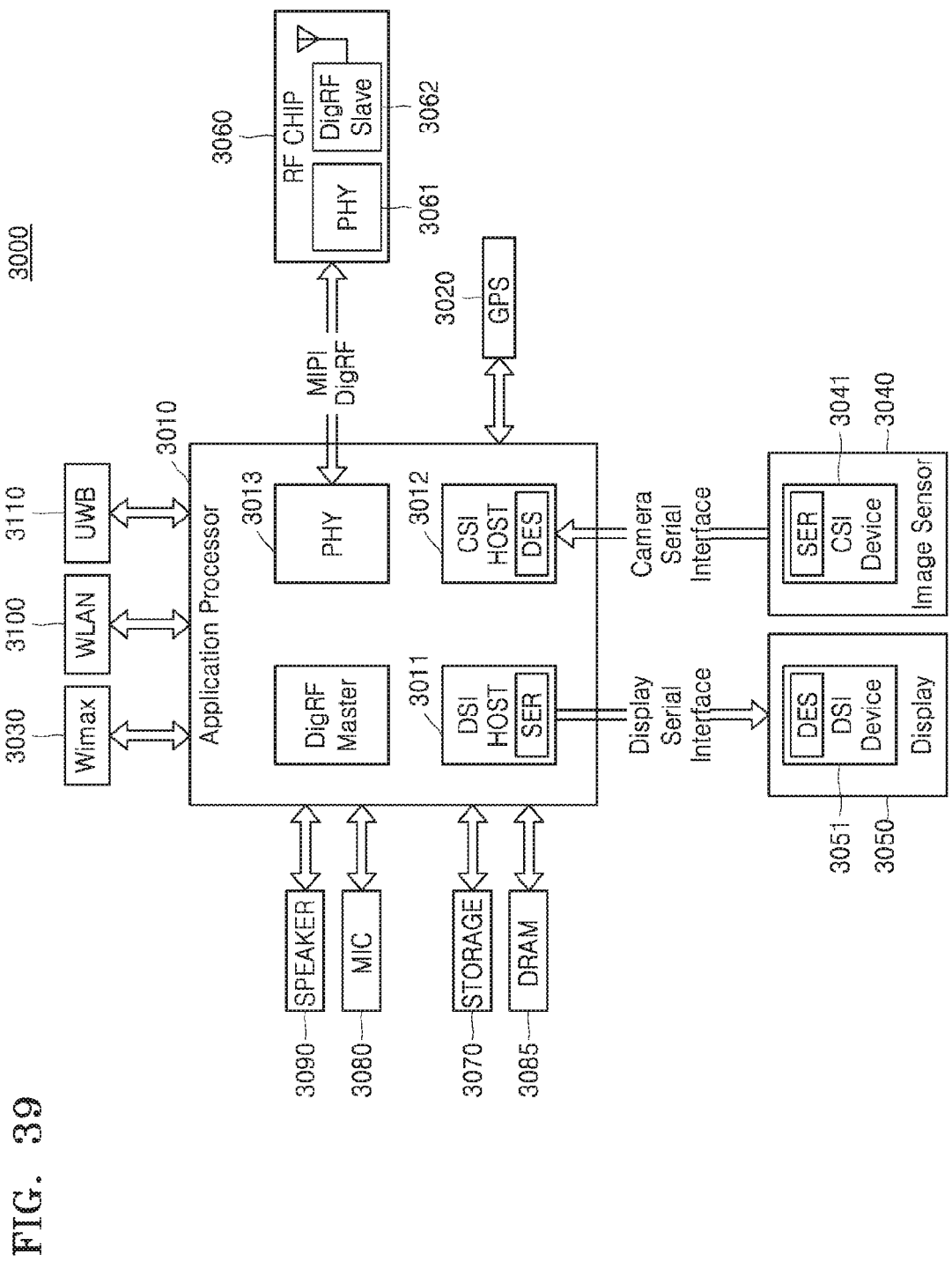
FIG. 39 is an electronic system and an interface including an image sensor according to an example embodiment.

FIG. 39 is an electronic system 3000 and an interface including an image sensor according to an embodiment.

Referring to FIG. 39, the electronic system 3000 may be embodied as a data processing device using or supporting a mobile industry processor interface (MIPI), e.g., a mobile phone, a personal digital assistant (PDA), a portable multi-media player (PMP), or a smart phone. The electronic system 3000 may include an application processor 3010, an image sensor 3040, and a display device 3050. The image sensor 3040 includes at least one of the image sensors 100, 100a, 100b, 100c, 100d, 100e, 100f, 100g, 100h, 100i, 100j, 100k, 100l, 100m, 100n, 100o, 100p, 100q, 100r, 100s, 100t, 100u, 100v, and 100w described above with reference to FIGS. 3 through 26.

A CSI host 3012 embodied at the application processor 3010 may serial-communicate with a camera serial interface (CSI) device 3041 of the image sensor 3040 via a CSI. Here, an optical deserializer may be embodied at the CSI host 3012, whereas an optical serializer may be embodied at the CSI device 3041, for example.

A display serial interface (DSI) host 3011 embodied at the application processor 3010 may serial-communicate with a DSI device 3051 of the display device 3050 via a DSI. Here, an optical deserializer may be embodied at the DSI host 3011, whereas an optical serializer may be embodied at the DSI device 3051, for example.

The electronic system 3000 may further include a radiofrequency (RF) chip 3060 that may communicate with the application processor 3010. A physical layer of an open systems interconnection model (PHY) 3013 of the electronic system 3000 and a PHY 3061 of the RF chip 3060 may exchange data according to the MIPI DigRF (wireless mobile specifications).

The electronic system 3000 may further include a GPS 3020, a storage 3070, a microphone 3080, a dynamic random access memory (DRAM) 3085, and a speaker 3090, where the electronic system 3000 may perform communication via a Wimax 3030, a wireless local area network (WLAN) 3100, and an ultrawide band (UWB) 3110.

Figure 40:
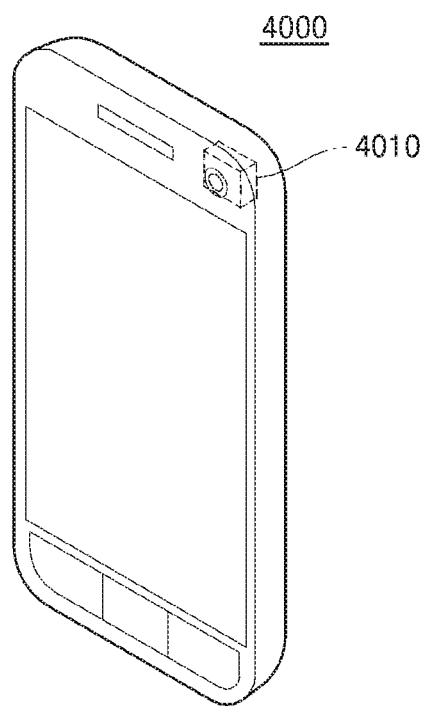
FIG. 40 is a schematic perspective view of an electronic system to which an image sensor according to an example embodiment is applied.

FIG. 40 is a schematic perspective view of an electronic system to which an image sensor according to an embodiment is applied.

FIG. 40 shows an example in which the electronic system 3000 of FIG. 39 is applied to a mobile phone 4000. The mobile phone 4000 may include an image sensor 4010. The image sensor 4010 includes at least one of the image sensors 100, 100a, 100b, 100c, 100d, 100e, 100f, 100g, 100h, 100i, 100j, 100k, 100l, 100m, 100n, 100o, 100p, 100q, 100r, 100s, 100t, 100u, 100v, and 100w described above with reference to FIGS. 3 through 26.

While the inventive concepts have been particularly shown and described with reference to example embodiments thereof, it will be understood that various changes in form and details may be made therein without departing from the spirit and scope of the following claims.

What is claimed is:

1. An image sensor comprising:
   a semiconductor layer having a first surface and a second surface that are opposite to each other;
   a photosensitive device in the semiconductor layer near the first surface and that is configured to accumulate charges based on light incident at the second surface;
   a charge storage device in the semiconductor layer near the first surface and that is configured to temporarily store charges accumulated by the photosensitive device;
   a first transmission transistor configured to transmit charges accumulated by the photosensitive device to the charge storage device and that includes a first gate on the first surface of the semiconductor layer; and
   a leakage photogenerated charge drain region in the semiconductor layer near the second surface, apart from the charge storage device, and above the charge storage device.

2. The image sensor of claim 1, further comprising a blocking layer on the second surface of the semiconductor layer and configured to block light traveling toward the charge storage device.

3. The image sensor of claim 2, further comprising a drain contact plug electrically connecting the blocking layer to the leakage photogenerated charge drain region.

4. The image sensor of claim 1, further comprising:
   a floating diffusion region to which charges stored in the charge storage device are transmitted; and
   a second transmission transistor that is configured to transmit charges stored in the charge storage device to the floating diffusion region and that includes a second gate,
   wherein the leakage photogenerated charge drain region is across the charge storage device and the floating diffusion region.

5. The image sensor of claim 1, wherein the charge storage device and the leakage photogenerated charge drain region are of a first conduction type,
   the image sensor further comprising a well region of a second conduction type that is different from the first conduction type and that is between the charge storage device and the leakage photogenerated charge drain region.

6. The image sensor of claim 5, further comprising:
   a first isolation layer buried in a first isolation trench in the semiconductor layer between the first surface and the second surface and surrounding a unit pixel including the photosensitive device and the charge storage device; and
   a second isolation layer between the photosensitive device and the charge storage device and buried in a second isolation trench in the semiconductor layer between the first surface and the second surface.

7. The image sensor of claim 6, further comprising an interface covering region covering a surface of the second isolation layer in the semiconductor layer.

8. An image sensor comprising:
a semiconductor layer having a first surface and a second surface that are opposite to each other; and
a plurality of unit pixels,
wherein one or more of the plurality of unit pixels includes:
a photosensitive device in the semiconductor layer near the first surface and configured to accumulate charges based on light incident via the second surface;
a charge storage device in the semiconductor layer near the first surface and that is configured to store charges accumulated by the photosensitive device;
a first transmission transistor configured to transmit charges accumulated by the photosensitive device to the charge storage device and includes a first gate on the first surface of the semiconductor layer;
a leakage photogenerated charge drain region in the semiconductor layer near the second surface, that is apart from the charge storage device, and that is above the charge storage device; and
a blocking layer on the second surface of the semiconductor layer, that is configured to block light travelling to the charge storage device, and is electrically connected to the leakage photogenerated charge drain region.

9. The image sensor of claim 8, wherein a positive bias is applied to the blocking layers of the plurality of unit pixels in common.

10. The image sensor of claim 8, wherein the charge storage device overlaps substantially the entire blocking layer in a direction substantially perpendicular to the second surface of the semiconductor layer.

11. The image sensor of claim 8, further comprising:
an interlayer insulation layer between the second surface of the semiconductor layer and the blocking layer; and
a drain contact plug configured to penetrate through the interlayer insulation layer and to electrically connect the blocking layer to the leakage photogenerated charge drain region.

12. The image sensor of claim 8, wherein the photosensitive device, the charge storage device, and the leakage photogenerated charge drain region are of a first conduction type,
the image sensor further comprising a well region of a second conduction type that is different from the first conduction type and that is arranged between the charge storage device and the leakage photogenerated charge drain region.

13. The image sensor of claim 12, further comprising:
a first isolation layer between the plurality of unit pixels and that is buried in a first isolation trench in the semiconductor layer between the first surface and the second surface; and
a second isolation layer between the photosensitive device and the charge storage device and that is buried in a second isolation layer in the semiconductor layer and extends from the second surface toward the first surface.

14. The image sensor of claim 13, further comprising an interface covering region in the semiconductor layer and that surrounds the first isolation layer and is of the second conduction type.

15. The image sensor of claim 13, wherein one or more of the plurality of unit pixels further comprises:
a floating diffusion region to which charges stored in the charge storage device are transmitted; and
a second transmission transistor configured to transmit charges stored in the charge storage device to the floating diffusion region and that includes a second gate on the first surface of the semiconductor layer.

16. An image sensor comprising:
one or more unit pixels in a semiconductor layer, the one or more pixels including:
a photosensitive device configured to accumulate charges generated via light incident on the semiconductor layer;
a charge storage device configured to store charges accumulated by the photosensitive device; and
a leakage photogenerated charge drain region configured to discharge photogenerated charges outside the semiconductor layer.

17. The image sensor of claim 16, further comprising a transmission transistor configured to transmit charges accumulated by the photosensitive device to the charge storage device.

18. The image sensor of claim 16, wherein the photosensitive device is near a first surface of the semiconductor layer and the light is incident on a second surface of the semiconductor layer;
the image sensor further comprising a blocking layer configured to substantially block light from reaching the charge storage device from the second surface of the semiconductor layer.

19. The image sensor of claim 18, wherein the first surface is opposite the second surface.

20. The image sensor of claim 16, wherein the charge storage device is configured to temporarily store the charges accumulated by the photosensitive device.

* * * * *